United States Patent
Inagaki

(10) Patent No.: US 10,269,598 B2
(45) Date of Patent: Apr. 23, 2019

(54) SUBSTRATE TREATING APPARATUS

(71) Applicant: SCREEN Holdings Co., Ltd., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/347,316

(22) Filed: Nov. 9, 2016

(65) Prior Publication Data

US 2017/0140962 A1   May 18, 2017

(30) Foreign Application Priority Data

Nov. 12, 2015 (JP) ................. 2015-222106

(51) Int. Cl.
*H01L 21/67* (2006.01)
*H01L 21/677* (2006.01)

(52) U.S. Cl.
CPC .. *H01L 21/67225* (2013.01); *H01L 21/67161* (2013.01); *H01L 21/67173* (2013.01); *H01L 21/67178* (2013.01); *H01L 21/67184* (2013.01); *H01L 21/67276* (2013.01); *H01L 21/67745* (2013.01)

(58) Field of Classification Search
None
See application file for complete search history.

(56) References Cited

U.S. PATENT DOCUMENTS

| | | | |
|---|---|---|---|
| 2003/0213431 A1* | 11/2003 | Fukutomi | H01L 21/67173 118/696 |
| 2003/0217695 A1* | 11/2003 | Fukutomi | H01L 21/67017 118/666 |
| 2004/0037677 A1 | 2/2004 | Koyama et al. | 414/222.01 |
| 2008/0304940 A1 | 12/2008 | Auer-Jongepier et al. | 414/152 |
| 2009/0000543 A1 | 1/2009 | Fukutomi et al. | 118/58 |
| 2009/0165950 A1 | 7/2009 | Kim et al. | 156/345.1 |
| 2009/0169344 A1* | 7/2009 | Nozawa | C23C 16/54 414/221 |
| 2010/0162955 A1 | 7/2010 | Lei et al. | 118/723 R |
| 2011/0318141 A1 | 12/2011 | Wi | 414/217 |
| 2012/0015307 A1* | 1/2012 | Matsuoka | G03F 7/162 430/325 |
| 2014/0161983 A1* | 6/2014 | Inagaki | H01L 21/67178 427/402 |

FOREIGN PATENT DOCUMENTS

| | | |
|---|---|---|
| JP | H10-335415 A | 12/1998 |
| JP | H11-186358 A | 7/1999 |
| JP | 2003-309160 A | 10/2003 |
| JP | 2004-087570 A | 3/2004 |
| JP | 2006-339227 A | 12/2006 |
| JP | 2009-010291 | 1/2009 |
| JP | 5048632 | 10/2012 |

(Continued)

*Primary Examiner* — Jethro M. Pence
(74) *Attorney, Agent, or Firm* — Ostrolenk Faber LLP

(57) ABSTRACT

A substrate treating apparatus includes a treating section for treating substrates. The treating section has a front face and a rear face both connectable to an indexer section for feeding the substrates to the treating section. Such substrate treating apparatus can improve the degree of freedom for arranging the treating section and the indexer section.

18 Claims, 32 Drawing Sheets

(56) References Cited

FOREIGN PATENT DOCUMENTS

| | | |
|---|---|---|
| KR | 10-0542630 | 1/2006 |
| KR | 10-0567237 | 4/2006 |
| TW | 201338091 A | 9/2013 |
| TW | I457724 | 10/2014 |
| TW | I476855 | 3/2015 |
| TW | I488247 B | 6/2015 |
| TW | I490971 | 7/2015 |
| TW | I492305 | 7/2015 |

* cited by examiner

FIG. 34A
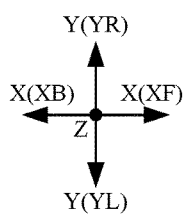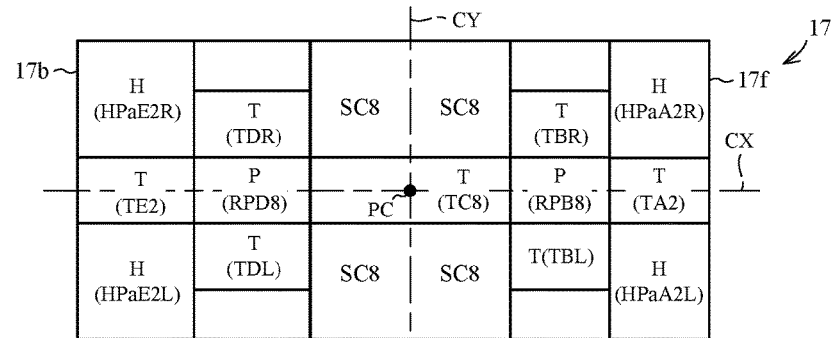
FIG. 34B
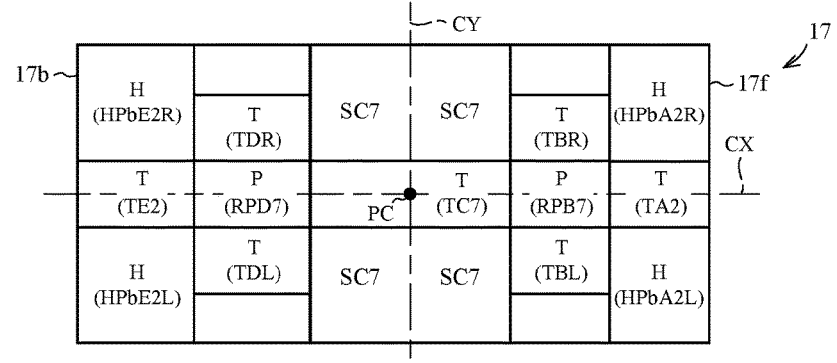
FIG. 34C
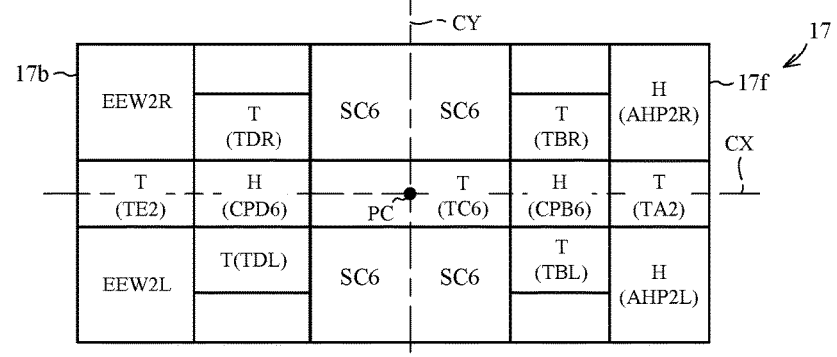
FIG. 34D
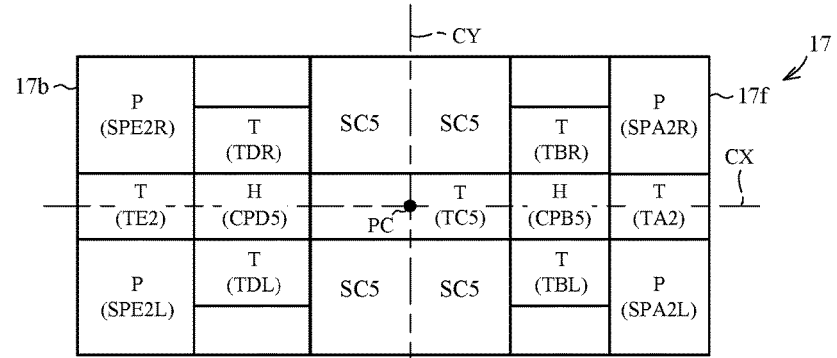

FIG. 35A
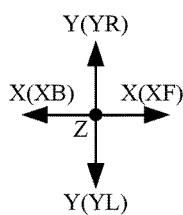
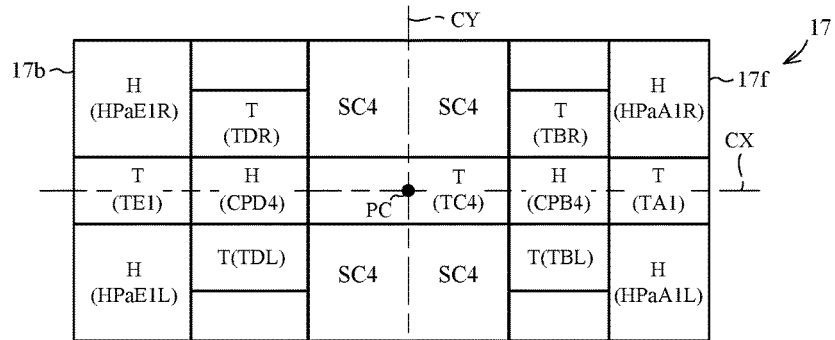
FIG. 35B
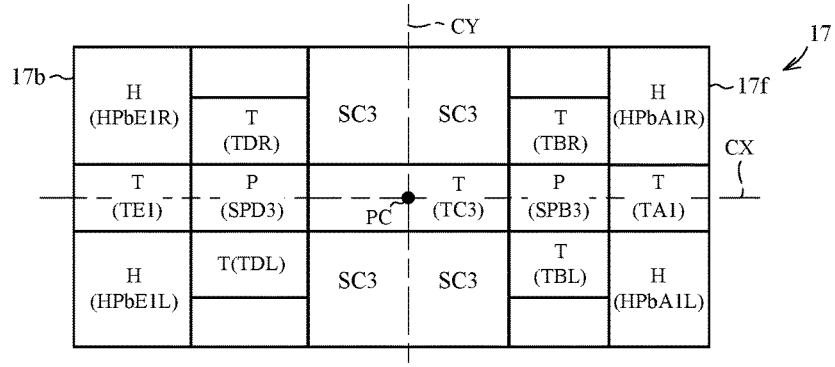
FIG. 35C
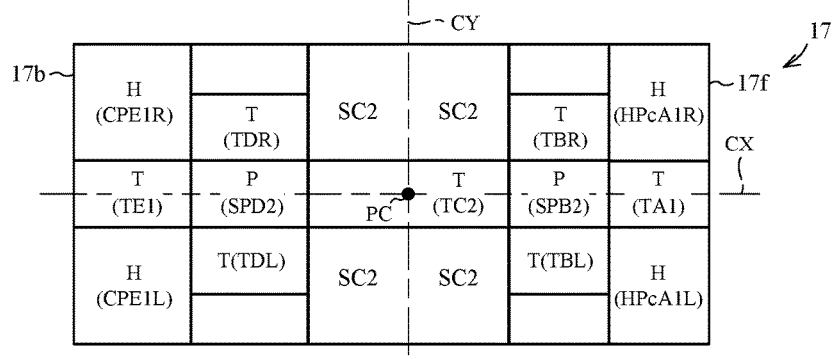
FIG. 35D
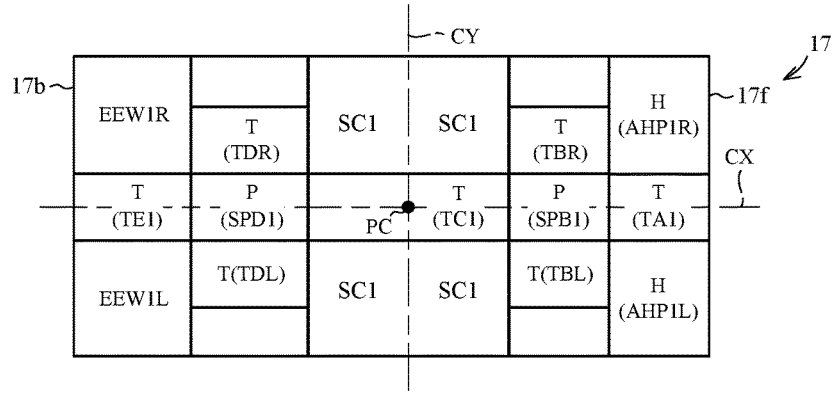

| K8 | SC8(DEV) |
| K7 | SC7(DEV) |
| K6 | SC6(DEV) |
| K5 | SC5(DEV) |
| K4 | SC4(RESIST) |
| K3 | SC3(RESIST) |
| K2 | SC2(BARC) |
| K1 | SC1(BARC) |

| K8 | SC8(DEV) |
| K7 | SC7(DEV) |
| K6 | SC6(DEV) |
| K5 | SC5(DEV) |
| K4 | SC4(RESIST/BARC) |
| K3 | SC3(RESIST/BARC) |
| K2 | SC2(RESIST/BARC) |
| K1 | SC1(RESIST/BARC) |

| K8 | SC8(RESIST/BARC) |
| K7 | SC7(RESIST/BARC) |
| K6 | SC6(RESIST/BARC) |
| K5 | SC5(RESIST/BARC) |
| K4 | SC4(RESIST/BARC) |
| K3 | SC3(RESIST/BARC) |
| K2 | SC2(RESIST/BARC) |
| K1 | SC1(RESIST/BARC) |

SUBSTRATE TREATING APPARATUS

CROSS-REFERENCE TO RELATED APPLICATIONS

This application claims priority to Japanese Patent Application No. 2015-222106 filed Nov. 12, 2015, the disclosure of which is hereby incorporated herein by reference in its entirety for all purposes.

BACKGROUND OF THE INVENTION (1) Field of the Invention

This invention relates to a substrate treating apparatus for treating semiconductor wafers, glass substrates for photomasks, glass substrates for liquid crystal displays, substrates for optical disks and so on (hereinafter called simply substrates).

(2) Description of the Related Art

Conventionally, this type of apparatus includes a substrate treating apparatus having a treating section for treating substrates. The treating section has a front face connected to an indexer section. A back face of the treating section is connected to an interface section. The interface section is further connected to an exposing machine. The indexer section feeds the substrates to the treating section. The treating section treats the substrates. The interface section transports the substrates between the treating section and exposing machine (as disclosed in Japanese Unexamined Patent Publication No. 2009-010291, for example).

In the conventional apparatus, however, the indexer section is connectable only to the front face of the treating section. That is, the arrangement of the treating section and indexer section has a low degree of freedom.

This invention has been made having regard to the state of the art noted above, and its object is to provide a substrate treating apparatus which can improve the degree of freedom for arranging the treating section and indexer section.

SUMMARY OF THE INVENTION

To fulfill the above object, this invention provides the following construction.

A substrate treating apparatus, according to this invention, comprises a treating section for treating substrates; wherein the treating section has a front face and a rear face both connectable to an indexer section for feeding the substrates to the treating section.

With the substrate treating apparatus according to this invention, since the front face of the treating section is connectable to the indexer section, the indexer section can be placed forward of the treating section. Since the rear face of the treating section is connectable to the indexer section, the indexer section can be placed backward of the treating section. In this way, the degree of freedom for arranging the treating section and indexer section can be improved. Note that the front face of the treating section is an opposite face from the rear face of the treating section.

Consequently, if only specifications of the treating section are determined, the treating section can be manufactured even though it is not determined which of the front face and rear face the indexer section should be connected to. It is therefore possible to move up a deadline for delivery of the treating section.

In the above invention, it is preferred that the front face and the rear face are both connectable to at least one of an interface section and an exposing machine. Since the front face of the treating section is connectable to at least one of the interface section and exposing machine, at least one of the interface section and exposing machine can be placed forward of the treating section. Since the rear face of the treating section is connectable to at least one of the interface section and exposing machine, at least one of the interface section and exposing machine can be placed backward of the treating section. In this way, the degree of freedom for arranging the treating section and at least one of the interface section and exposing machine can be improved.

In the above invention, it is preferred that the treating section is arranged to perform the same treatment for the substrates when the front face is connected to the indexer section and when the rear face is connected to the indexer section. In other words, it is preferred that the treating section performs first treatment of the substrates when the front face of the treating section is connected to the indexer section, and that the treating section performs the same type of treatment as the first treatment of the substrates when the rear face of the treating section is connected to the indexer section. The treating section can perform the same treatment of the substrates when the indexer section is disposed forward of the treating section, and when the indexer section is disposed backward of the treating section. That is, even when a change is made to the arrangement of the treating section and indexer section, the treatment the treating section performs on the substrates does not change. The degree of freedom for arranging the treating section and indexer section can therefore be further improved.

In the above invention, it is preferred that the treating section has receivers for receiving the substrates; the receivers including front receivers opening forward of the treating section; and rear receivers opening backward of the treating section; and positions in front view of the front receivers are the same as positions in rear view of the rear receivers. Specifically, it is preferred that the positions of the front receivers relative to the front face when the treating section is seen from front, are the same as the positions of the rear receivers relative to the rear face when the treating section is seen from back. When the indexer section is connected to the front face of the treating section and when the indexer section is connected to the rear face of the treating section, the indexer section in the same position can feed the substrates of the treating section.

In the above invention, it is preferred that the treating section includes treating units for treating the substrates; and transport mechanisms for transporting the substrates to the treating units and the receivers; and a relative positional relationship of the front face, the treating units, the receivers and the transport mechanisms of the treating section is the same as a relative positional relationship of the rear face, the treating units, the receivers and the transport mechanisms of the treating section. In other words, it is preferred that the positions of the treating units, receivers and transport mechanisms relative to the front face of the treating section are the same as the positions of the treating units, receivers and transport mechanisms relative to the rear face. The transport conditions relating to the substrates entering the treating section through the front face of the treating section and the transport conditions relating to the substrates entering the treating section through the rear face of the treating section can be made substantially equal. Here, the transport conditions of the substrates are transport distances of the substrates, transport directions of the substrates and transport times of the substrates, for example. Consequently, treating quality of the treating section can conveniently be made equal when the front face of the treating section is connected to the indexer section and when the rear face of the treating section is connected to the indexer section.

In the above invention, it is preferred that the treating units, the receivers and the transport mechanisms are arranged in point symmetry in plan view. An agreement can conveniently be made between the relative positional relationship of the front face, treating units, receivers and transport mechanisms of the treating section and the relative positional relationship of the rear face, treating units, receivers and transport mechanisms of the treating section.

In the above invention, it is preferred that the treating units, the receivers and the transport mechanisms in a front part of the treating section are arranged symmetrically to the treating units, the receivers and the transport mechanisms in a rear part of the treating section. To put it simply, it is preferred that the treating units, receivers and transport mechanisms are arranged in fore-aft symmetry. More particularly, it is preferred that the treating units, receivers and transport mechanisms are arranged in fore-aft symmetry at least either in plan view or in side view. An array of the treating unit, receivers and transporting mechanisms in a direction from the front face to the rear face of the treating section is equal to an array of the treating unit, receivers and transporting mechanisms in a direction from the rear face to the front face of the treating section. Consequently, treating quality of the treating section can conveniently be made equal when the front face of the treating section is connected to the indexer section and when the rear face of the treating section is connected to the indexer section.

In the above invention, it is preferred that the treating units, the receivers and the transport mechanisms in a right part of the treating section are arranged symmetrically to the treating units, the receivers and the transport mechanisms in a left part of the treating section. To put it simply, it is preferred that the treating units, receivers and transport mechanisms are arranged in right-left symmetry. More particularly, it is preferred that the treating units, receivers and transport mechanisms are arranged in right-left symmetry at least either in plan view or in front view. The arrangement of the treating units, receivers and transport mechanisms on the right part of the treating section is the same as the arrangement of the treating units, receivers and transport mechanisms on the left part of the treating section. Maintenance for the right part of the treating section and maintenance for the left part of the treating section can therefore be made substantially equal. The "maintenance" means checking, repair, servicing, replacement and so on.

In the above invention, it is preferred that the treating section includes a plurality of blocks installed in a row in a fore-and-aft direction linking the front face and the rear face of the treating section; and a block disposed in an i-th (i being an integer 1 or more) place from front of the treating section has the same function as a block disposed in an i-th place from rear of the treating section. Treating quality of the treating section can conveniently be made equal when the front face of the treating section is connected to the indexer section and when the rear face of the treating section is connected to the indexer section.

The first block from the front of the treating section is located at the front end of the treating section. The first block from the rear of the treating section is located at the rear end of the treating section. The "function" has a meaning that includes a function to treat the substrates, a function to transport the substrates, and so on.

In the above invention, it is preferred that the block is one of heat-treating blocks for heat-treating the substrates, a solution treating block for solution treating the substrates, and relay blocks for relaying the substrates between the heat-treating blocks and the solution treating block; and an array of the heat-treating blocks, the solution treating block and the relay blocks from the front face toward the rear face of the treating section is the same as an array of the heat-treating blocks, the solution treating block and the relay blocks from the rear face toward the front face of the treating section. In other words, it is preferred that an array of the heat-treating blocks, the solution treating block and the relay blocks in one direction of the fore-and-aft direction is the same as an array of the heat-treating blocks, the solution treating block and the relay blocks in the other direction of the fore-and-aft direction. The other direction of the fore-and-aft direction is a direction opposite to the one direction of the fore-and-aft direction. Treating quality of heat treatment and solution treatment in the treating section can conveniently be made equal when the front face of the treating section is connected to the indexer section and when the rear face of the treating section is connected to the indexer section.

In the above invention, it is preferred that a heat-treating block, a relay block, the solution treating block, a relay block and a heat-treating block are arranged in the stated order from the front face toward the rear face of the treating section. According to such construction, each relay block is disposed between the heat-treating block and solution treating block. The relay blocks can conveniently improve the efficiency of transporting the substrates between the heat-treating blocks and solution treating block. The relay blocks can also reduce the influence of the heat-treating blocks exerted on the solution treating block. For example, the relay blocks can reduce the thermal influence of the heat-treating blocks exerted on the solution treating block.

In another aspect of this invention, a substrate treating apparatus comprises a treating section for treating substrates; wherein the treating section includes a front heat-treating block disposed in a front end region of the treating section for performing heat treatment of the substrates; a rear heat-treating block disposed in a rear end region of the treating section for performing heat treatment of the substrates; and a solution treating block disposed between the front heat-treating block and the rear heat-treating block for performing solution treatment of the substrates; each of the front heat-treating block and the rear heat-treating block being connectable to an indexer section for feeding the substrates to the treating section.

With the substrate treating apparatus according to this invention, since the front heat-treating block is connectable to the indexer section, the indexer section can be placed forward of the treating section. Since the rear heat-treating block is connectable to the indexer section, the indexer section can be placed backward of the treating section. In this way, the degree of freedom for arranging the treating section and indexer section can be improved.

The front heat-treating block disposed in the front end region of the treating section and the rear heat-treating block disposed in the rear end section of the treating section perform heat treatment of the substrates, respectively. The treating section can perform the same treatment of the substrates when the indexer section is disposed forward of the treating section, and when the indexer section is disposed backward of the treating section.

In the above invention, it is preferred that the solution treating block is arranged to send part of the substrates having undergone the solution treatment to the front heat-treating block, and the other substrates having undergone the solution treatment to the rear heat-treating block; and each of the front heat-treating block and the rear heat-treating block is arranged to perform post-solution treatment heat treatment of the substrates. The solution treating block, after the solution treatment, divides (distributes) the substrates to the front heat-treating block and rear heat-treating block. The front heat-treating block and rear heat-treating block each receive from the solution treating block the substrates having undergone the solution treatment. The front heat-treating block and rear heat-treating block perform the post-solution treatment heat treatment of the substrates in parallel. The post-solution treatment heat treatment is heat treatment following the solution treatment. Consequently, the post-solution treatment heat treatment can be carried out efficiently.

In the above invention, it is preferred that the solution treating block is arranged to perform, as the solution treatment, coating treatment for coating the substrates with a coating film material; the solution treating block sending part of the substrates having undergone the coating treatment to the front heat-treating block, and the other substrates having undergone the coating treatment to the rear heat-treating block; and each of the front heat-treating block and the rear heat-treating block is arranged to perform post-coating heat treatment of the substrates. The solution treating block, after the coating treatment, divides (distributes) the substrates to the front heat-treating block and rear heat-treating block. The front heat-treating block and rear heat-treating block each receive from the solution treating block the substrates having undergone the coating treatment. The front heat-treating block and rear heat-treating block perform the post-coating heat treatment of the substrates in parallel. The post-coating heat treatment is heat treatment following the coating treatment. Consequently, the post-coating heat treatment can be carried out efficiently.

In the above invention, it is preferred that the solution treating block is arranged to perform, as the solution treatment, developing treatment for supplying a developer to the substrates; the solution treating block sending part of the substrates having undergone the developing treatment to the front heat-treating block, and the other substrates having undergone the developing treatment to the rear heat-treating block; and each of the front heat-treating block and the rear heat-treating block is arranged to perform post-development heat treatment of the substrates. The solution treating block, after the developing treatment, divides (distributes) the substrates to the front heat-treating block and rear heat-treating block. The front heat-treating block and rear heat-treating block each receive from the solution treating block the substrates having undergone the developing treatment. The front heat-treating block and rear heat-treating block perform the post-development heat treatment of the substrates in parallel. The post-development heat treatment is heat treatment following the developing treatment. Consequently, the post-development heat treatment can be carried out efficiently.

In the above invention, it is preferred that the treating section includes a front relay block disposed between the front heat-treating block and the solution treating block for relaying the substrates; and a rear relay block disposed between the rear heat-treating block and the solution treating block for relaying the substrates; the front heat-treating block includes heat-treating units for heat-treating the substrates; and transport mechanisms for transporting the substrates to the heat-treating units of the front heat-treating block; the front relay block includes receivers for receiving the substrates; and transport mechanisms for transporting the substrates to the receivers of the front relay block; the solution treating block includes solution treating units for solution treating the substrates; and transport mechanisms for transporting the substrates to the solution treating units; the rear relay block includes receivers for receiving the substrates; and transport mechanisms for transporting the substrates to the receivers of the rear relay block; and the rear heat-treating block includes heat-treating units for heat-treating the substrates; and transport mechanisms for transporting the substrates to the heat-treating units of the rear heat-treating block. The front heat-treating block, front relay block, solution treating block, rear relay block and rear heat-treating block are arranged in the stated order from the front face toward the rear face of the treating section. Regarding the function of each block, the front heat-treating block has the same function as the rear heat-treating block. The front relay block has the same function as the rear relay block. The array of the blocks is therefore substantially the same when seen from the front end of the treating section and when seen from the rear end thereof. In other words, the array of the blocks in the direction from the front end toward the rear end of the treating section is functionally the same as the array of the blocks in the direction from the rear end toward the front end of the treating section. Treating quality of heat treatment and solution treatment in the treating section can conveniently be made equal when the front end of the treating section is connected to the indexer section and when the rear end of the treating section is connected to the indexer section. The front relay block is disposed between the front heat-treating block and solution treating block. The front relay block can conveniently improve the efficiency of transporting the substrates between the front heat-treating block and solution treating block. The front relay block can also reduce the influence of the front heat-treating block exerted on the solution treating block. Similarly, the rear relay block is disposed between the rear heat-treating block and solution treating block. The rear relay block can conveniently improve the efficiency of transporting the substrates between the rear heat-treating block and solution treating block. The rear relay block can also reduce the influence of the rear heat-treating block exerted on the solution treating block.

In the above invention, it is preferred that the receivers of the front relay block are arranged in an up-down direction; the transport mechanisms of the front relay block are arranged laterally of the receivers of the front relay block; the transport mechanisms of the solution treating block are arranged in the up-down direction; the receivers of the rear relay block are arranged in the up-down direction; the transport mechanisms of the rear relay block are arranged laterally of the receivers of the rear relay block; the receivers of the front relay block are arranged such that each of the transport mechanisms of the solution treating block is opposed to at least one of the receivers of the front relay block; and the receivers of the rear relay block are arranged such that each of the transport mechanisms of the solution treating block is opposed to at least one of the receivers of the rear relay block. The front relay block has a plurality of receivers. The receivers of the front relay block are arranged in a row in the up-down direction. The solution treating block has a plurality of transport mechanisms. The transport mechanisms of the solution treating block are arranged in a row in the up-down direction. The transport mechanisms of the solution treating block are each arranged backward of at least one of the receivers of the front relay block. Each transport mechanism of the solution treating block can therefore pass a substrate to the transport mechanism of the front relay block, and receive a substrate from the transport mechanism of the front relay block, through the receiver of the front relay block. Similarly, the rear relay block has a plurality of receivers. The receivers of the rear relay block are arranged in a row in the up-down direction. The transport mechanisms of the solution treating block are each arranged forward of at least one of the receivers of the rear relay block. Each transport mechanism of the solution treating block can therefore pass a substrate to the transport mechanism of the rear relay block, and receive a substrate from the transport mechanism of the rear relay block, through the receiver of the rear relay block.

In the above invention, it is preferred that the transport mechanisms of the front heat-treating block are arranged in one of an up-down direction and a transverse direction; the receivers of the front relay block are arranged such that each of the transport mechanisms of the front heat-treating block is opposed to at least one of the receivers of the front relay block; the transport mechanisms of the rear heat-treating block are arranged in the same direction as the transport mechanisms of the front heat-treating block; and the receivers of the rear relay block are arranged such that each of the transport mechanisms of the rear heat-treating block is opposed to at least one of the receivers of the rear relay block. The front heat-treating block has a plurality of transport mechanisms. The transport mechanisms of the front heat-treating block are arranged in a row in the up-down direction or transverse direction. The transverse direction is a direction perpendicular to the up-down direction and perpendicular to the fore-and-aft direction. Each transport mechanism of the front heat-treating block is disposed forward of at least one of the receivers of the front relay block. Each transport mechanism of the front heat-treating block can therefore pass a substrate to the transport mechanism of the front relay block and receive a substrate from the transport mechanism of the front relay block, through the receiver of the front relay block, whether the transport mechanisms of the front heat-treating block are arranged in the up-down direction or in the transverse direction. Similarly, the rear heat-treating block has a plurality of transport mechanisms. The transport mechanisms of the rear heat-treating block are arranged in a row in the up-down direction or transverse direction. Each transport mechanism of the rear heat-treating block is disposed backward of at least one of the receivers of the rear relay block. Each transport mechanism of the rear heat-treating block can therefore pass a substrate to the transport mechanism of the rear relay block and receive a substrate from the transport mechanism of the rear relay block, through the receiver of the rear relay block.

In the above invention, it is preferred that the front heat-treating block has a plurality of receivers for receiving the substrates; the receivers of the front heat-treating block are arranged in an up-down direction and laterally of the transport mechanisms of the front heat-treating block; the receivers of the front heat-treating block are arranged such that each of the transport mechanisms of the front relay block is opposed to at least one of the receivers of the front heat-treating block; the rear heat-treating block has a plurality of receivers for receiving the substrates; the receivers of the rear heat-treating block are arranged in the up-down direction and laterally of the transport mechanisms of the rear heat-treating block; and the receivers of the rear heat-treating block are arranged such that each of the transport mechanisms of the rear relay block is opposed to at least one of the receivers of the rear heat-treating block. The receivers of the front heat-treating block are arranged in a row in the up-down direction. Each transport mechanism of the front relay block is disposed backward of at least one of the receivers of the front heat-treating block. The transport mechanisms of the front heat-treating block and the transport mechanisms of the front relay block can therefore transport the substrates reciprocally through the receivers of the front heat-treating block. The above can improve the reliability of substrate transport between the front heat-treating block and the front relay block. Similarly, the receivers of the rear heat-treating block are arranged in a row in the up-down direction. Each transport mechanism of the rear relay block is disposed forward of at least one of the receivers of the rear heat-treating block. The transport mechanisms of the rear heat-treating block and the transport mechanisms of the rear relay block can therefore transport the substrates reciprocally through the receivers of the rear heat-treating block. The above can improve the reliability of substrate transport between the rear heat-treating block and the rear relay block.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 34A, 34B, 34C and 34D are side views taken on lines a-a, b-b, c-c and d-d of FIG. 25, respectively;

FIGS. 35A, 35B, 35C and 35D are side views taken on lines e-e, f-f, g-g and h-h of FIG. 25, respectively;

FIGS. 39A, 39B and 39C are side views schematically showing constructions of solution treating blocks according to modified embodiments, respectively.

DESCRIPTION OF THE PREFERRED EMBODIMENTS

Embodiment 1

Embodiment 1 of this invention will be described hereinafter with reference to the drawings.

<Outline of Substrate Treating Apparatus>

Figure 1A:
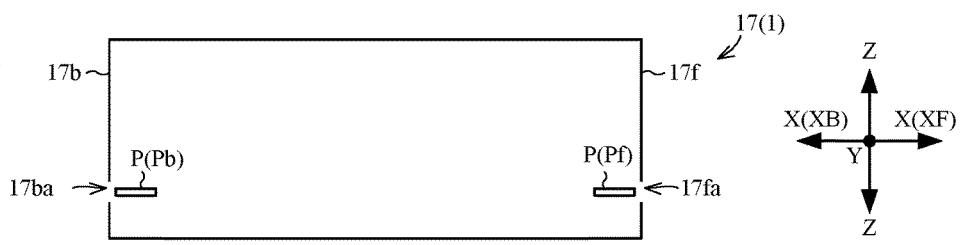
FIG. 1A is a side view of a substrate treating apparatus according to Embodiment 1.
Figure 1B:
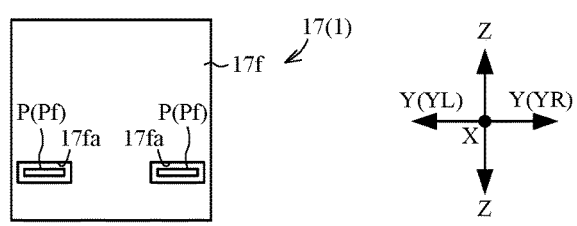
FIG. 1B is a front view of the substrate treating apparatus according to Embodiment 1.
Figure 1C:
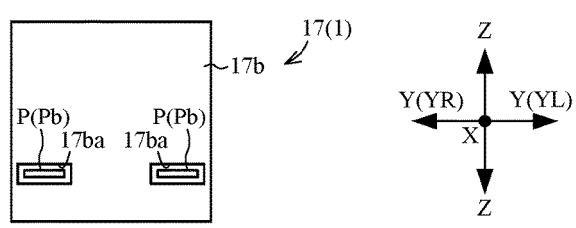
FIG. 1C is a rear view of the substrate treating apparatus according to Embodiment 1.

FIG. 1A is a side view of a substrate treating apparatus according to Embodiment 1, FIG. 1B is a front view of the substrate treating apparatus according to Embodiment 1, and FIG. 1C is a rear view of the substrate treating apparatus according to Embodiment 1. Embodiment 1 provides a substrate treating apparatus 1 for treating substrates (e.g. semiconductor wafers) W. The wafers W will be depicted in FIG. 3 et seq. described hereinafter.

The substrate treating apparatus 1 includes a treating section 17. The treating section 17 has an outer shape which is a substantially rectangular parallelepiped. The treating section 17 is substantially rectangular also in any one of plan view, side view and front view. The treating section 17 has a front face 17$f$ and a rear face 17$b$. The front face 17$f$ is located at an opposite end from the rear face 17$b$. The front face 17$f$ and rear face 17$b$ are in the same shape (e.g. rectangular). The front face 17$f$ and rear face 17$b$ have the same size.

Here, the direction linking the front face 17$f$ and rear face 17$b$ is called the "fore-and-aft direction X". The fore-and-aft direction X is horizontal. Especially, the direction from the rear face 17$b$ to the front face 17$f$ is called "forward XF", and the direction opposite to forward XF is called "backward XB". The horizontal direction perpendicular to the fore-and-aft direction X is called "transverse direction Y" or simply "sideways". One direction of the "transverse direction Y" is called "rightward YR" as appropriate, and the other direction opposite to rightward YR is called "leftward YL". The vertical direction is called the "up-down direction Z". The up-down direction Z is perpendicular to the fore-and-aft direction X. The up-down direction Z is also perpendicular to the transverse direction Y.

The treating section 17 has receivers P. The receivers P include front receivers Pf open forward XF of the treating section 17, and rear receivers Pb open backward XB of the treating section 17. The front face 17$f$ has openings 17$fa$ formed therein for opening the front receivers Pf. The front receivers Pf are disposed backward XB of the openings 17$fa$. The rear face 17$b$ has openings 17$ba$ formed therein for opening the rear receivers Pb. The rear receivers Pb are disposed forward XF of the openings 17$ba$. As shown in FIGS. 1B and 1C, the positions of front receivers Pf relative to the front face 17$f$ are the same as the positions of the rear receivers Pb relative to the rear face 17$b$.

Figure 2A:
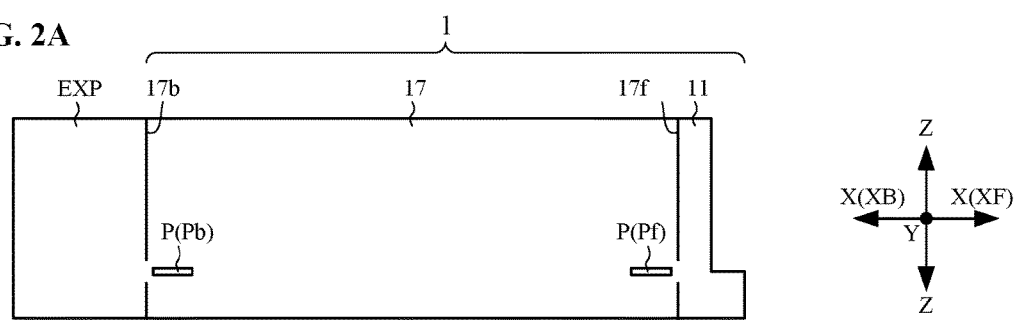
FIG. 2A is a side view showing an example of connection between a treating section and other equipment according to Embodiment 1.

FIG. 2A is a side view showing an example of connection between the treating section and other equipment according to Embodiment 1. In FIG. 2A, the front face 17$f$ of the treating section 17 is connected to an indexer section 11. The indexer section 11 feeds the wafers W to the treating section 17. The rear face 17$b$ of the treating section 17 is connected to an exposing machine EXP. The exposing machine EXP performs exposing treatment of the wafers W. The indexer section 11, treating section 17 and exposing machine EXP are arranged in a row in the fore-and-aft direction X. The indexer section 11, treating section 17 and exposing machine EXP are arranged in the stated order backward XB.

In this Embodiment 1, the indexer section 11 is an element of the substrate treating apparatus 1. That is, the indexer section 11 is an internal part of equipment provided inside the substrate treating apparatus 1. The exposing machine EXP is an external part of equipment provided outside the substrate treating apparatus 1.

In the case of FIG. 2A, the substrate treating apparatus 1 and exposing machine EXP operate as follows, for example. The indexer section 11 transports wafers W to the treating section 17. Specifically, the indexer section 11 feeds wafers W to the treating section 17 through the front receivers Pf. The treating section 17 treats the wafers W. When the treating section 17 treats the wafers W, the wafers W are transported from the treating section 17 to the exposing machine EXP through the rear receivers Pb, and the exposing machine EXP performs the exposing treatment of the wafers W. After completion of the treatment by the treating section 17, the wafers W are transported from the treating section 17 to the indexer section 11 through the front receivers Pf.

Figure 2B:
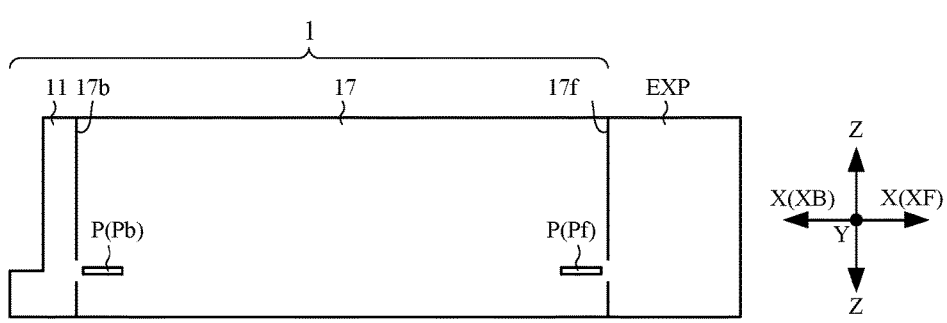
FIG. 2B is a side view showing another example of connection between the treating section and other equipment according to Embodiment 1.

FIG. 2B is a side view showing another example of connection between the treating section and other equipment according to Embodiment 1. In FIG. 2B, the rear face 17b is connected to the indexer section 11. The front face 17f is connected to the exposing machine EXP. The indexer section 11, treating section 17 and exposing machine EXP are arranged in a row in the fore-and-aft direction X. The indexer section 11, treating section 17 and exposing machine EXP are arranged in the stated order forward XF.

In the case of FIG. 2B, the substrate treating apparatus 1 and exposing machine EXP operate as follows, for example. The indexer section 11 transports wafers W to the treating section 17. Specifically, the indexer section 11 feeds wafers W to the treating section 17 through the rear receivers Pb. The treating section 17 treats the wafers W. When the treating section 17 treats the wafers W, the wafers W are transported from the treating section 17 to the exposing machine EXP through the front receivers Pf, and the exposing machine EXP performs the exposing treatment of the wafers W. After completion of the treatment by the treating section 17, the wafers W are transported from the treating section 17 to the indexer section 11 through the rear receivers Pb.

Thus, according to the substrate treating apparatus 1 in this Embodiment 1, the front face 17f is connectable to the indexer section 11. By connecting the front face 17f to the indexer section 11, the indexer section 11 can be placed forward XF of the treating section 17. The rear face 17b is connectable to the indexer section 11. By connecting the rear face 17b to the indexer section 11, the indexer section 11 can be placed backward XB of the treating section 17. Since the front face 17f and rear face 17b are both connectable to the indexer section 11 as described above, the degree of freedom for arranging the treating section 17 and indexer section 11 can be improved.

Consequently, the specifications of the treating section 17 do not change whichever of the front face 17f and rear face 17b of the treating section 17 may be connected to the indexer section 11. The specifications of the treating section 17 can therefore be settled even if it is not determined which of the front face 17f and rear face 17b the indexer section 11 should be connected to for operation of the substrate treating apparatus 1. Therefore, before determining which of the front face 17f and rear face 17b connects to the indexer section 11, manufacturing of the treating section 17 can be started. Consequently, it is possible to move up a deadline for delivery of the treating section 17 or the substrate treating apparatus 1.

The front face 17f and rear face 17b are both connectable to the exposing machine EXP. By connecting the front face 17f to the exposing machine EXP, the exposing machine EXP can be placed forward XF of the treating section 17. By connecting the rear face 17b to the exposing machine EXP, the exposing machine EXP can be placed backward XB of the treating section 17. Thus, the degree of freedom for arranging the treating section 17 and exposing machine EXP can also be improved.

The positions of the front receivers Pf relative to the front face 17f when the treating section 17 is seen from front are the same as the positions of the rear receivers Pb relative to the rear face 17b when the treating section 17 is seen from back. Therefore, the positions of the front receivers Pf relative to the indexer section 11 connected to the front face 17f are the same as the positions of the rear receivers Pb relative to the indexer section 11 connected to the rear face 17b. Thus, when the indexer section 11 is connected to the front face 17f, and when the indexer section 11 is connected to the rear face 17b, the indexer section 11 in the same position can feed wafers W to the treating section 17.

The construction of the substrate treating apparatus 1 will be described in greater detail hereinafter.

<Overall Construction of Substrate Treating Apparatus 1>

Figure 3:
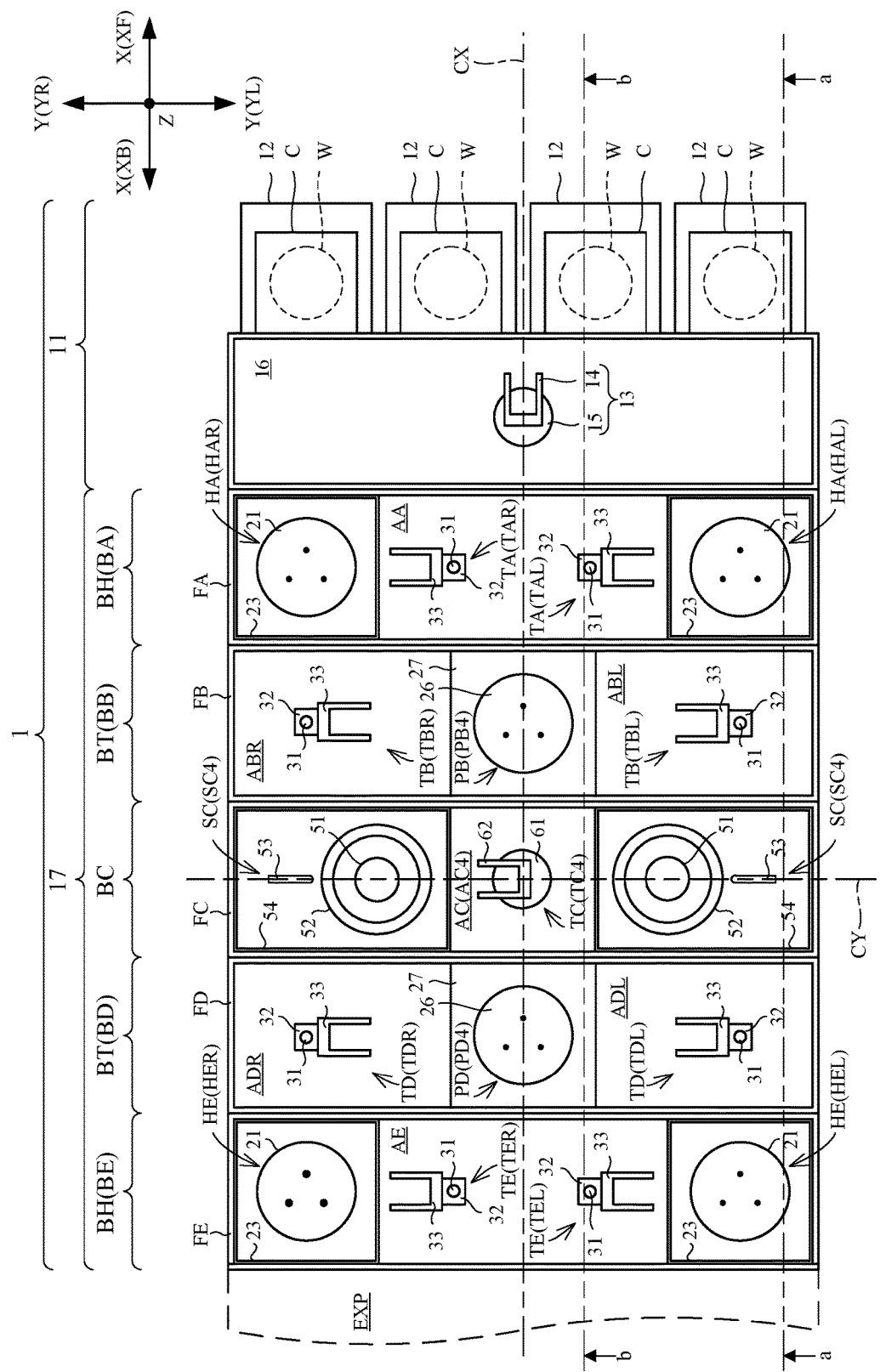
FIG. 3 is a plan view of the substrate treating apparatus according to Embodiment 1.
Figure 4:
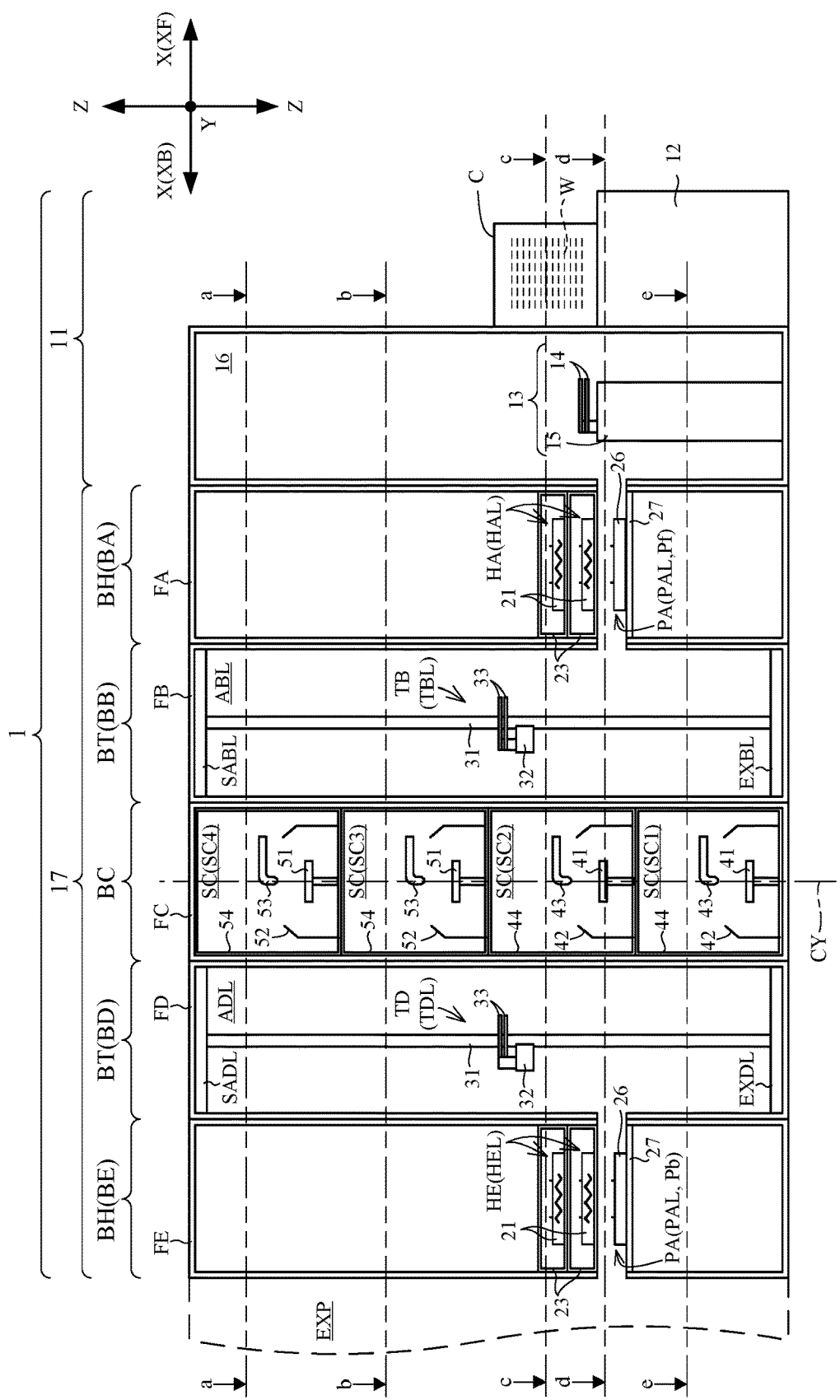
FIG. 4 is a side view taken on line a-a of FIG. 3.
Figure 5:
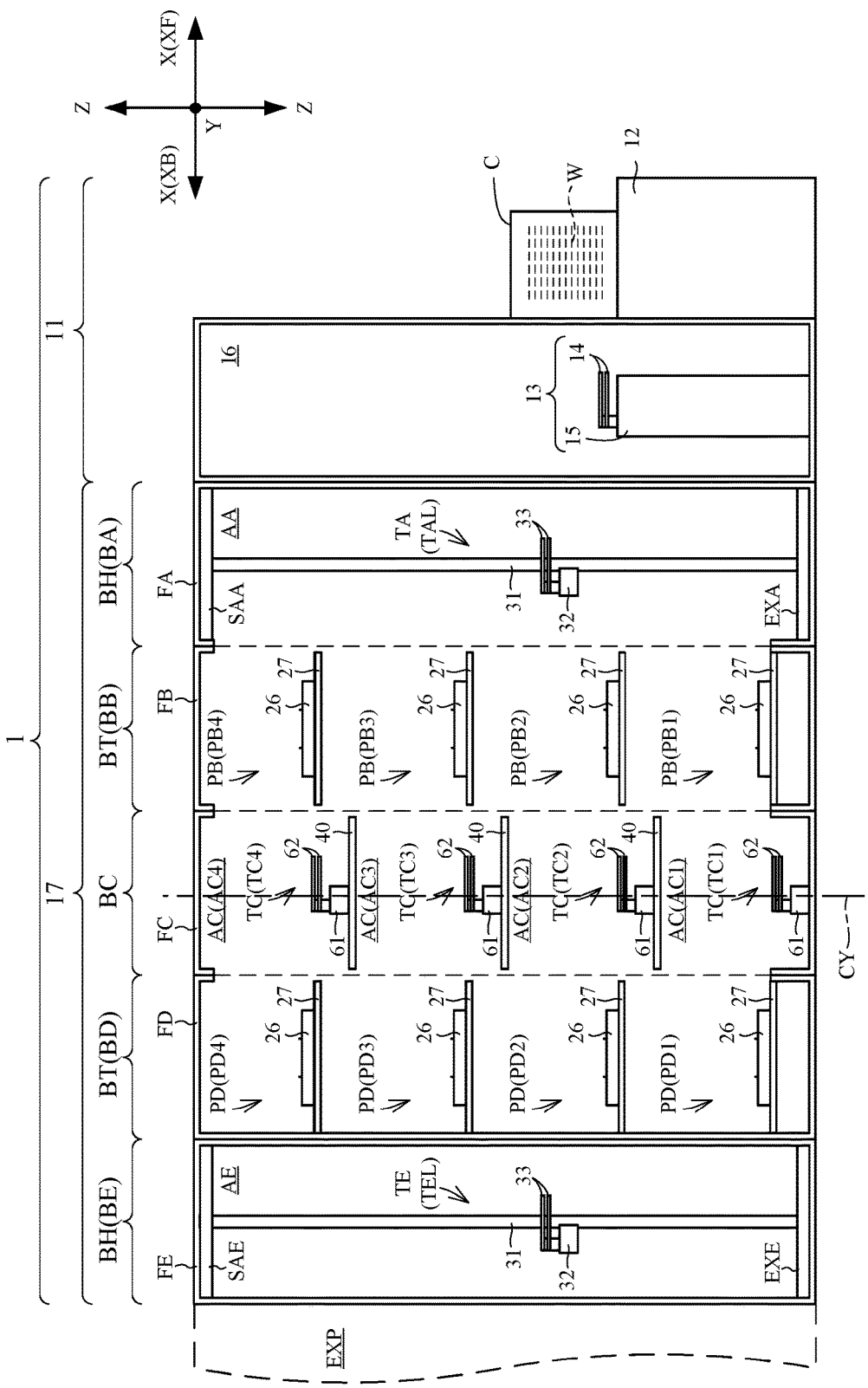
FIG. 5 is a side view taken on line b-b of FIG. 3.

FIG. 3 is a plan view of the substrate treating apparatus 1 according to Embodiment 1. FIG. 4 is a side view taken on line a-a of FIG. 3. FIG. 5 is a side view taken on line b-b of FIG. 3. For expediency, FIGS. 3 through 5 show an example in which the front face 17f of the treating section 17 is connected to the indexer section 11, and the rear face 17b of the treating section 17 is connected to the exposing machine EXP.

The treating section 17 includes two heat-treating blocks BH, two relay blocks BT, and one solution treating block BC. Each heat-treating block BH performs heat treatment of wafers W. Each relay block BT relays the wafers W. The solution treating block BC performs solution treatment of the wafers W. The solution treatment is a treatment for supplying treating solutions to the wafers W. The treating solutions are a film material and a developer, for example. The solution treatment includes coating treatment and developing treatment, for example.

The heat-treating blocks BH, relay blocks BT and solution treating block BC are arranged in a row in the fore-and-aft direction X. An array ArF of blocks BH, BT and BC extending forward XF, and an array ArB of blocks BH, BT and BC extending backward XB are respectively as follows:

array ArF: BH→BT→BC→BT→BH array ArB: BH→BT→BC→BT→BH

Thus, array ArF is the same as array ArB.

One of the heat-treating blocks BH is located in a front end region of the treating section 17. The one heat-treating block BH has a front face thereof corresponding to the front face 17f of the treating section 17. The front face of the one heat-treating block BH is connected to the indexer section 11. The other heat-treating block BH is located in a rear end region of the treating section 17. The other heat-treating block BH has a rear face thereof corresponding to the rear face 17b of the treating section 17. The rear face of the other heat-treating block BH is connected to the exposing machine EXP.

A block i-th in order from the front of the treating section 17 (i being an integer one or more) has the same function as a block i-th in order from the rear of the treating section 17.

Specifically, the first block from the front of the treating section 17 is the one heat-treating block BH. The first block from the rear of the treating section 17 is the other heat-treating block BH. Therefore, the first block from the front of the treating section 17 has the same function as the first block from the rear.

The second block from the front of the treating section 17 is one of the relay blocks BT. The second block from the rear of the treating section 17 is the other relay block BT. Therefore, the second block from the front of the treating section 17 has the same function as the second block from the rear.

The third block from the front of the treating section 17 is the third block itself from the rear of the treating section 17, which specifically is the solution treating block BC.

Naturally, the third block from the front of the treating section 17 has the same function as the third block from the rear.

For expediency, the heat-treating block BH located in the front end region of the treating section 17 will be called hereinafter the "front heat-treating block BA". The heat-treating block BH located in the rear end region of the treating section 17 will be called the "rear heat-treating block BE". The relay block BT located between the front heat-treating block BA and solution treating block BC will be called the "front relay block BB". The relay block BT located between the rear heat-treating block BE and solution treating block BC will be called the "rear relay block BD."

Each block BA, BB, BC, BD or BE is in the shape of a substantially rectangular parallelepiped. Each block BA, BB, BC, BD or BE is substantially rectangular in any one of plan view, side view and front view. The blocks BA, BB, BC, BD and BE have substantially the same length in the transverse direction Y.

Blocks BA-BB are directly connected and can transport the wafers W reciprocally. Similarly, each pair of blocks BB-BC, BC-BD and BD-BE is directly connected and can transport the wafers W reciprocally to each other. However, block BA is not directly connected to block BC, BD or BE. Block BB is not directly connected to block BD or BE. Block BC is not directly connected to block BA or BE.

<Indexer Section 11>

Reference is made to FIGS. 3 through 5. The indexer section 11 has carrier tables 12, an indexer's transport mechanism 13 and a transporting space 16.

The carrier tables 12 receive and hold carriers C. Each carrier C can store a plurality of wafers W. The carriers C are FOUPs (front opening unified pods), for example. The carriers C are placed on the carrier tables 12 by an unillustrated external transport mechanism, for example.

The transporting space 16 is provided backward XB of the carrier tables 12. The indexer's transport mechanism 13 is installed in the transporting space 16. The indexer's transport mechanism 13 transports the wafers W to the carriers C. Further, the indexer's transport mechanism 13 can transport the wafers W to the front heat-treating block BA.

For example, the indexer's transport mechanism 13 has two hands 14 for holding wafers W, and a hand drive mechanism 15 for driving each hand 14. The hands 14 hold one wafer W each. The hand drive mechanism 15 moves the hands 14 in the fore-and-aft direction X, transverse direction Y and the up-down direction Z, and rotates the hands 14 about the up-down direction Z. Thus, the indexer's transport mechanism 13 transports wafers W to the carriers C and to the front heat-treating block BA.

<Construction of Front Heat-Treating Block BA>

Figure 6:
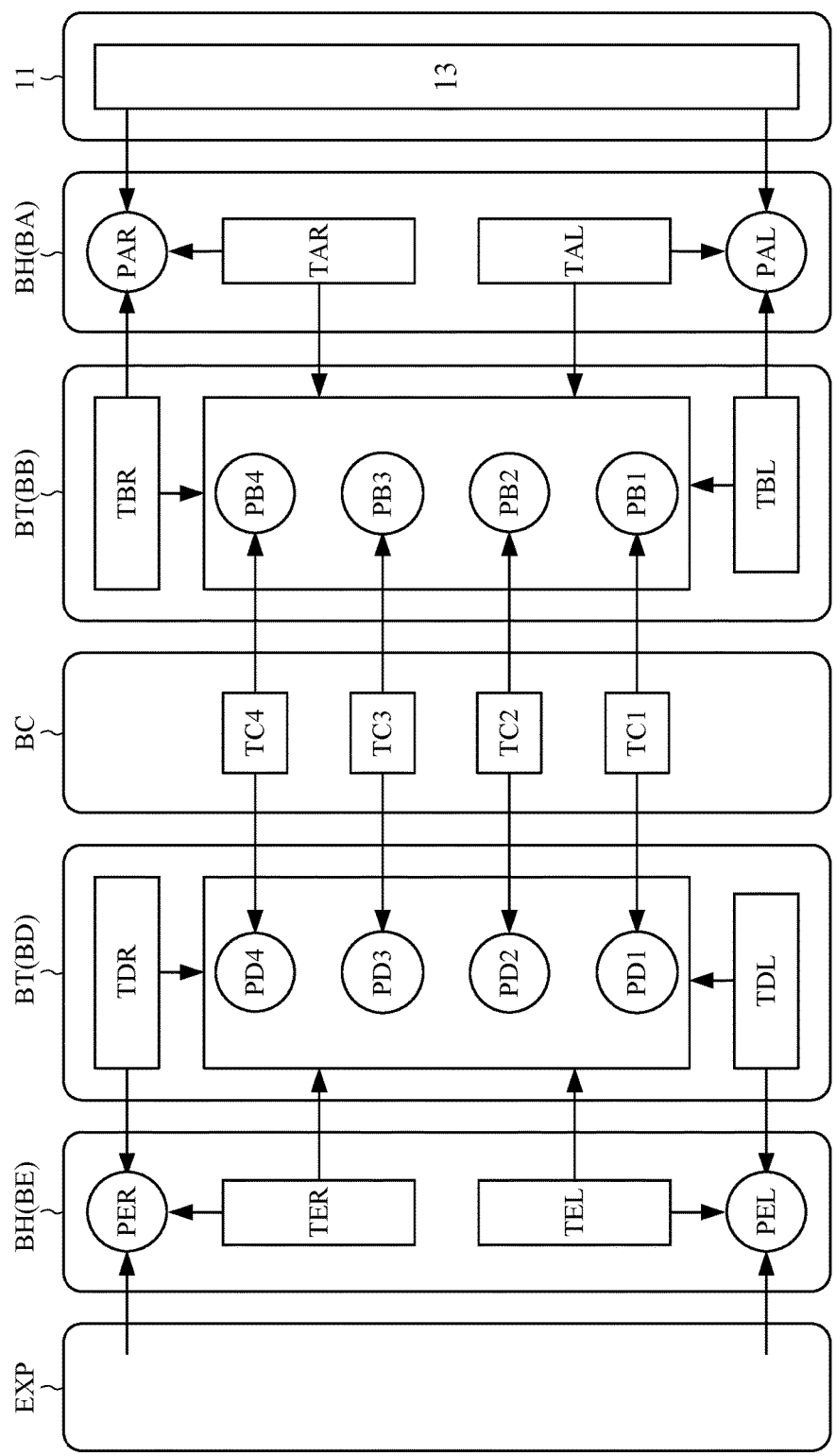
FIG. 6 is a conceptual diagram schematically showing relationships between transport mechanisms and receivers.
Figure 7:
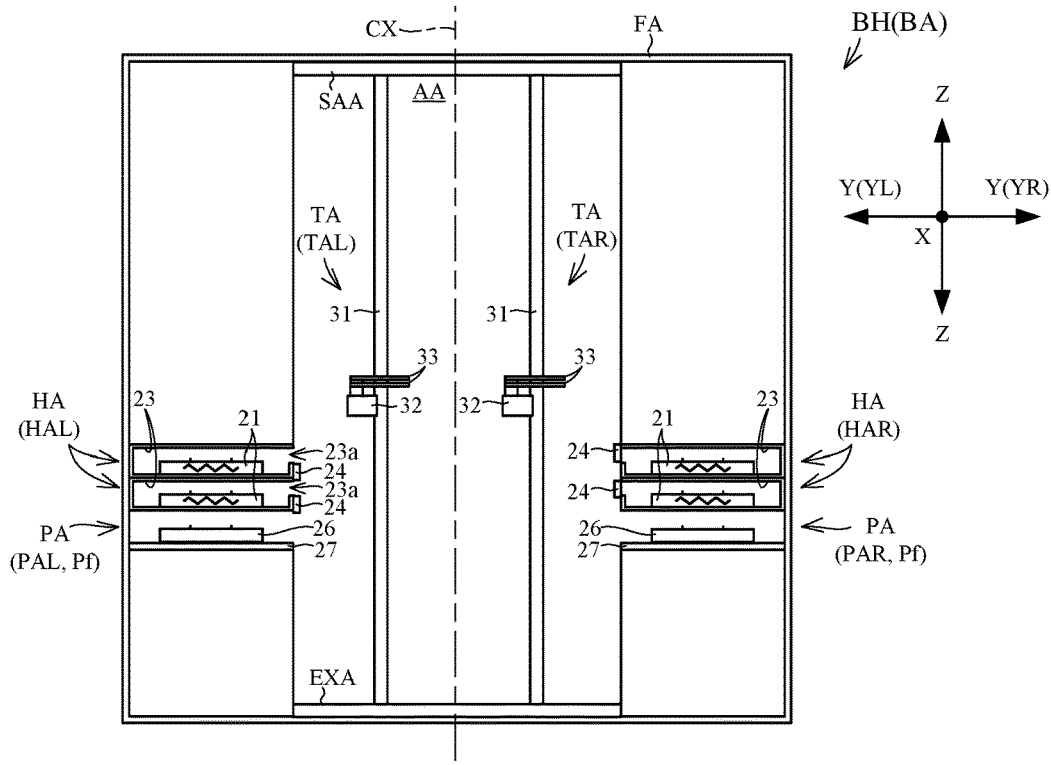
FIG. 7 is a front view of a front heat-treating block seen from an indexer section.

Reference is made to FIGS. 3 through 7. FIG. 6 is a conceptual diagram schematically showing relationships between transport mechanisms and receivers. The lines with arrows indicate receivers accessed by the transport mechanisms. The term "access" signifies that the transport mechanisms move to positions where the transport mechanisms can load or unload wafers W into/from the receivers and treating units. FIG. 7 is a front view of the front heat-treating block BA seen from the indexer section 11.

The front heat-treating block BA has heat-treating units HA, receivers PA, transport mechanisms TA, and a transporting space AA. The heat-treating units HA perform the heat treatment of the wafers W. The heat treatment includes heating treatment and cooling treatment, for example. The receivers PA receive the wafers W. The receivers PA correspond to the front receivers Pf described hereinbefore. The transport mechanisms TA transport the wafers W to the heat-treating units HA and receivers PA. The transport mechanisms TA do not mean what is called local transport mechanisms (i.e. mechanisms each installed for one heat-treating unit exclusively for loading and unloading wafers into/from this one heat-treating unit). The transporting space AA is a space for installing the transport mechanisms TA.

In this specification, for example, a simple reference to the "heat-treating units HA" means the heat-treating units of the front heat-treating block BA, and does not mean the heat-treating units of the blocks other than the front heat-treating block BA. Note that the other members given the same names are similarly distinguished by the signs affixed thereto.

In plan view, the transporting space AA is disposed at the middle in the transverse direction Y of the front heat-treating block BA. In other words, in plan view, the transporting space AA is disposed on a center plane CX. The center plane CX is a plane parallel to the fore-and aft direction X and up-down direction Z, and is a plane passing through the center PC of the treating section 17. The center plane CX is an imaginary plane. In plan view, the transporting space AA extends in the fore-and-aft direction X. The transporting space AA reaches the front face and rear face of the front heat-treating block BA.

The front heat-treating block BA further includes an air supply unit SAA for supplying a clean gas into the transporting space AA, and an exhaust unit EXA for exhausting gas from the transporting space AA. The air supply unit SAA is disposed in an upper part of the transporting space AA for blowing out the gas downward. The exhaust unit EXA is disposed in a lower part of the transporting space AA. Consequently, the transporting space AA has downward currents (downflows) of the gas formed therein.

The transport mechanisms TA are installed in the transporting space AA. The transport mechanisms TA include a transport mechanism TAR and a transport mechanism TAL. The transport mechanism TAR and transport mechanism TAL are arranged to line up in the transverse direction Y.

The heat-treating units HA and receivers PA are arranged on opposite sides of the transporting space AA, respectively. The heat-treating units HA include two heat-treating units HAR arranged on the right side YR of the transporting space AA, and two heat-treating units HAL arranged on the left side YL of the transporting space AA. The receivers PA include a receiver PAR disposed on the right side YR of the transporting space AA, and a receiver PAL disposed on the left side YL of the transporting space AA.

The heat-treating units HAR and receiver PAR are located on the right side YR of the transport mechanism TAR. The transport mechanism TAR is opposed to the two heat-treating units HAR and one receiver PAR. The two heat-treating units HAR and one receiver PAR are arranged to line up in the up-down direction Z. The transport mechanism TAR is constructed movable in the up-down direction Z to access the heat-treating units HAR and receiver PAR.

The heat-treating units HAL and receiver PAL are located on the left side YL of the transport mechanism TAL. The transport mechanism TAL is opposed to the two heat-treating units HAL and one receiver PAL. The two heat-treating units HAL and one receiver PAL are arranged to line up in the up-down direction Z. The transport mechanism TAL is constructed movable in the up-down direction Z to access the heat-treating units HAL and receiver PAL.

<Construction of Front Relay Block BB>

Figure 8:
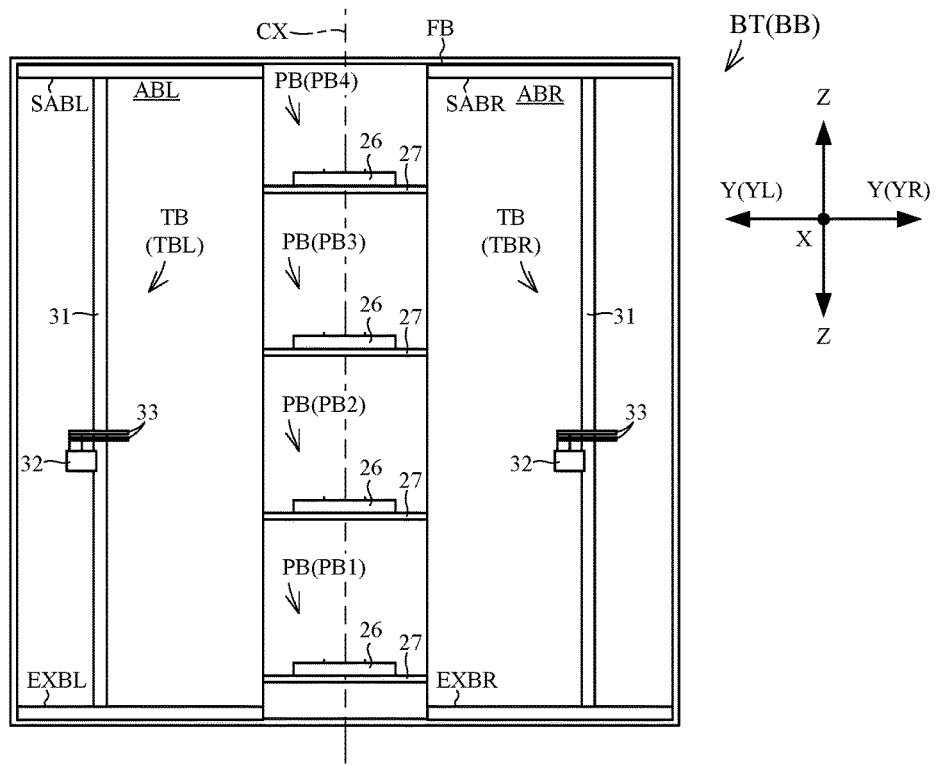
FIG. 8 is a front view of a front relay block seen from the indexer section

Reference is made to FIGS. 3 through 6 and 8. FIG. 8 is a front view of the front relay block BB seen from the indexer section 11.

The front relay block BB has receivers PB and transport mechanisms TB. The receivers PB receive the wafers W. The transport mechanisms TB transport the wafers W to the receivers PB.

In plan view, the receivers PB are arranged at the middle in the transverse direction Y of the front relay block BB. In other words, in plan view, the receivers PB are arranged on the center plane CX.

The plurality of receivers PB are arranged to line up in the up-down direction Z. More particularly, the receivers PB include receivers PB1, PB2, PB3 and PB4. The receivers PB1, PB2, PB3 and PB4 are arranged in the up-down direction Z. The receivers PB1, PB2, PB3 and PB4 are arranged in this order from bottom upward.

The transport mechanisms TB are arranged on the opposite sides of the receivers PB. Specifically, the transport mechanisms TB include a transport mechanism TBR disposed on the right side YR of the receivers PB, and a transport mechanism TBL disposed on the left side YL of the receivers PB. The transport mechanisms TBR and TBL are opposed to the receivers PB, respectively.

In other words, the front relay block BB includes a transporting space ABR formed on the right side YR of the receivers PB, and a transporting space ABL formed on the left side YL of the receivers PB. The transport mechanism TBR is installed in the transporting space ABR. The transport mechanism TBL is installed in the transporting space ABL.

Air supply units SABR and SABL are installed in upper parts of the transporting spaces ABR and ABL, respectively. Exhaust units EXBR and EXBL are installed in lower parts of the transporting spaces ABR and ABL, respectively.

The transport mechanisms TBR and TBL are opposed to the receivers PB, respectively. The transport mechanism TBR is constructed movable in the up-down direction Z to be able to access the receivers PB. The transport mechanism TBL is constructed movable in the up-down direction Z to be able to access the receivers PB.

<Construction of Solution Treating Block BC>

Figure 9:
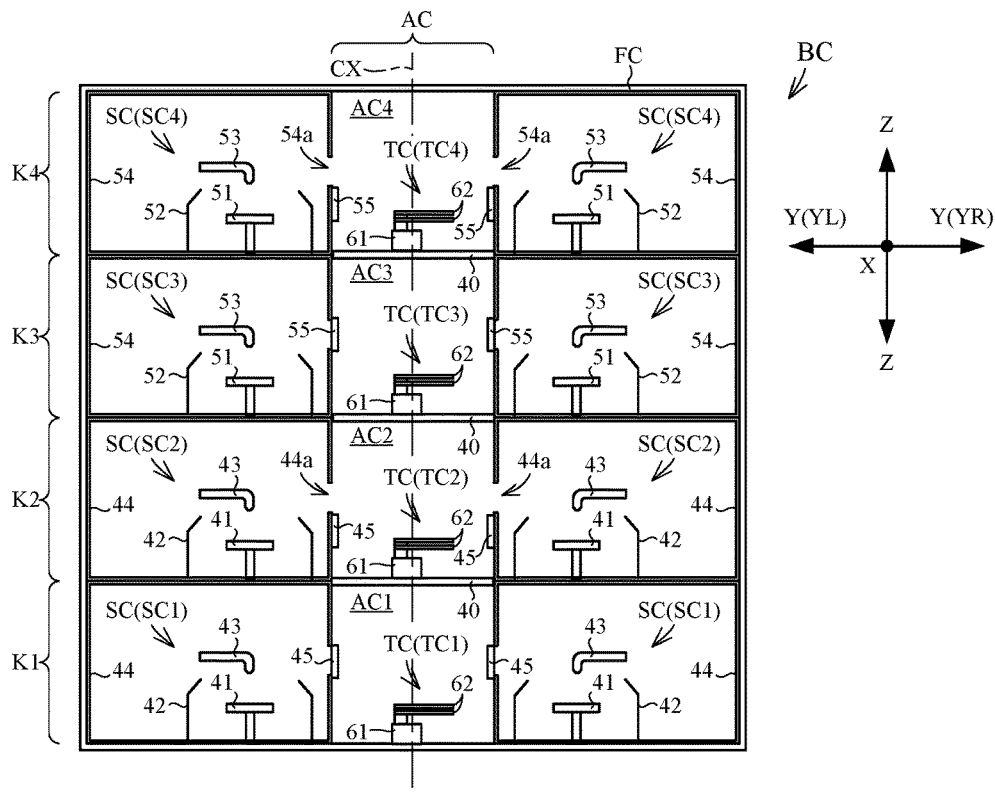
FIG. 9 is a front view of a solution treating block seen from the indexer section.

Reference is made to FIGS. 3 through 6 and 9. FIG. 9 is a front view of the solution treating block BC seen from the indexer section 11.

The solution treating block BC has solution treating units SC and transport mechanisms TC. The solution treating units SC perform the solution treatment of the wafers W. The transport mechanisms TC transport the wafers W to the solution treating units SC.

The solution treating block BC has a multistory structure including a plurality of stories K1, K2, K3 and K4 arranged in the up-down direction Z (see FIG. 9). Each of the stories K1, K2, K3 and K4 has one transport mechanism TC, and at least one solution treating unit SC to which the transport mechanism TC transports wafers W. The stories K1, K2, K3 and K4 are arranged in this order from bottom upward. This construction will be described specifically hereinafter.

The solution treating block BC has a transporting space AC besides the solution treating units SC and transport mechanisms TC. In plan view, the transporting space AC is disposed at the middle in the transverse direction Y of the solution treating block BC. In other words, in plan view, the transporting space AC is disposed on the center plane CX. In plan view, the transporting space AC extends in the fore-and-aft direction X. The transporting space AC reaches the front face and rear face of the solution treating block BC.

The transporting space AC is separated into a plurality of (e.g. four) divided transporting spaces AC1, AC2, AC3 and AC4. The divided transporting spaces AC1, AC2, AC3 and AC4 are arranged in the up-down direction Z. The divided transporting spaces AC1, AC2, AC3 and AC4 are arranged in this order from bottom upward.

Air supply units (not shown) are installed in upper parts of the divided transporting spaces AC1, AC2, AC3 and AC4, respectively. Exhaust units (not shown) are installed in lower parts of the divided transporting spaces AC1, AC2, AC3 and AC4, respectively.

The solution treating block BC may include a plurality of (e.g. three) shielding plates 40. Each shielding plate 40 is installed between two divided transporting spaces adjoining each other in the up-down direction Z for shutting off the atmospheres of the two divided transporting spaces. For example, the shielding plates 40 are installed between the divided transporting space AC1 and divided transporting space AC2, between the divided transporting space AC2 and divided transporting space AC3, and between the divided transporting space AC3 and divided transporting space AC4.

One transport mechanism TC is installed in each of the divided transporting spaces AC1, AC2, AC3 and AC4. The transport mechanisms TC are arranged to line up in the up-down direction Z.

More particularly, the transport mechanisms TC include transport mechanisms TC1, TC2, TC3 and TC4. The transport mechanisms TC1, TC2, TC3 and TC4 are installed in the divided transporting spaces AC1, AC2, AC3 and AC4, respectively. The transport mechanisms TC1, TC2, TC3 and TC4 are arranged in the up-down direction Z. The transport mechanisms TC1, TC2, TC3 and TC4 are arranged in this order from bottom upward. The transport mechanism TC1 moves inside the divided transporting space AC1, and does not extend into the other divided transporting spaces AC2, AC3 and AC4. This is the case also with the other transport mechanisms TC2, TC3 and TC4.

The solution treating units SC are arranged laterally of the divided transporting spaces AC1, AC2, AC3 and AC4, respectively. More particularly, the solution treating units SC include solution treating units SC1, SC2, SC3 and SC4. The solution treating units SC1 are arranged on opposite sides of the divided transporting space AC1. In this Embodiment 1, one solution treating unit SC1 is disposed on the right side YR of the transport mechanism TC1, and one other solution treating unit SC1 is disposed on the left side YL of the transport mechanism TC1. Similarly, the solution treating units SC2 are arranged on opposite sides of the divided transporting space AC2. The solution treating units SC3 are arranged on opposite sides of the divided transporting space AC3. The solution treating units SC4 are arranged on opposite sides of the divided transporting space AC4.

The solution treating units SC1, SC2, SC3 and SC4 arranged on the right side YR of the transporting spaces AC are aligned in the up-down direction Z. The solution treating units SC1, SC2, SC3 and SC4 arranged on the left side YL of the transporting spaces AC are also aligned in the up-down direction Z.

The transport mechanism TC1 is opposed to the two solution treating units SC1 provided on opposite sides thereof. The transport mechanism TC1 is constructed rotatable about the up-down direction Z to access the two solution treating units SC1. However, the transport mechanism TC1 on story K1 does not access the solution treating units SC2, SC3 and SC4 provided on the other stories K2, K3 and K4. Similarly, the transport mechanisms TC2, TC3 and TC4 access the solution treating units SC2, SC3 and SC4, respectively.

The divided transporting space ACj, transport mechanism TCj and solution treating units SCj described above are elements constituting each story Kj (j being 1, 2, 3 or 4).

<Construction of Rear Relay Block BD>

Figure 10:
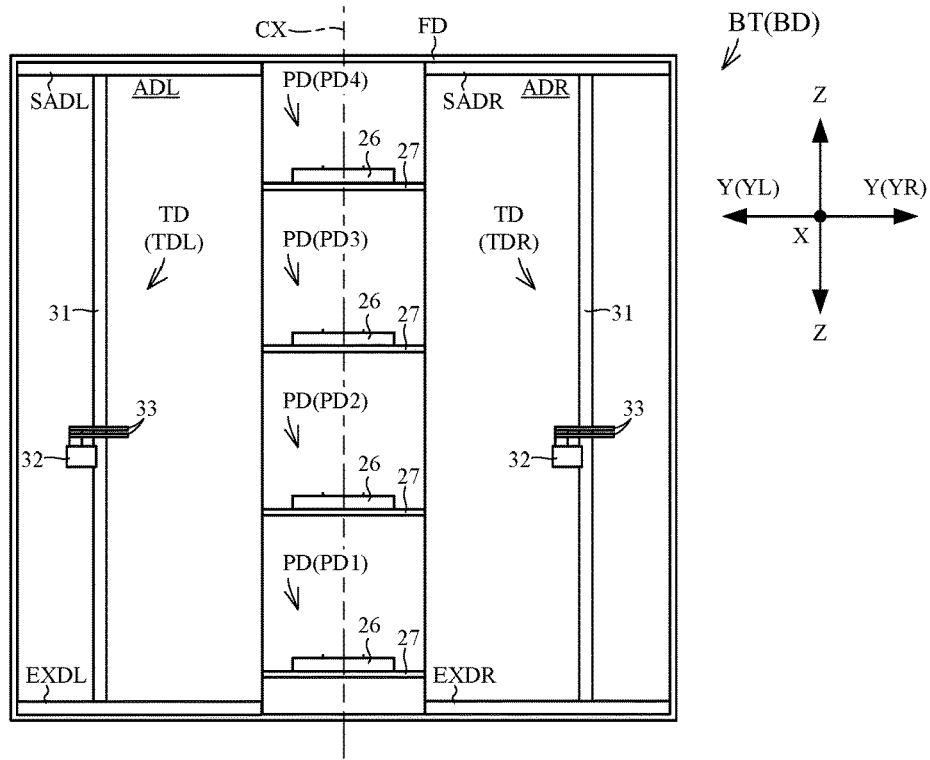
FIG. 10 is a front view of a rear relay block seen from the indexer section.

Reference is made to FIGS. 3 through 6 and 10. FIG. 10 is a front view of the rear relay block BD seen from the indexer section 11.

The rear relay block BD has receivers PD and transport mechanisms TD. The receivers PD receive wafers W. The transport mechanisms TD transport the wafers W to the receivers PD.

The rear relay block BD has the same construction as the front relay block BB. That is, the rear relay block BD has receivers PD, transport mechanisms TD, transporting spaces ADR and ADL, air supply units SADR and SADL and exhaust units EXDR and EXDL. The receivers PD include receivers PD1, PD2, PD3 and PD4. The transport mechanisms TD include transport mechanisms TDR and TDL. The positional relationship of the elements of the rear relay block BD is the same as the positional relationship of the elements of the front relay block BB.

Specifically, about the construction of the rear relay block BD, and in the foregoing description of <Construction of front relay block BB>, the front relay block BB is to be read as rear relay block BD, the transport mechanisms TB, TBR and TBL are to be read as transport mechanisms TD, TDR and TDL, respectively, the receivers PB, PB1, PB2, PB3 and PB4 are to be read as receivers PD, PD1, PD2, PD3 and PD4, respectively, the transporting spaces ABR and ABL are to be read as transporting spaces ADR and ADL, the air supply units SABR and SABL are to be read as air supply units SADR and SADL, and the exhaust units EXBR and EXBL are to be read as exhaust units EXDR and EXDL.

<Construction of Rear Heat-Treating Block BE>

Figure 11:
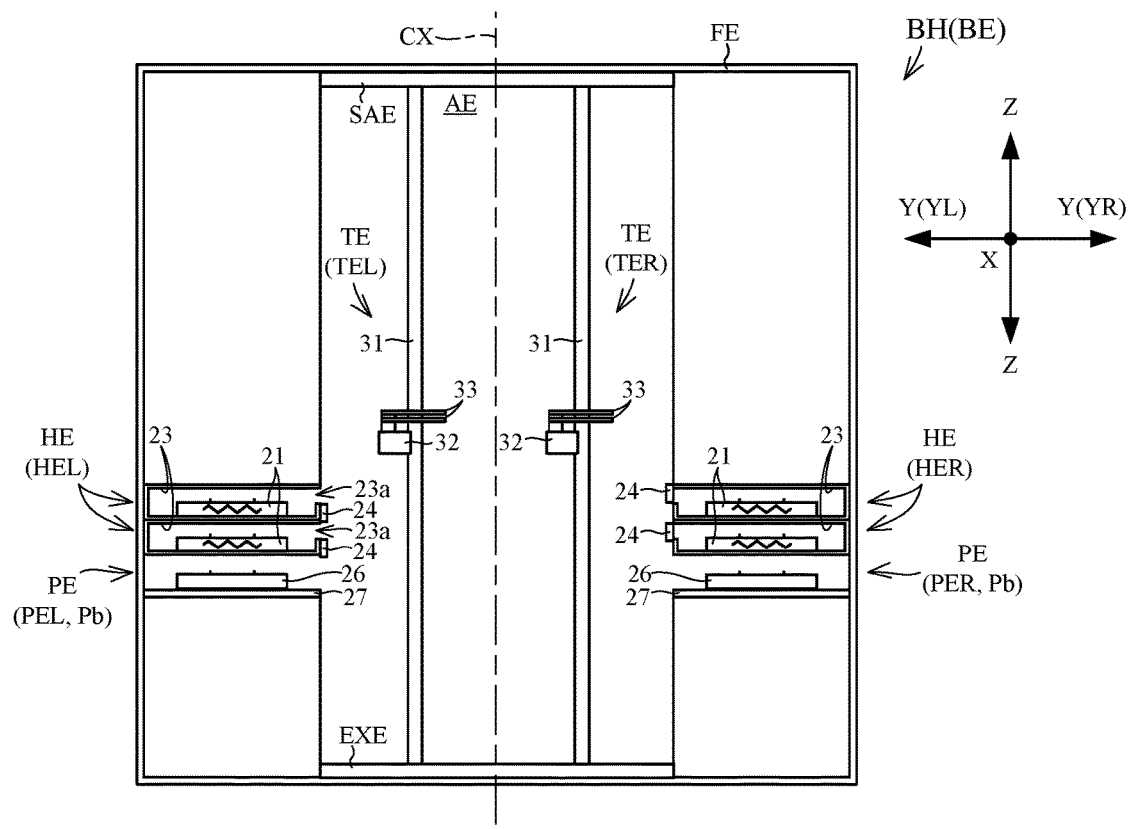
FIG. 11 is a front view of a rear heat-treating block seen from the indexer section.

Reference is made to FIGS. 3 through 6 and 11. FIG. 11 is a front view of the rear heat-treating block BE seen from the indexer section 11.

The rear heat-treating block BE has the same construction as the front heat-treating block BA. That is, the rear heat-treating block BE has heat-treating units HE, transport mechanisms TE, a transporting space AE, receivers PE, an air supply unit SAE and an exhaust unit EXE. The receivers PE correspond to the rear receivers Pb described hereinbefore. The heat-treating units HE include a heat-treating unit HER and a heat-treating unit HEL. The receivers PE include a receiver PER and a receiver PEL. The transport mechanisms TE include a transport mechanism TER and a transport mechanism TEL. The positional relationship of the elements of the rear heat-treating block BE is the same as the positional relationship of the elements of the front heat-treating block BA. For example, the transport mechanism TER and transport mechanism TEL are arranged in the same direction (transverse direction Y) as the transport mechanism TAR and transport mechanism TAL.

Specifically, about the construction of the heat-treating block BE, and in the foregoing description of <Construction of front heat-treating block BA>, the front heat-treating block BA is to be read as rear heat-treating block BE, the transport mechanisms TA, TAR and TAL to be read as transport mechanisms TE, TER and TEL, respectively, the heat-treating units HA, HAR and HAL to be read as heat-treating units HE, HER and HEL, respectively, the receivers PA, PAR and PAL to be read as receivers PE, PER and PEL, respectively, the transporting space AA to be read as transporting space AE, the air supply unit SAA to be read as air supply unit SAE, and the exhaust unit EXA to be read as exhaust unit EXE.

<Arrangement of Treating Units, Receivers and Transport Mechanisms>

Figure 12A:
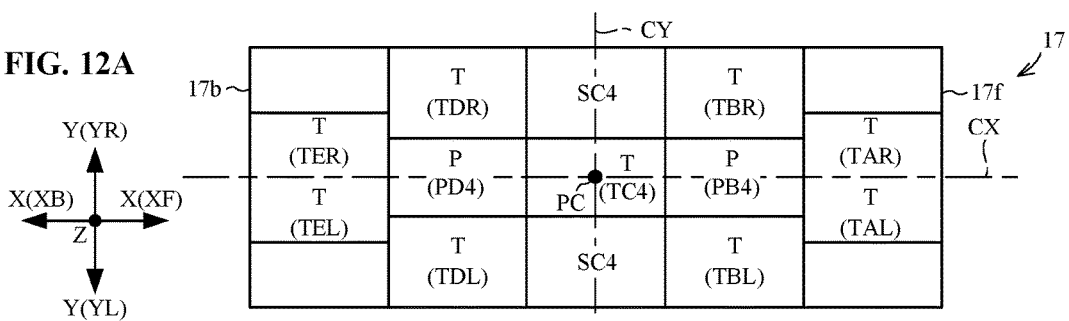
FIGS. 12A, 12B, 12C, 12D and 12E are plan views taken on lines a-a, b-b, c-c, d-d and e-e of FIG. 4, respectively.
Figure 12B:
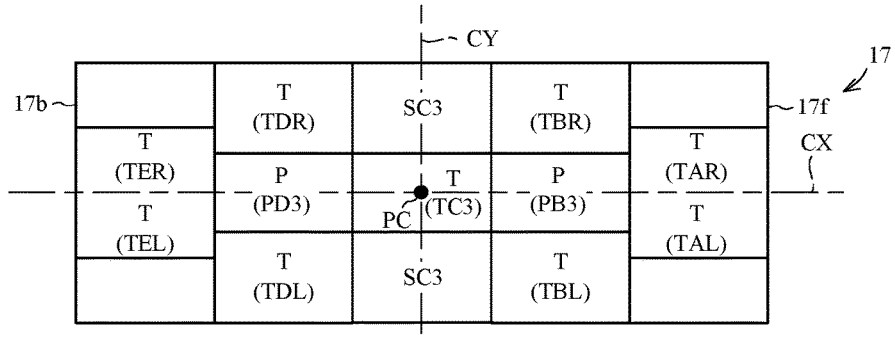
Figure 12C:
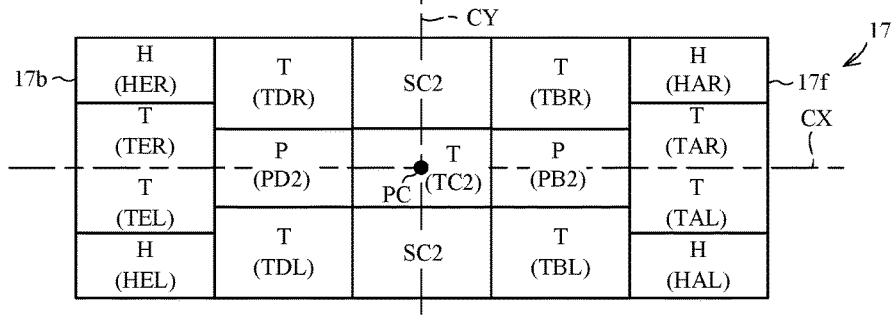
Figure 12D:
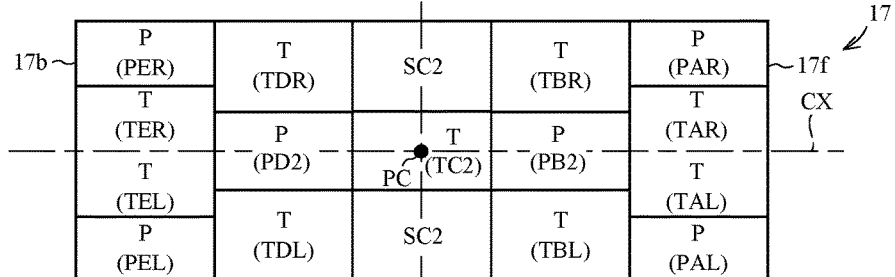
Figure 12E:
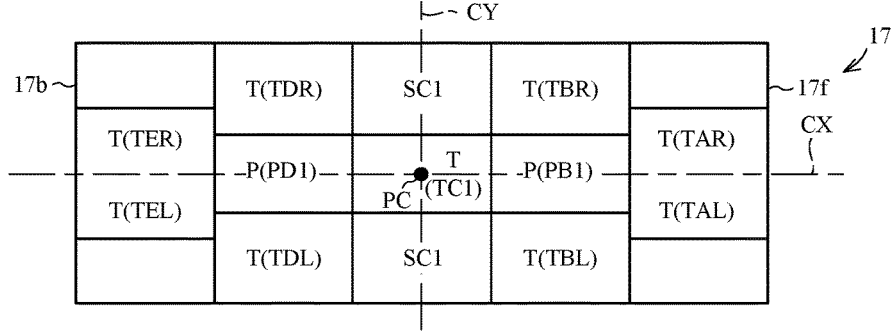

Reference is made to FIGS. 12A-12E. FIG. 12A is a plan view taken on line a-a of FIG. 4. Similarly, FIGS. 12B-12E are plan views taken on lines b-b, c-c, d-d and e-e of FIG. 4, respectively.

The heat-treating units HAR, HAL, HER and HEL, when not particularly distinguished, will be called "heat-treating units H", and will be regarded as identical. The solution treating units SC1-SC4, when not particularly distinguished, will be called "solution treating units SC", and will be regarded as identical. The heat-treating units H and solution treating units SC, when not particularly distinguished, will be called the "treating units", and will be regarded as identical. The receivers PAR, PAL, PB1-PB4, PD1-PD4, PER and PEL, when not particularly distinguished, will be called "receivers P", and will be regarded as identical. The transport mechanisms TAR, TAL, TBR, TBL, TC1-TC4, TDR, TDL, TER and TEL, when not particularly distinguished, will be called "transport mechanisms T", and will be regarded as identical.

As shown in FIGS. 12A-12E, the relative positional relationship of the front face 17f, treating units, receivers P and transport mechanisms T of the treating section 17 is the same as that of the rear face 17b, treating units, receivers P and transport mechanisms T of the treating section 17. In other words, the position of each of the treating units, receivers P and transport mechanisms T relative to the front face 17f of the treating section is the same as the position of each of the treating units, receivers P and transport mechanisms T relative to the rear face 17b of the treating section 17.

Specifically, the relative positional relationship of the front face 17f, heat-treating units H and solution treating units SC of the treating section 17 is the same as that of the rear face 17b, heat-treating units H and solution treating units SC of the treating section 17. In other words, the position of each of the heat-treating units H and solution treating units SC relative to the front face 17f of the treating section 17 is the same as the position of each of the heat-treating units H and solution treating units SC relative to the rear face 17b of the treating section 17.

The relative positional relationship of the front face 17f and receivers P of the treating section 17 is the same as that of the rear face 17b and receivers P of the treating section 17. In other words, the position of each of the receivers P relative to the front face 17f of the treating section 17 is the same as the position of each of the receiver P relative to the rear face 17b of the treating section 17.

The relative positional relationship of the front face 17f and transport mechanisms T of the treating section 17 is the same as that of the rear face 17b and transport mechanisms T of the treating section 17. In other words, the position of each of the transport mechanisms T relative to the front face 17f of the treating section 17 is the same as the position of each of the transport mechanisms T relative to the rear face 17b of the treating section 17.

The treating units, receivers P and transport mechanisms T are arranged in point symmetry in plan view.

Specifically, the treating units are arranged in point symmetry in plan view. The center of point symmetry (i.e. the point of symmetry) is the center PC of the treating section 17 in plan view, for example. The heat-treating units H are arranged in point symmetry in plan view (see FIG. 12C).

The solution treating units SC are arranged in point symmetry in plan view (see FIGS. 12A-12E). The receivers P are arranged in point symmetry in plan view (see FIGS. 12A-12E). The transport mechanisms T are arranged in point symmetry in plan view (see FIGS. 12A-12E).

The treating units, receivers P and transport mechanisms T in a right part of the treating section 17 are arranged symmetrically to the treating units, receivers P and transport mechanisms T in a left part of the treating section 17. To put it simply, the treating units, receivers P and transport mechanisms T are arranged in right-left symmetry. More particularly, the treating units, receivers P and transport mechanisms T are arranged in right-left symmetry at least either in plan view and or in front view. The right part of the treating section 17 is a portion of the treating section 17 rightward YR of the center plane CX, for example. The left part of the treating section 17 is a portion of the treating section leftward YL of the center plane CX, for example.

Reference is made to FIGS. 12A-12E. The treating units are arranged in right-left symmetry in plan view (see FIGS. 12A-12E). The heat-treating units H are arranged in right-left symmetry in plan view (see FIG. 12C). The solution treating units SC are arranged in right-left symmetry in plan view (see FIGS. 12A-12E). The receivers P are arranged in right-left symmetry in plan view (see FIGS. 12A-12E). The transport mechanisms T are arranged in right-left symmetry in plan view (see FIGS. 12A-12E). Thus, the treating units, receivers P and transport mechanisms T are arranged in right-left symmetry in plan view. The axis of line symmetry is the center plane CX in plan view, for example. The center plane CX is a plane parallel to the fore-and-aft direction X and up-down direction Z, and is also a plane passing through the center PC of the treating section 17. Therefore, the center plane CX in plan view corresponds to a straight line parallel to the fore-and-aft direction X and passing through the center PC of the treating section 17.

Reference is made to FIGS. 7 through 11. The treating units are arranged in right-left symmetry in front view (see FIGS. 7, 9 and 11). The heat-treating units H are arranged in right-left symmetry in front view (see FIGS. 7 and 11). The solution treating units SC are arranged in right-left symmetry in front view (see FIG. 9). The receivers P are arranged in right-left symmetry in front view (see FIGS. 7-11). The transport mechanisms T are arranged in right-left symmetry in front view (see FIGS. 7-11). Thus, the treating units, receivers P and transport mechanisms T are arranged in right-left symmetry in front view. The axis of line symmetry is the center plane CX in front view, for example. The center plane CX in front view corresponds to a straight line parallel to the up-down direction Z and passing through the center PC of the treating section 17.

The treating units, receivers P and transport mechanisms T in a front part of the treating section 17 are arranged symmetrically to the treating units, receivers P and transport mechanisms T in a rear part of the treating section 17. To put it simply, the treating units, receivers P and transport mechanisms T are arranged in fore-aft symmetry. More particularly, the treating units, receivers P and transport mechanisms T are arranged in fore-aft symmetry at least either in plan view and or in side view. The front part of the treating section 17 is a portion of the treating section 17 forward XF of a center plane CY, for example. The rear part of the treating section 17 is a portion of the treating section backward XB of the center plane CY, for example. The center plane CY is a plane perpendicular to the fore-and-aft direction X and passing through the center PC of the treating section 17.

Reference is made to FIGS. 12A-12E. The treating units are arranged in fore-aft symmetry in plan view (see FIGS. 12A-12E). The heat-treating units H are arranged in fore-aft symmetry in plan view (see FIG. 12C). The solution treating units SC are arranged in fore-aft symmetry in plan view (see FIGS. 12A-12E). The receivers P are arranged in fore-aft symmetry in plan view (see FIGS. 12A-12E). The transport mechanisms T are arranged in fore-aft symmetry in plan view (see FIGS. 12A-12E). Thus, the treating units, receivers P and transport mechanisms T are arranged in fore-aft symmetry in plan view. The axis of line symmetry is the center plane CY in plan view, for example. The center plane CY in plan view corresponds to a straight line perpendicular to the fore-and-aft direction X and passing through the center PC of the treating section 17.

Reference is made to FIGS. 4 and 5. The treating units are arranged in fore-aft symmetry in side view. The heat-treating units H are arranged in fore-aft symmetry in side view. The solution treating units SC are arranged in fore-aft symmetry in side view. The receivers P are arranged in fore-aft symmetry in side view. The transport mechanisms T are arranged in fore-aft symmetry in side view. Thus, the treating units, receivers P and transport mechanisms T are arranged in fore-aft symmetry in side view. The axis of line symmetry is the center plane CY in side view, for example. The center plane CY in side view corresponds to a straight line parallel to the up-down direction Z and passing through the center PC of the treating section 17.

<Relationship Between Indexer Section 11 and Block BA>

Reference is made to FIGS. 3 through 6. The indexer section 11 and transport mechanisms TA transport wafers W reciprocally to each other. Specifically, the receivers PA (receiver PAR and receiver PAL) are open to the indexer section 11 (transporting space 16). The indexer's transport mechanism 13 accesses the receivers PA. Consequently, the indexer's transport mechanism 13 and the transport mechanism TAR transport wafers W reciprocally through the receiver PAR. The indexer's transport mechanism 13 and the transport mechanism TAL transport wafers W reciprocally through the receiver PAL.

<Relationship Between Front Heat-Treating Block BA and Front Relay Block BB>

The transport mechanisms TA and the transport mechanisms TB transport wafers W reciprocally through the receivers PA of the front heat-treating block BA.

Specifically, the transport mechanism TBR and receiver PAR are aligned in the fore-and-aft direction X. The receiver PAR is open to the transporting space ABR. The transport mechanism TBR and receiver PAR are opposed to each other. The transport mechanism TBR is constructed rotatable about the up-down direction Z to access the receiver PAR. Consequently, the transport mechanism TAR and the transport mechanism TBR can transport wafers W reciprocally through the receiver PAR.

Similarly, the transport mechanism TBL and receiver PAL are aligned in the fore-and-aft direction X. The receiver PAL is open to the transporting space ABL. The transport mechanism TBL and receiver PAL are opposed to each other. The transport mechanism TBL is constructed rotatable about the up-down direction Z to access the receiver PAL. Consequently, the transport mechanism TAL and the transport mechanism TBL can transport wafers W reciprocally through the receiver PAL.

Further, the transport mechanisms TA and transport mechanisms TB transport wafers W reciprocally through the receivers PB of the front relay block BB.

Specifically, the receivers PB and transporting space AA are arranged in the fore-and-aft direction X. That is, the transport mechanism TAR and receivers PB are arranged substantially in the fore-and-aft direction X, and the transport mechanism TAL and receivers PB are arranged substantially in the fore-and-aft direction X. Each receiver PB is open to the transporting space AA. The transport mechanism TAR is opposed to the receivers PB. The transport mechanism TAL is also opposed to the receivers PB. The transport mechanisms TAR and TAL each access the receivers PB1-PB4 by moving vertically in the up-down direction Z and rotating about the up-down direction Z. Consequently, the transport mechanism TAR and the transport mechanism TBR can transport wafers W reciprocally through the receivers PB1-PB4. The transport mechanism TAL and the transport mechanism TBL can transport wafers W reciprocally through the receivers PB1-PB4.

<Relationship Between Indexer sSction 11, Block BA, and Block BB>

The indexer's transport mechanism 13 and the transport mechanisms TB can transport wafers W reciprocally without using the transport mechanisms TA.

Specifically, the receiver PAR is opposed to both the indexer's transport mechanism 13 and transport mechanism TBR. The indexer's transport mechanism 13 and the transport mechanism TBR can transport wafers W reciprocally through the receiver PAR. That is, the indexer's transport mechanism 13 and the transport mechanism TBR can transport wafers W reciprocally, skipping the transport mechanisms TA.

Similarly, the receiver PAL is opposed to both the indexer's transport mechanism 13 and the transport mechanism TBL. The indexer's transport mechanism 13 and the transport mechanism TBL can transport wafers W reciprocally through the receiver PAL. That is, the indexer's transport mechanism 13 and the transport mechanism TBL can transport wafers W reciprocally, skipping the transport mechanisms TA.

<Relationship Between Block BB and Block BC>

The transport mechanisms TB and transport mechanisms TC transport wafers W reciprocally to each other. This will be described specifically hereinafter.

The transporting space AC and receivers PB are arranged in the fore-and-aft direction X. The receivers PB1, PB2, PB3 and PB4 are arranged in positions opposed to the divided transporting spaces AC1, AC2, AC3 and AC4, respectively. The receivers PB1, PB2, PB3 and PB4 are open to the divided transporting spaces AC1, AC2, AC3 and AC4, respectively. The transport mechanisms TC1, TC2, TC3 and TC4 are opposed to the receivers PB1, PB2, PB3 and PB4, respectively.

The transport mechanisms TC1, TC2, TC3 and TC4 are constructed movable in the fore-and-aft direction X to access the receivers PB1, PB2, PB3 and PB4, respectively. Consequently, the transport mechanism TC1 and the transport mechanisms TBR and TBL transport wafers W reciprocally through the receiver PB1. The transport mechanism TC2 and the transport mechanisms TBR and TBL transport wafers W reciprocally through the receiver PB2. The transport mechanism TC3 and the transport mechanisms TBR and TBL transport wafers W reciprocally through the receiver PB3. The transport mechanism TC4 and the transport mechanisms TBR and TBL transport wafers W reciprocally through the receiver PB4.

<Relationship Between Block BA, Block BB and Block BC>

The transport mechanisms TA and the transport mechanisms TC can transport wafers W reciprocally without using the transport mechanisms TB.

Specifically, the receiver PB1 is opposed to the transport mechanism TC1 and the transport mechanisms TAR and TAL. The transport mechanism TC1 and the transport mechanisms TAR and TAL can transport wafers W reciprocally through the receiver PB1. That is, the transport mechanism TC1 and the transport mechanisms TAR and TAL can transport wafers W reciprocally, skipping the transport mechanisms TBR and TBL.

Similarly, the transport mechanism TC2 and the transport mechanisms TAR and TAL can transport wafers W reciprocally through the receiver PB2. The transport mechanism TC3 and the transport mechanisms TAR and TAL can transport wafers W reciprocally through the receiver PB3. The transport mechanism TC4 and the transport mechanisms TAR and TAL can transport wafers W reciprocally through the receiver PB4.

<Relationship Between Block BC and Block BD>

The relationship between the solution treating block BC and rear relay block BD is the same as the relationship between the front relay block BB and solution treating block BC. That is, the transport mechanisms TC and the transport mechanisms TD transport wafers W reciprocally through the receivers PD. Specifically, the transport mechanism TC1 and the transport mechanisms TDR and TDL transport wafers W reciprocally through the receiver PD1. The transport mechanism TC2 and the transport mechanisms TDR and TDL transport wafers W reciprocally through the receiver PD2. The transport mechanism TC3 and the transport mechanisms TDR and TDL transport wafers W reciprocally through the receiver PD3. The transport mechanism TC4 and the transport mechanisms TDR and TDL transport wafers W reciprocally through the receiver PD4.

<Relationship Between Block BD and Block BE>

The relationship between the rear relay block BD and rear heat-treating block BE is the same as the relationship between the front relay block BB and front heat-treating block BA.

That is, the transport mechanisms TD and the transport mechanisms TE transport wafers W reciprocally through the receivers PD of the rear relay block BD. In this embodiment, the transport mechanisms TDR and the transport mechanisms TER and TEL transport wafers W reciprocally through the receivers PD1-PD4.

Further, the transport mechanisms TD and the transport mechanisms TE transport wafers W reciprocally through the receivers PE of the rear heat-treating block BE. Specifically, the transport mechanism TDR and the transport mechanism TER transport wafers W reciprocally through the receiver PER. The transport mechanism TDL and the transport mechanism TEL transport wafers W reciprocally through the receiver PEL.

<Relationship Between Block BC, Block BD and Block BE>

The relationship between the solution treating block BC, rear relay block BD and rear heat-treating block BE is the same as the relationship between the solution treating block BC, front relay block BB and front heat-treating block BA. That is, the transport mechanisms TC and the transport mechanisms TE can transport wafers W reciprocally without using the transport mechanisms TD.

In this embodiment, the transport mechanism TC1 and the transport mechanisms TER and TEL transport wafers W reciprocally through the receiver PD1. The transport mechanism TC2 and the transport mechanisms TER and TEL transport wafers W reciprocally through the receiver PD2. The transport mechanism TC3 and the transport mechanisms TER and TEL transport wafers W reciprocally through the receiver PD3. The transport mechanism TC4 and the transport mechanisms TER and TEL transport wafers W reciprocally through the receiver PD4.

<Relationship Between Rear Heat-Treating Block BE and Exposing Machine EXP>

The transport mechanisms TE and exposing machine EXP transport wafers W reciprocally. Specifically, each receiver PE is open to the exposing machine EXP. The exposing machine EXP accesses the receiver PER and receiver PEL. Consequently, the transport mechanism TER and the exposing machine EXP transport wafers W reciprocally through the receiver PER. The transport mechanism TEL and the exposing machine EXP transport wafers W reciprocally through the receiver PEL.

<Construction of Each Element of Front Heat-Treating Block BA>

A construction of each element will be described by way of example. Here, when different elements (e.g. heat-treating units HA and heat-treating units HE) have members of the same type, a common sign will be affixed to such members and their detailed description will be omitted. For example, when each heat-treating unit HA has a plate 21 and each heat-treating unit HE has a plate of the same type as plate 21, the plate of each heat-treating unit HE will be written "plate 21".

Reference is made to FIGS. 3 through 5 and 7. Each heat-treating unit HA has a plate 21, a chamber 23 and a shutter 24. The heat-treating plate 21 holds a wafer W. The plate 21 has, mounted inside or outside, a temperature control device (e.g. a heat-generating device such as a heater or a heat-absorbing device such as a heatsink) for adjusting temperature of the plate 21. The plate 21 adjusts the wafer W to a predetermined temperature (that is, it performs heat treatment) by giving heat to the wafer W on the plate 21, or taking heat away from the wafer W on the plate 21. The chamber 23 houses the plate 21. The chamber 23 has a substrate transport opening 23a formed in a surface of the chamber 23. The substrate transport opening 23a is disposed in a position opposed to the transport mechanism TA. In other words, the substrate transport opening 23a is disposed in a position communicating with the transporting space AA. The shutter 24 opens and closes the substrate transport opening 23a. In FIG. 7, the chambers 23 of the heat-treating units HAR are closed, while the chambers 23 of the heat-treating units HAL are opened.

Each receiver PA has a plate 26 for receiving a wafer W. The plate 26 is installed on a rack 27. The plate 26 is not closed in a chamber or the like, but basically is open in horizontal directions (in the fore-and-aft direction X and transverse direction Y). The receiver PA is therefore easily accessible to not only the transport mechanism TA but the indexer's transport mechanism 13 and the transport mechanism TB.

Each transport mechanism TA has a guide shaft 31, a drive mechanism 32 and a pair of hands 33. The guide shaft 31 extends in the up-down direction Z. The drive mechanism 32 is attached to the guide shaft 31. The drive mechanism 32 is movable up and down along the guide shaft 31 and is rotatable about the guide shaft 31. Further, the drive mechanism 32 horizontally movable (extendible and contractible) toward and away from the guide shaft 31. For example, the drive mechanism 32 may have a flexible link mechanism (not shown). The pair of hands 33 are attached to the drive mechanism 32. Each hand 33 holds one wafer W in a horizontal position.

<Construction of Each Element of Front Relay Block BB>

Reference is made to FIGS. 3 through 5 and 8. The receivers PB have substantially the same construction as the receivers PA. That is, each receiver PB has a plate 26 mounted on a rack 27.

The transport mechanisms TB have substantially the same construction as the transport mechanisms TA. That is, each transport mechanism TB has a guide shaft 31, a drive mechanism 32 and hands 33.

<Construction of Each Element of Solution Treating Block BC>

Reference is made to FIGS. 3 through 5 and 9. The solution treating units SC1 and SC2 perform coating treatment of wafers W. The solution treating units SC1 and SC2 have substantially the same construction. Specifically, each of the solution treating units SC1 and SC2 has a spin holder 41, a cup 42, a nozzle 43, a chamber 44 and a shutter 45. The spin holder 41 rotatably holds a wafer W. The cup 42 is formed around the spin holder 41 to collect a treating solution scattered. The nozzle 43 discharges a coating film material as the treating solution to the wafer W. The coating film material is a resist film material, for example. The nozzle 43 is movable between a treating position above the spin holder 41 and a withdrawn position away from above the cup 42. The chamber 44 houses the spin holder 41, cup 42 and nozzle 43. The chamber 44 has a substrate transport opening 44a formed in a surface of the chamber 44. The substrate transport opening 44a of the solution treating unit SC1 is disposed in a position opposed to the transport mechanism TC1. In other words, the substrate transport opening 44a of the solution treating unit SC1 is disposed in a position communicating with the divided transporting space AC1. Similarly, the substrate transport opening 44a of each solution treating unit SC2 is disposed in a position opposed to the transport mechanism TC2. The shutter 45 opens and closes the substrate transport opening 44a. In FIG. 9, the chambers 44 of the solution treating units SC1 are closed, while the chambers 44 of the solution treating units SC2 are opened.

The solution treating units SC3 and SC4 perform developing treatment of wafers W. The solution treating units SC3 and SC4 have substantially the same construction. Each of the solution treating units SC3 and SC4 has a spin holder 51, a cup 52, a nozzle 53, a chamber 54 and a shutter 55. The spin holder 51 rotatably holds a wafer W. The cup 52 is formed around the spin holder 51 to collect a treating solution scattered. The nozzle 53 discharges a developer (treating solution) to the wafer W. The nozzle 53 is movable between a treating position above the spin holder 51 and a withdrawn position away from above the cup 52. The chamber 54 houses the spin holder 51, cup 52 and nozzle 53. The chamber 54 has a substrate transport opening 54a formed in a surface of the chamber 54. The substrate transport opening 54a of the solution treating unit SC3 is disposed in a position opposed to the transport mechanism TC3. The substrate transport opening 54a of the solution treating unit SC4 is disposed in a position opposed to the transport mechanism TC4. The shutter 55 opens and closes the substrate transport opening 54a. In FIG. 9, the chambers 54 of the solution treating units SC3 are closed, while the chambers 54 of the solution treating units SC4 are opened.

Each transport mechanism TC has a drive mechanism 61 and a pair of hands 62. The drive mechanism 61 is mounted on the shielding plate 40, for example. The hands 62 are attached to the drive mechanism 61. The drive mechanism 61 moves each hand 62 in various directions X, Y and Z, and rotates each hand 62 about the up-down direction Z. Each hand 62 holds a wafer W.

<Construction of Each Element of Rear Relay Block BD>

Reference is made to FIGS. 3 through 5 and 10. The receivers PD have substantially the same construction as the receivers PA. That is, each receiver PD has a plate 26 mounted on a rack 27.

The transport mechanisms TD have substantially the same construction as the transport mechanisms TA. That is, each transport mechanism TD has a guide shaft 31, a drive mechanism 32 and hands 33.

<Construction of Each Element of Rear Heat-Treating Block BE>

Reference is made to FIGS. 3 through 5 and 11. The heat-treating units HE have substantially the same construction as the heat-treating units HA. That is, each heat-treating unit HE has a plate 21, a chamber 23 and a shutter 24.

The receivers PE have substantially the same construction as the receivers PA. That is, each receiver PE has a plate 26 mounted on a rack 27.

The transport mechanisms TE have substantially the same construction as the transport mechanisms TA. That is, each transport mechanism TE has a guide shaft 31, a drive mechanism 32 and hands 33.

<Block Coupling Structure>

Reference is made to FIGS. 3 through 5 and 7 through 11. The front heat-treating block BA further includes a frame FA. The frame FA supports the heat-treating units HA, transport mechanisms TA and receivers PA. The frame FA is substantially box-shaped, and houses the heat-treating units HA, receivers PA and transport mechanisms TA. The frame FA has apertures 17fa for opening the receivers PA forward XF of the treating section 17 (see FIG. 1B). Further, the frame FA has apertures (not shown) for opening the receivers PA to the front relay block BB.

Similarly, the other blocks BB, BC, BD and BE have frames FB, FC, FD and FE, respectively. The frames FB-FE support the treating units, receivers and transport mechanisms of the blocks BB-BE, respectively. The frames FB-FE are substantially box-shaped, and houses the elements of the blocks BB-BE. Each of the frames FB, FC, FD and FE has apertures (not shown) for opening the receivers PB, PD and PE to the adjoining blocks. Further, the frame FE has apertures 17ba for opening the receivers PE backward XB of the treating section 17 (see FIG. 1C).

A connection between the blocks BA-BB is realized by coupling the frames FA-FB. Connections between the blocks BB-BC, BC-BD and BD-BE are realized by coupling the frames FB-FC, FC-FD and FD-FE, respectively.

When manufacturing the substrate treating apparatus 1, the block BA is assembled first. For example, the heat-treating units HA, transport mechanisms TA and receivers PA are mounted in the frame FA. Similarly, the blocks BB, BC, BD and BE are assembled separately. Then, the blocks BA, BB, BC, BD and BE are connected together, and the indexer section 11 is connected to the block BA.

<Construction of Control System>

Figure 13:
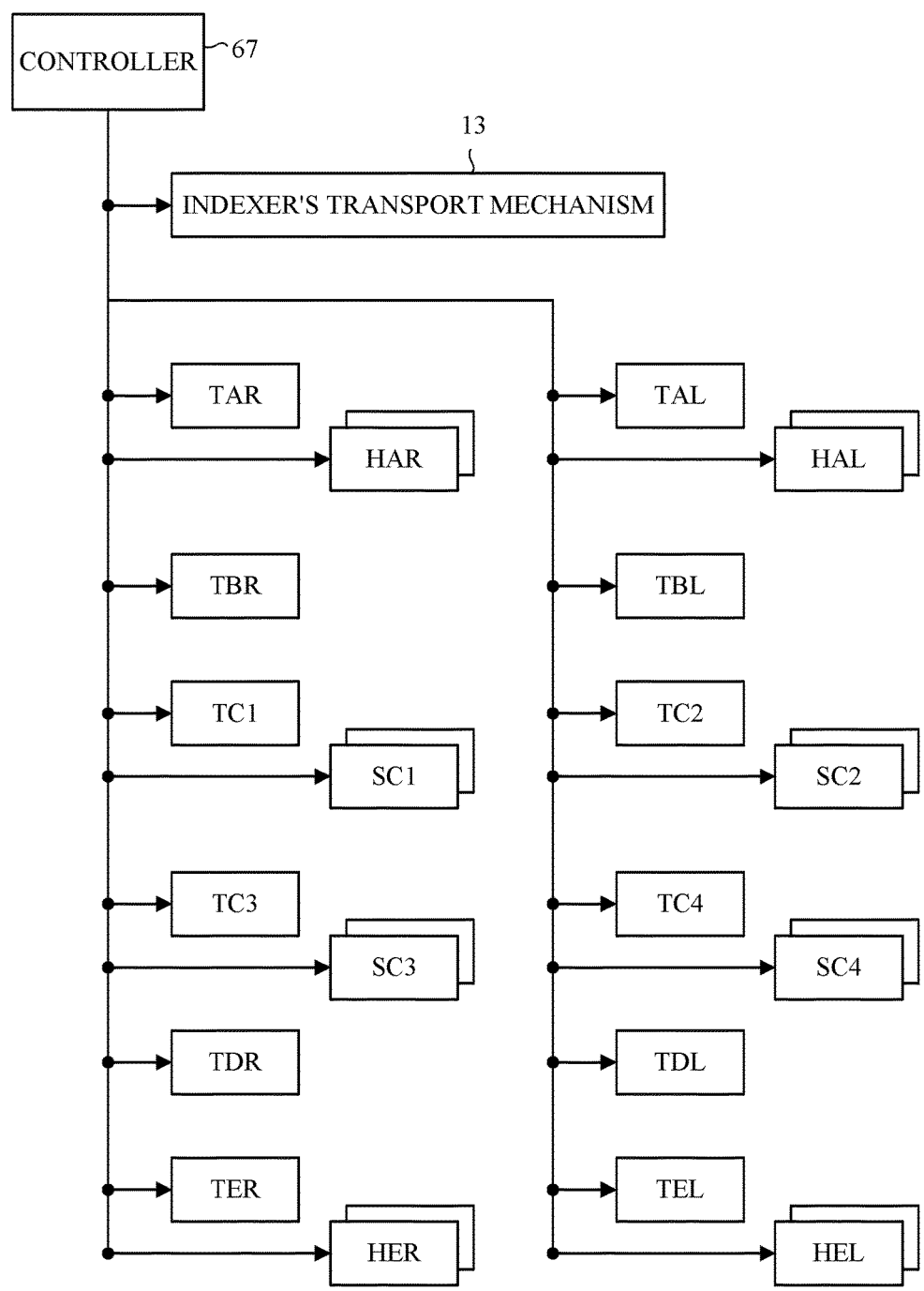
FIG. 13 is a control block diagram of the substrate treating apparatus according to Embodiment 1.

FIG. 13 is a control block diagram of the substrate treating apparatus 1. The substrate treating apparatus 1 further includes a controller 67.

The controller 67 is installed in the treating section 17, for example. The controller 67 performs overall control of the indexer section 11 and treating section 17. Specifically, the controller 67 controls operation of the indexer's transport mechanism 13 in the indexer section 11, and operation of each transport mechanism provided for the blocks BA-BE and each treating unit provided for the blocks BA, BC and BE.

The controller 67 is realized by a central processing unit (CPU) which performs various processes, a RAM (Random-Access Memory) which provides a working space for arithmetic processing, and a storage medium such as a fixed disk. The storage medium stores various information such as treatment recipes (processing programs) for treating wafers W and information for identifying each wafer W.

<Example of Treatment the Treating Section 17 Performs on Wafers W>

Figure 14:
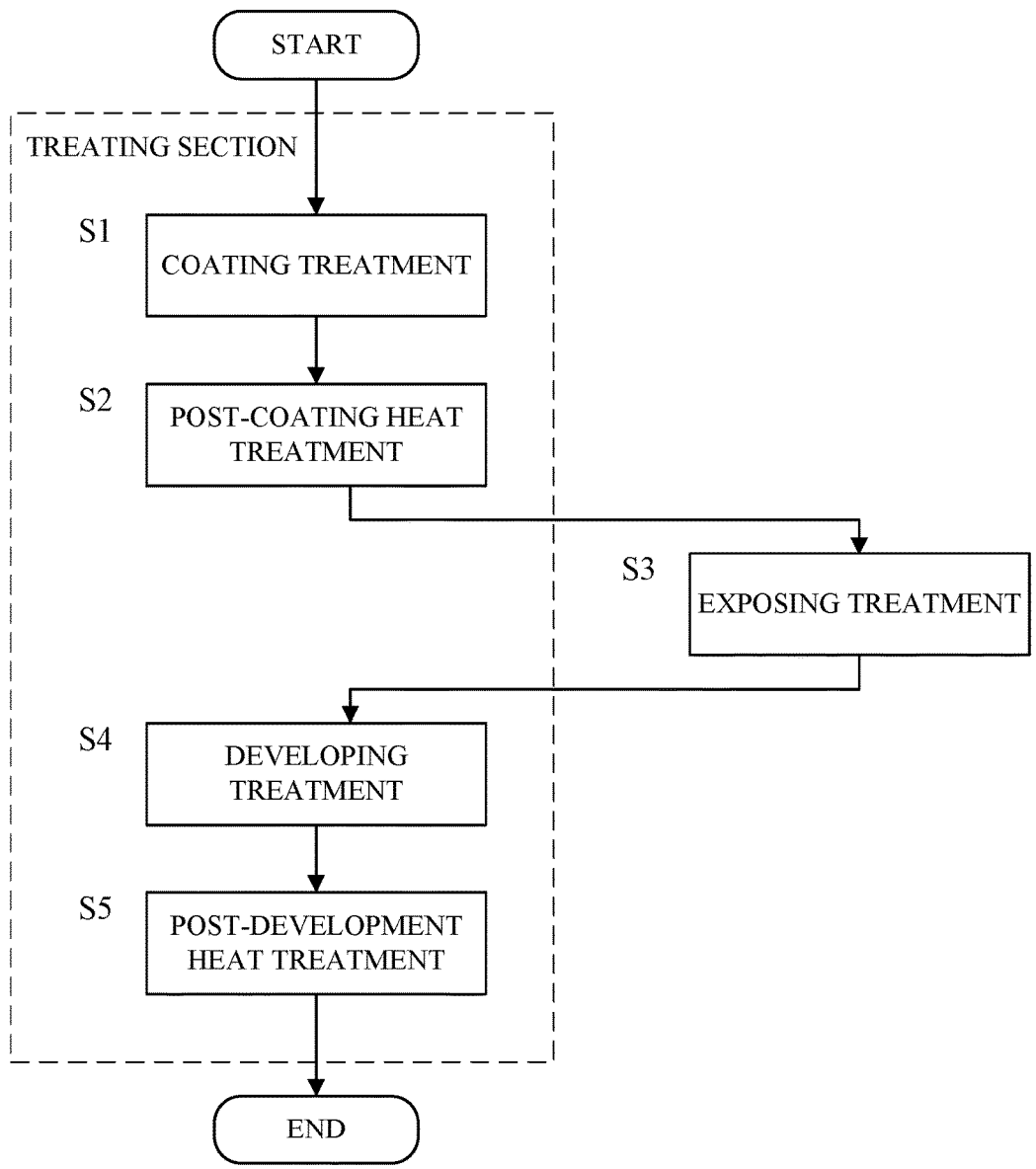
FIG. 14 is a flow chart illustrating an example of procedure for treating substrates.

FIG. 14 is a flow chart illustrating an example of procedure for treating wafers W.

The treating section 17 gives the wafers W coating treatment, post-coating heat treatment, developing treatment and post-development heat treatment in this order, for example. During this process, the exposing machine EXP performs exposing treatment of the wafers W after the post-coating heat treatment and before the developing treatment. The post-coating heat treatment is heat treatment carried out following the coating treatment. The post-development heat treatment is heat treatment carried out following the developing treatment. The post-coating heat treatment and post-development heat treatment are each an example of post-solution treatment heat treatment in this invention.

The treating section 17 can perform the above-noted series of treatments of the wafers W both when the front face 17f of the treating section 17 is connected to the indexer section 11 and when the rear face 17b of the treating section 17 is connected to the indexer section 11. That is, the treatment the treating section 17 performs on the wafers W when the front face 17f of the treating section 17 is connected to the indexer section 11 is the same as when the rear face 17b of the treating section 17 is connected to the indexer section 11.

Description will be made hereinafter of two examples of operation when the front face 17f is connected to the indexer section 11, and two examples of operation when the rear face 17b is connected to the indexer section 11.

<Example of Operation 1 of Substrate Treating Apparatus 1>

Figure 15:
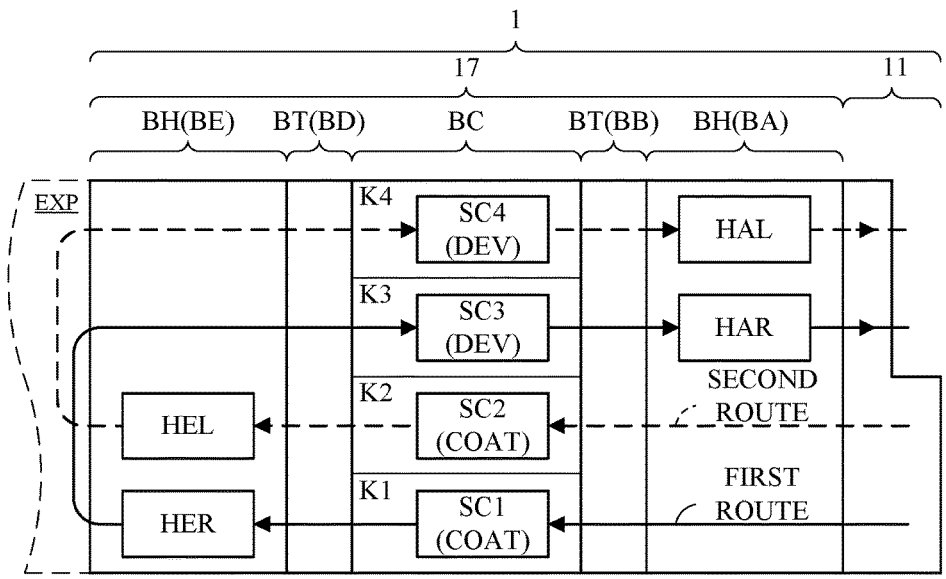
FIG. 15 is a conceptual diagram schematically showing how the substrates move between the blocks in example of operation 1.
Figure 16:
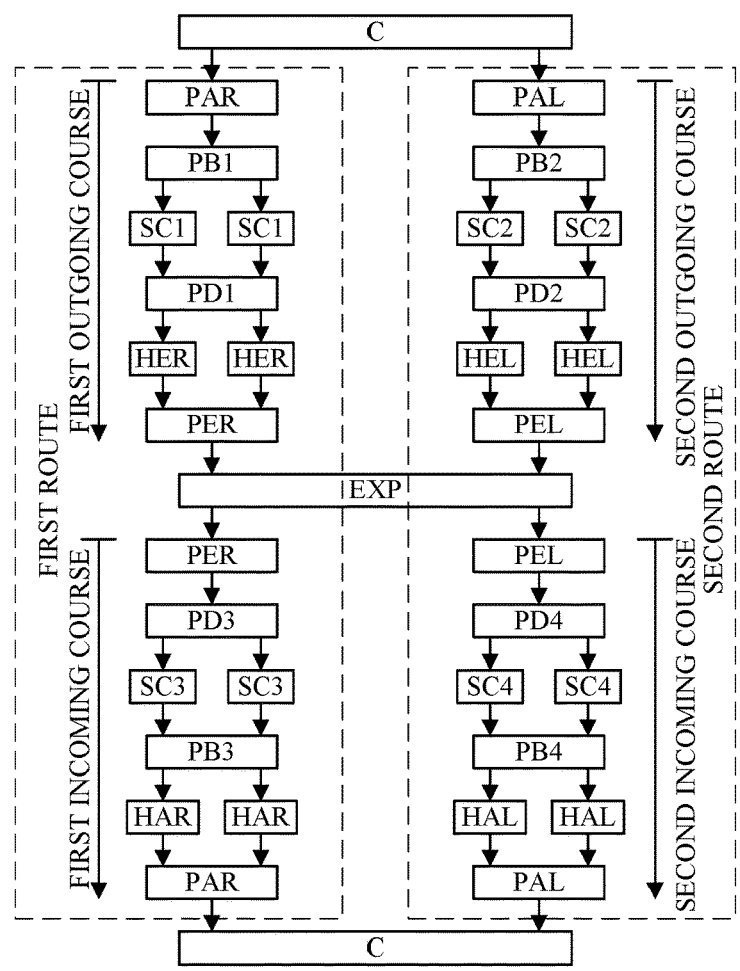
FIG. 16 is a view showing substrate transport routes in example of operation 1.

Example of operation 1 is an example of operation when the front face 17f is connected to the indexer section 11. FIG. 15 is a conceptual diagram schematically showing how, in example of operation 1, wafers W move between the blocks BA-BE. In FIG. 15, for expediency of description, the solution treating units SC1 and SC2 are affixed with "COAT" which means the coating treatment, and the solution treating units SC3 and SC4 with "DEV" which means the developing treatment. FIG. 16 is a view showing transport routes of the wafers W in example of operation 1.

In example of operation 1, as shown in FIGS. 15 and 16, part of the wafers W are transported along a first route, and the other wafers W are transported along a second route different from the first route.

Reference is made to FIG. 16. The first route includes a first outgoing course and a first incoming course. The second route includes a second outgoing course and a second incoming course. The first outgoing course and second outgoing course are routes taken after the wafers W enter the treating section 17 from the indexer section 11 until they leave the treating section 17 for the exposing machine EXP. The first incoming course and second incoming course are routes taken after the wafers W enter the treating section 17 from the exposing machine EXP until they leave the treating section 17 for the indexer section 11.

Example of operation 1 will be described hereinafter as divided into operation of each of the indexer section 11, treating section 17 and exposing machine EXP.

[Operation of Indexer Section 11 (Feeding of Wafers W)]

The indexer's transport mechanism 13 takes one wafer W out of a carrier C, and places the wafer W on the receiver PAR. Then, the indexer's transport mechanism 13 takes one wafer W out of the carrier C, and places the wafer W on the receiver PAL. Subsequently, the indexer's transport mechanism 13 again transports a wafer W from the carrier C to the receiver PAR. In this way, the indexer's transport mechanism 13 transports one wafer W at a time alternately to the receiver PAR and receiver PAL.

[Operation of Treating Section 17 (Outgoing Course)]

Since operation relating to the first outgoing course and operation relating to the second outgoing course are similar, the operation relating to the first outgoing course will be described for expediency. The operation relating to the second outgoing course will correspond, in the following description, to the transport mechanisms TBR, TC1 and TER read as the transport mechanisms TBL, TC2 and TEL, respectively, the receivers PAR, PB1, PD1 and PER read as the receivers PAL, PB2, PD2 and PEL, respectively, and the treating units SC1 and HER read as the treating units SC2 and HEL.

The transport mechanism TBR picks up the wafer W on the receiver PAR, and transports the wafer W to the receiver PB1. The transport mechanism TC1 picks up the wafer W on the receiver PB1, and transports the wafer W to one of the solution treating units SC1. Here, the transport mechanism TC1 transports wafers W alternately to the two solution treating units SC1.

When the transport mechanism TC1 transports the wafer W to each solution treating unit SC1, the shutter 45 temporarily opens the substrate transport opening 44a. This permits the hand 62 to advance into the chamber 44. After the hand 62 withdraws out of the chamber 44, the shutter 45 closes the substrate transport opening 44a again. Consequently, the solution treating unit SC1 performs solution treatment in a state that the chamber 44 is closed.

The solution treating unit SC1 applies the film material to the wafer W (step S1). Specifically, the spin holder 41 holds the wafer W. The nozzle 43 moves from the withdrawn position to the treating position. The spin holder 41 spins the wafer W and the nozzle 43 discharges the film material. The film material is applied to the surface of the wafer W. Part of the film material is scattered from the wafer W to be collected by the cup 42.

After the coating treatment is completed, the transport mechanism TC1 unloads the wafer W from the solution treating unit SC1. At this time also, the chamber 44 is opened to the divided transporting space AC1. Then, the transport mechanism TC1 transports the wafer W to the receiver PD1.

The transport mechanism TC1 may, in a state of holding a wafer W to be treated which has been taken from the receiver PB1, unload a treated wafer W from the solution treating unit SC1, and subsequently load the wafer W to be treated into the solution treating unit SC1.

The transport mechanism TER takes the wafer W from the receiver PD1, and transports it to one of the heat-treating units HER. Here, the transport mechanism TER transports wafers W alternately to the two heat-treating units HER. When the transport mechanism TER transports a wafer W to each heat-treating unit HER, the shutter 24 temporarily opens the substrate transport opening 23a. This permits the hand 33 of the transport mechanism TER to advance into the chamber 23. After the hand 33 withdraws out of the chamber 23, the shutter 24 closes the substrate transport opening 23a again. Consequently, the heat-treating unit HER performs heat treatment in a state that the chamber 23 is closed.

The heat-treating unit HER performs post-coating heat treatment of the wafer W (step S2).

After the post-coating heat treatment is completed, the transport mechanism TER unloads the wafer W from the heat-treating unit HER. At this time also, the chamber 23 is opened to the transporting space AE. Then, the transport mechanism TER transports the wafer W to the receiver PER.

The above is the operation relating to the first outgoing course. The operation relating to the first outgoing course and the operation relating to the second outgoing course may be carried out in parallel.

[Operation of Exposing Machine EXP]

Wafers W on the receiver PER and receiver PEL are transported to the exposing machine EXP. The exposing machine EXP performs exposing treatment of the wafers W (step S3). After the exposing treatment is completed, the wafers W are transported from the exposing machine EXP to the receiver PER and receiver PEL.

[Operation of Treating Section 17 (Incoming Course)]

Since operation relating to the first incoming course and operation relating to the second incoming course are similar, the operation relating to the first incoming course will be described for expediency. The operation relating to the second incoming course will correspond, in the following description, to the transport mechanisms TAR, TC3 and TDR read as the transport mechanisms TAL, TC4 and TDL, respectively, the receivers PAR, PB3, PD3 and PER read as the receivers PAL, PB4, PD4 and PEL, respectively, and the treating units SC3 and HAR read as the treating units SC4 and HAL, The transport mechanism TDR transports the wafer W from the receiver PER to the receiver PD3. The transport mechanism TC3 transports the wafer W from the receiver PD3 to one of the solution treating units SC3. Here, the transport mechanism TC3 transports wafers W alternately to the two solution treating units SC3.

When the transport mechanism TC3 transports the wafer W to each solution treating unit SC3, the shutter 55 temporarily opens the substrate transport opening 54a.

The solution treating unit SC3 supplies the developer to the wafer W (step S4). Specifically, the spin holder 51 holds the wafer W. The nozzle 53 moves from the withdrawn position to the treating position. The nozzle 53 discharges the developer. The developer covers the surface of the wafer W. At this time, the spin holder 51 may spin the wafer W. Upon lapse of a predetermined time, the developer is removed from the wafer W. For example, the spin holder 51 may spin the wafer W to scatter the developer from the wafer W. Alternatively, a nozzle (not shown) other than the nozzle 53 may supply a cleaning liquid to the wafer W to replace the developer on the wafer W with the cleaning liquid. The developer and the like are collected by the cup 52.

After the developing treatment is completed, the transport mechanism TC3 unloads the wafer W from the solution treating unit SC3. At this time also, the chamber 54 is opened to the divided transporting space AC3. Then, the transport mechanism TC3 transports the wafer W to the receiver PB3.

The transport mechanism TAR transports the wafer W from the receiver PB3 to one of the heat-treating units HAR. Here, the transport mechanism TAR transports wafers W alternately to the two heat-treating units HAR. When the transport mechanism TAR transports a wafer W to each heat-treating unit HAR, the shutter 24 opens and closes the chamber 23 of the heat-treating unit HAR.

The heat-treating unit HAR performs post-development heat treatment of the wafer W (step S5).

After the post-development heat treatment is completed, the transport mechanism TAR unloads the wafer W from the heat-treating unit HAR. At this time also, the chamber 23 is opened to the transporting space AA. Then, the transport mechanism TAR transports the wafer W to the receiver PAR.

The above is the operation relating to the first incoming course. The operation relating to the first incoming course and the operation relating to the second incoming course may be carried out in parallel.

[Operation of Indexer Section 11 (Collection of Wafers W)]

The indexer's transport mechanism 13 transports a wafer W from the receiver PAR to a carrier C. Then, the indexer's transport mechanism 13 transports a wafer W from the receiver PAL to the carrier C. Subsequently, the indexer's transport mechanism 13 transports a wafer W from the receiver PAR to the carrier C again. Thus, the indexer's transport mechanism 13 unloads one wafer W at a time alternately from the receiver PAR and receiver PAL.

The indexer's transport mechanism 13, following the operation to take the wafer W from the receiver PAR, may place a different wafer W on the receiver PAR. Similarly, the indexer's transport mechanism 13, following the operation to take the wafer W from the receiver PAL, may place a different wafer W on the receiver PAL.

<Example of Operation 2 of Substrate Treating Apparatus 1>

Figure 17:
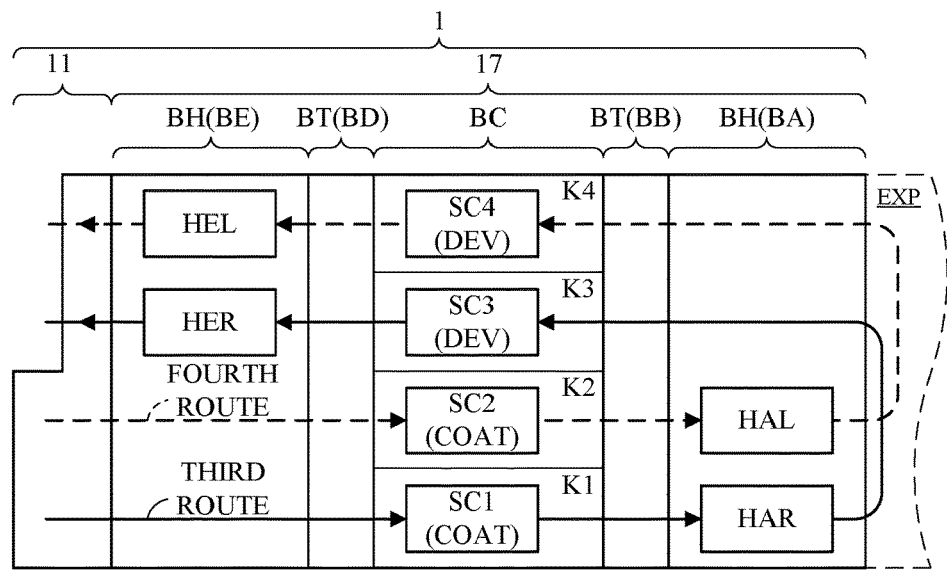
FIG. 17 is a conceptual diagram schematically showing how the substrates move between the blocks in example of operation 2.
Figure 18:
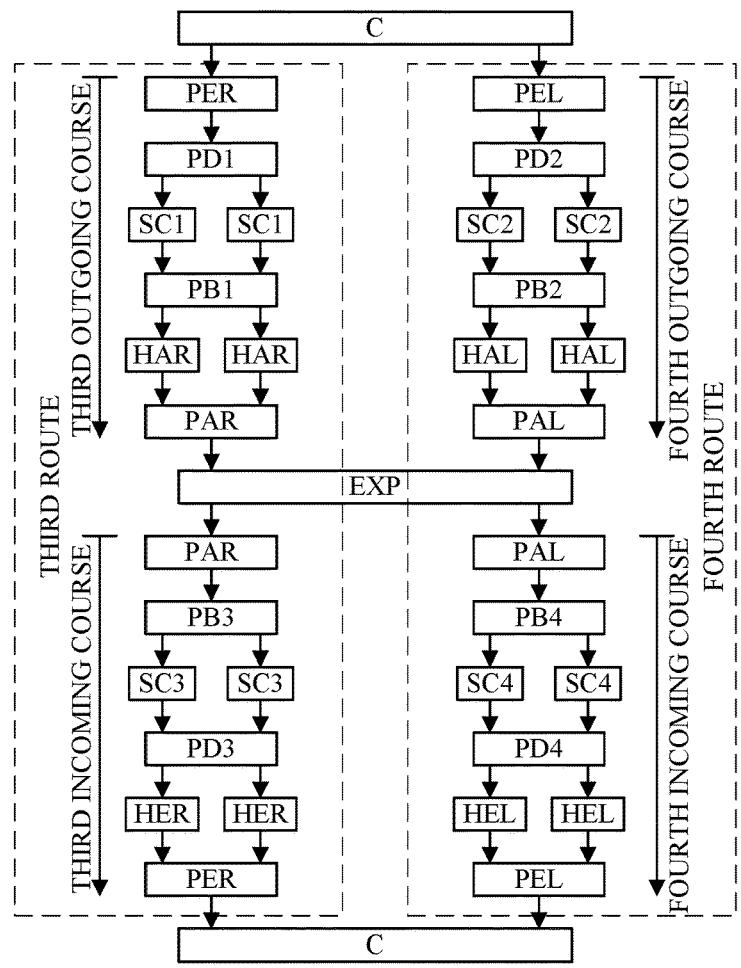
FIG. 18 is a view showing substrate transport routes in example of operation 2.

Example of operation 2 is an example of operation when the rear face 17*b* is connected to the indexer section 11. FIG. 17 is a conceptual diagram schematically showing how, in example of operation 2, wafers W move between the blocks BA-BE. FIG. 18 is a view showing transport routes of wafers W in example of operation 2.

In example of operation 2, as shown in FIGS. 17 and 18, part of the wafers W are transported along a third route, and the other wafers W are transported along a fourth route different from the third route. The third route includes a third outgoing course and a third incoming course. The fourth route includes a fourth outgoing course and a fourth incoming course.

Example of operation 2 will be described hereinafter as divided into operation of each of the indexer section 11, treating section 17 and exposing machine EXP. Description of the operations common to those in example of operation 1 will be omitted as appropriate.

[Operation of Indexer Section 11 (Feeding of Wafers W)]

The indexer's transport mechanism 13 transports wafers W from the carrier C to the receivers PER and PEL.

[Operation of Treating Section 17 (Outgoing Course)]

Since operation relating to the third outgoing course and operation relating to the fourth outgoing course are similar, the operation relating to the third outgoing course will be described for expediency.

The transport mechanism TDR transports a wafer W from the receiver PER to the receiver PD1. The transport mechanism TC1 transports the wafer W from the receiver PD1 to one of the solution treating units SC1.

The solution treating unit SC1 applies the coating film material to the wafer W (step S1).

After the coating treatment is completed, the transport mechanism TC1 transports the wafer W from the solution treating unit SC1 to the receiver PB1. The transport mechanism TAR transports the wafer W from the receiver PB1 to one of the heat-treating units HAR.

The heat-treating unit HAR performs post-coating heat treatment of the wafer W (step S2).

After the post-coating heat treatment is completed, the transport mechanism TAR transports the wafer W from the heat-treating unit HAR to the receiver PAR.

[Operation of Exposing Machine EXP]

Wafers W are transported from the receivers PAR and PAL to the exposing machine EXP. The exposing machine EXP performs exposing treatment of the wafers W (step S3). After the exposing treatment is completed, the wafers W are transported from the exposing machine EXP to the receivers PAR and PAL.

[Operation of Treating Section 17 (Incoming Course)]

Since operation relating to the third incoming course and operation relating to the fourth incoming course are similar, the operation relating to the third incoming course will be described for expediency.

The transport mechanism TBR transports the wafer W from the receiver PAR to the receiver PB3. The transport mechanism TC3 transports the wafer W from the receiver PB3 to one of the solution treating units SC3.

The solution treating unit SC3 supplies the developer to the wafer W (step S4).

After the developing treatment is completed, the transport mechanism TC3 transports the wafer W from the solution treating unit SC3 to the receiver PD3. The transport mechanism TER transports the wafer W from the receiver PD3 to one of the heat-treating units HER.

The heat-treating unit HER performs post-development heat treatment of the wafer W (step S5).

After the post-development heat treatment is completed, the transport mechanism TER transports the wafer W from the heat-treating unit HER to the receiver PER.

[Operation of Indexer Section 11 (Collection of Wafers W)]

The indexer's transport mechanism 13 transports wafers W from the receivers PER and PEL to a carrier C.

<Example of Operation 3 of Substrate Treating Apparatus 1>

Figure 19:
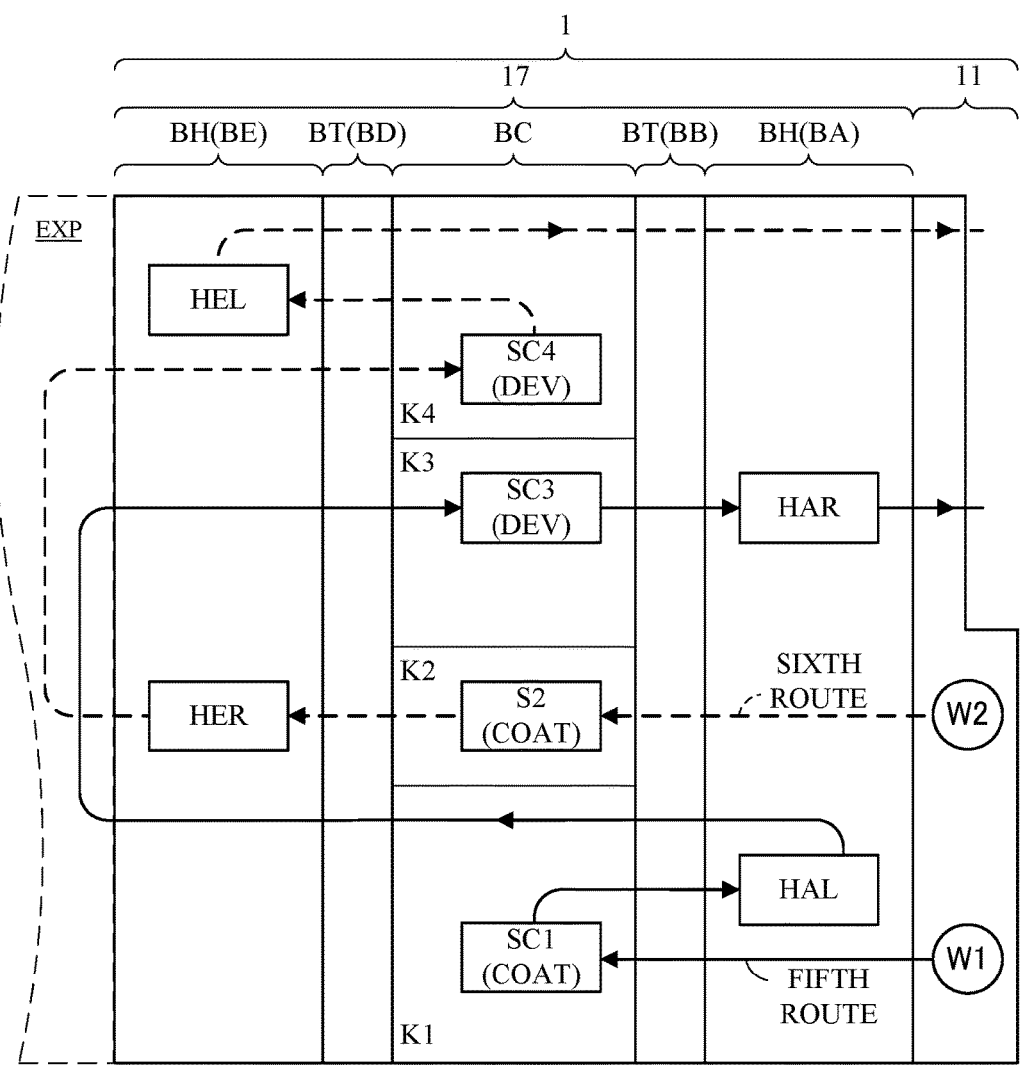
FIG. 19 is a conceptual diagram schematically showing how the substrates move between the blocks in example of operation 3.
Figure 20:
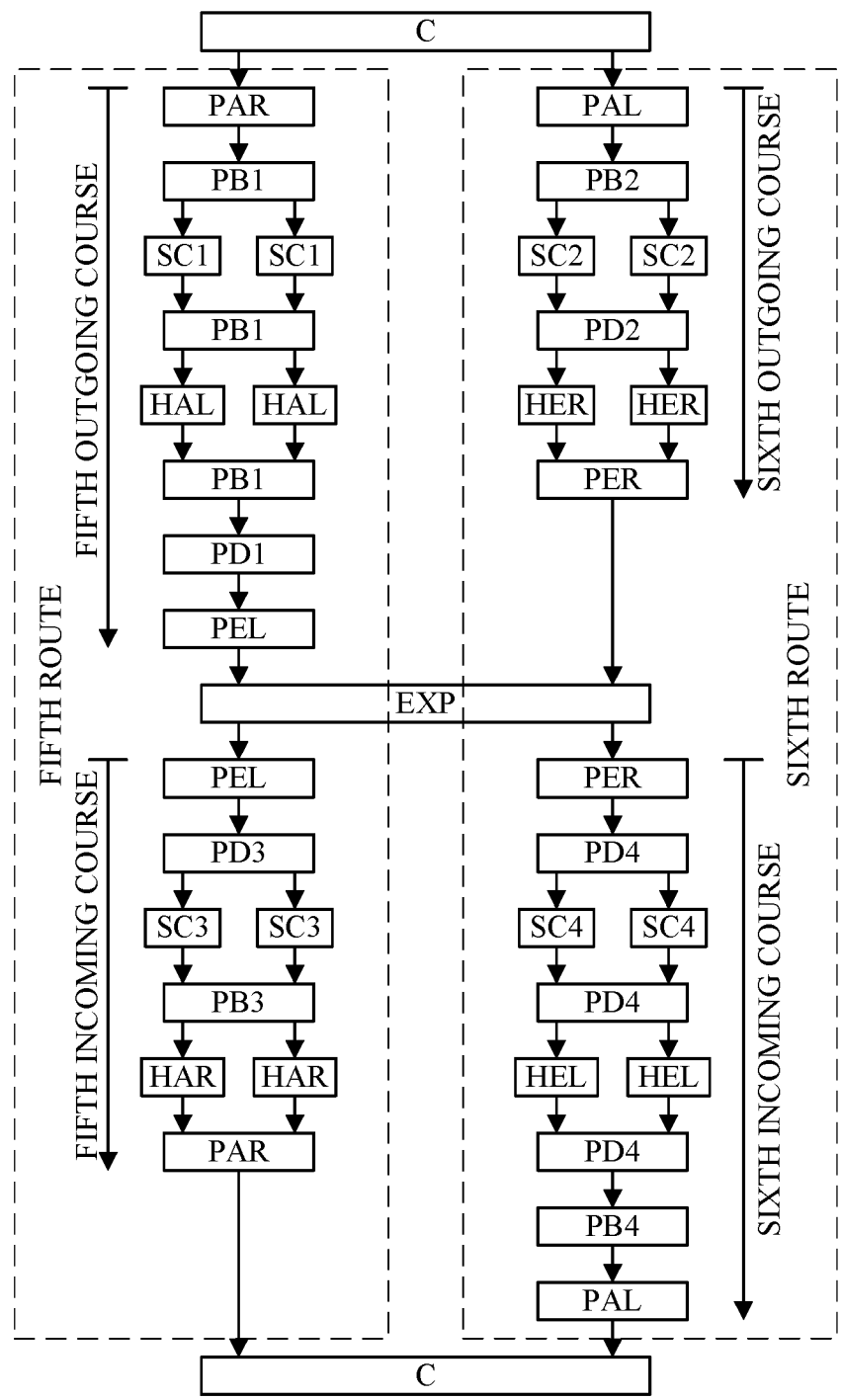
FIG. 20 is a view showing substrate transport routes in example of operation 3.

Example of operation 3 is an example of operation when the front face 17*f* is connected to the indexer section 11. FIG. 19 is a conceptual diagram schematically showing how, in example of operation 3, wafers W move between the blocks BA-BE. FIG. 20 is a view showing transport routes of wafers W in example of operation 3.

In example of operation 3, as shown in FIGS. 19 and 20, part of the wafers W are transported along a fifth route, and the other wafers W are transported along a sixth route different from the fifth route. The fifth route includes a fifth outgoing course and a fifth incoming course. The sixth route includes a sixth outgoing course and a sixth incoming course. For expediency of description, each wafer W transported along the fifth route will be written "wafer W1", and each wafer W transported along the sixth route "wafer W2".

Example of operation 3 will be described hereinafter as divided into operation of each of the indexer section 11, treating section 17 and exposing machine EXP. Description of the operations common to those in examples of operation 1 and 2 will be omitted as appropriate.

[Operation of Indexer Section 11 (Feeding of Wafers W)]

The indexer's transport mechanism 13 transports a wafer W1 from a carrier C to the receiver PAR, and transports a wafer W2 from the carrier C to the receiver PAL.

[Operation of Treating Section 17 (Outgoing Course)]

The transport mechanism TBR transports the wafer W1 from the receiver PAR to the receiver PB1. The transport mechanism TC1 transports the wafer W1 from the receiver PB1 to one of the solution treating units SC1. The solution treating unit SC1 performs coating treatment of the wafer W1 (step S1). Similarly, the transport mechanism TBL transports the wafer W2 from the receiver PAL to the receiver PB2. The transport mechanism TC2 transports the wafer W2 from the receiver PB2 to one of the solution treating units SC2. The solution treating unit SC2 performs coating treatment of the wafer W2 (step S1).

After the coating treatment is completed, the wafer W1 is transported to the front heat-treating block BA, and the wafer W2 to the rear heat-treating block BE. Consequently, the front heat-treating block BA performs post-coating heat treatment of the wafer W1, and the rear heat-treating block BE post-coating heat treatment of the wafer W2.

Specifically, the transport mechanism TC1 transports the wafer W1 from the solution treating unit SC1 to the receiver PB1. The transport mechanism TAL transports the wafer W1 from the receiver PB1 to one of the heat-treating units HAL. The heat-treating unit HAL performs post-coating heat treatment of the wafer W1 (step S2). On the other hand, the transport mechanism TC2 transports the wafer W2 from the solution treating unit SC2 to the receiver PD2. The transport mechanism TER transports the wafer W2 from the receiver PD2 to one of the heat-treating units HER. The heat-treating unit HER performs post-coating heat treatment of the wafer W2 (step S2).

After the post-coating heat treatment is completed, the transport mechanism TAL transports the wafer W1 from the heat-treating unit HAL to the receiver PB1. The transport mechanism TC1 transports the wafer W1 from the receiver PB1 to the receiver PD1. The transport mechanism TEL transports the wafer W1 from the receiver PD1 to the receiver PEL. On the other hand, the transport mechanism TER transports the wafer W2 from the heat treating unit HER to the receiver PER.

[Operation of Exposing Machine EXP]

The wafer W1 is transported from the receiver PEL to the exposing machine EXP. The wafer W2 is transported from the receiver PER to the exposing machine EXP. The wafers W1 and W2 undergo exposing treatment in the exposing machine EXP (step S3). After the exposing treatment is completed, the wafer W1 is transported from the exposing machine EXP to the receiver PEL. The wafer W2 is transported from the exposing machine EXP to the receiver PER.

[Operation of Treating Section 17 (Incoming Course)]

The transport mechanism TDL transports the wafer W1 from the receiver PEL to the receiver PD3. The transport mechanism TC3 transports the wafer W1 from the receiver PD3 to one of the solution treating units SC3. The solution treating unit SC3 performs developing treatment of the wafer W1 (step S4). Similarly, the transport mechanism TDR transports the wafer W2 from the receiver PER to the receiver PD4. The transport mechanism TC4 transports the wafer W2 from the receiver PD4 to one of the solution treating units SC4. The solution treating unit SC4 performs developing treatment of the wafer W2 (step S4).

After the developing treatment is completed, the wafer W1 is transported to the front heat-treating block BA, and the wafer W2 to the rear heat-treating block BE. Consequently, the front heat-treating block BA performs post-development heat treatment of the wafer W1, and the rear heat-treating block BE post-development heat treatment of the wafer W2.

Specifically, the transport mechanism TC3 transports the wafer W1 from the solution treating unit SC3 to the receiver PB3. The transport mechanism TAR transports the wafer W1 from the receiver PB3 to one of the heat-treating units HAR. The heat-treating unit HAR performs post-development heat treatment of the wafer W1 (step S5). On the other hand, the transport mechanism TC4 transports the wafer W2 from the solution treating unit SC4 to the receiver PD4. The transport mechanism TEL transports the wafer W2 from the receiver PD4 to one of the heat-treating units HEL. The heat-treating unit HEL performs post-development heat treatment of the wafer W2 (step S5).

After the post-development heat treatment is completed, the transport mechanism TAR transports the wafer W1 from the heat-treating unit HAR to the receiver PAR. On the other hand, the transport mechanism TEL transports the wafer W2 from the heat-treating unit HEL to the receiver PD4. The transport mechanism TC4 transports the wafer W2 from the receiver PD4 to the receiver PB4. The transport mechanism TAL transports the wafer W2 from the receiver PB4 to the receiver PAL.

[Operation of Indexer Section 11 (Collection of Wafers W]

The indexer's transport mechanism 13 transports the wafer W1 from the receiver PAR to a carrier C. The indexer's transport mechanism 13 transports the wafer W2 from the receiver PAL to the carrier C.

<Example of Operation 4 of Substrate Treating Apparatus 1>

Figure 21:
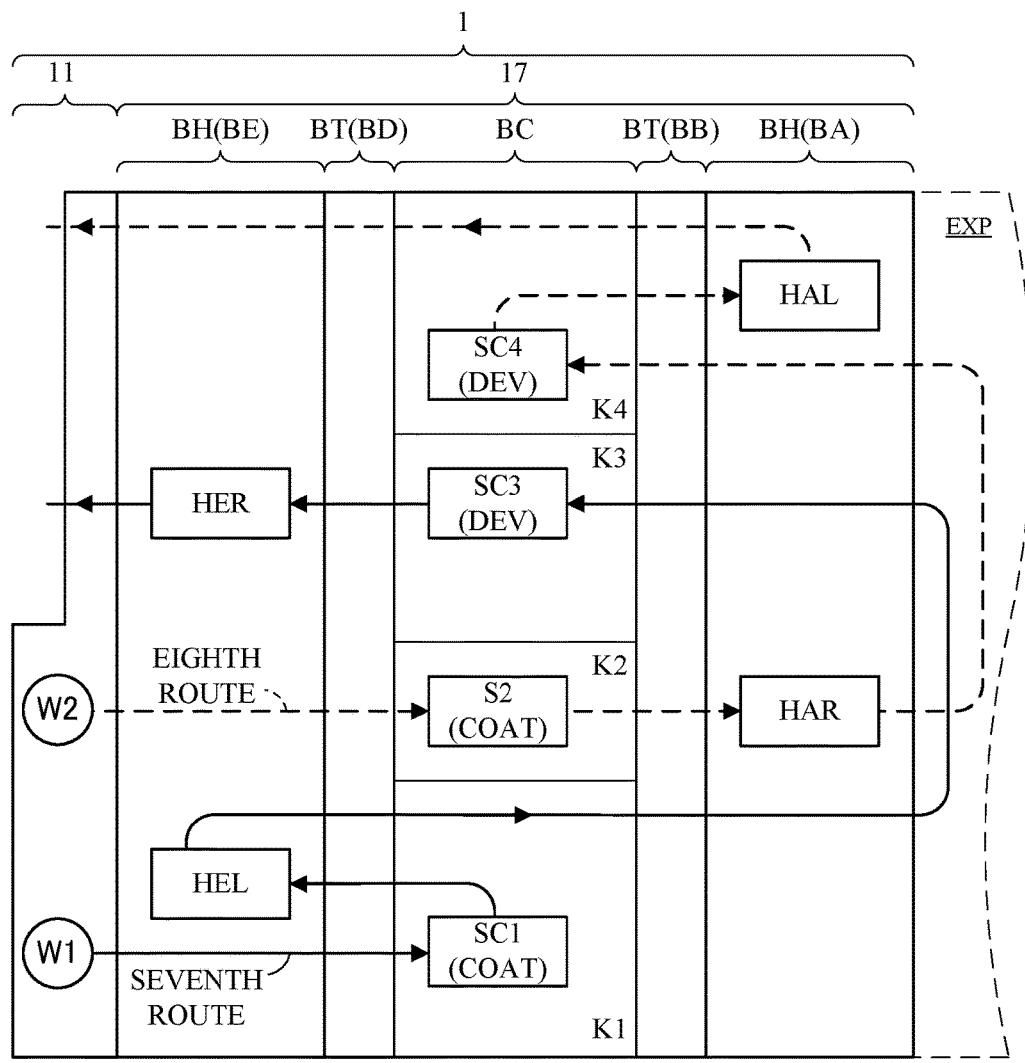
FIG. 21 is a conceptual diagram schematically showing how the substrates move between the blocks in example of operation 4.
Figure 22:
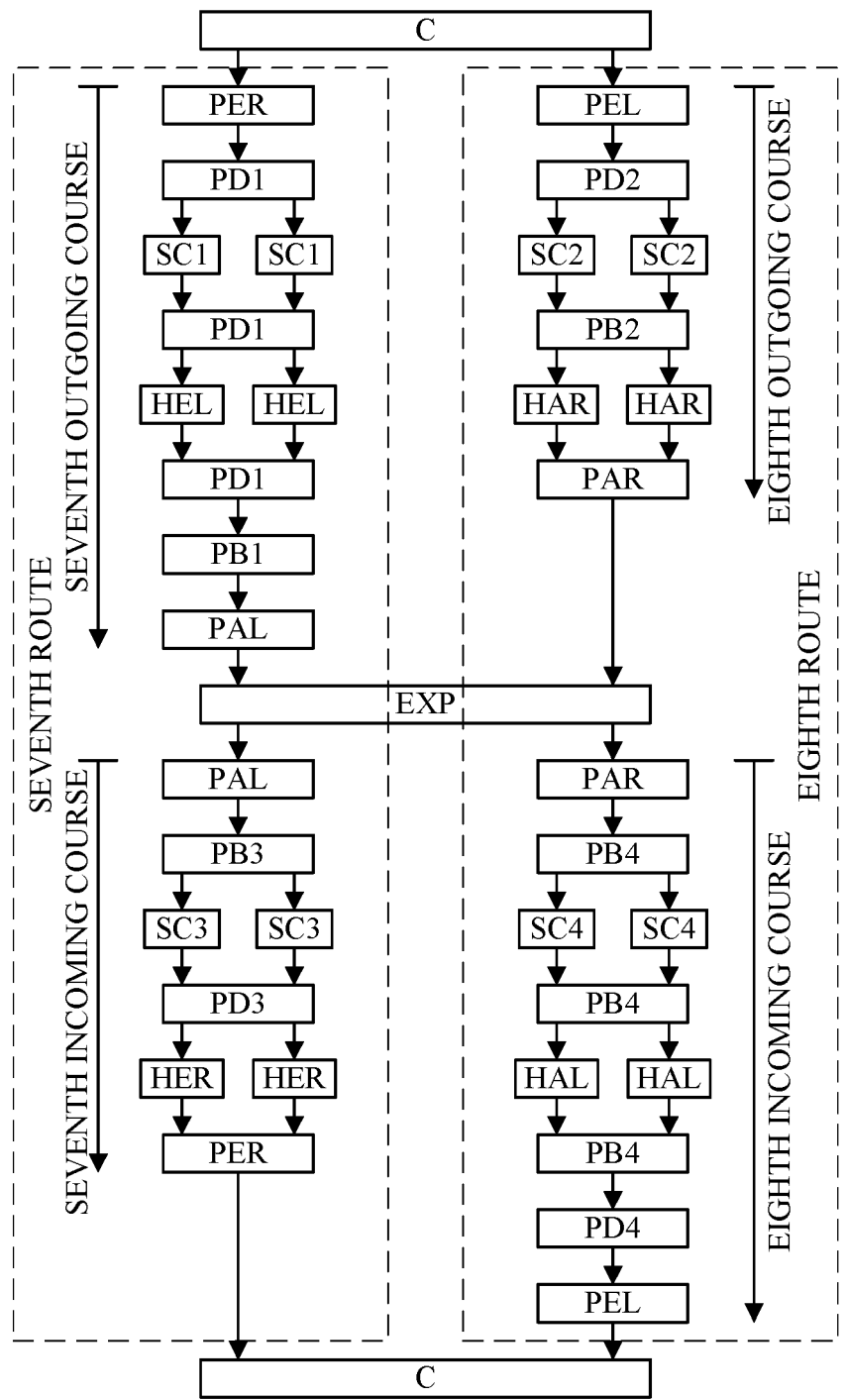
FIG. 22 is a view showing substrate transport routes in example of operation 4.

Example of operation 4 is an example of operation when the rear face 17*b* is connected to the indexer section 11. FIG. 21 is a conceptual diagram schematically showing how, in example of operation 4, wafers W move between the blocks BA-BE. FIG. 22 is a view showing transport routes of wafers W in example of operation 4.

In example of operation 4, as shown in FIGS. 21 and 22, part of the wafers W are transported along a seventh route, and the other wafers W are transported along an eighth route different from the seventh route. The seventh route includes a seventh outgoing course and a seventh incoming course. The eighth route includes an eighth outgoing course and an eighth incoming course. For expediency of description, each wafer W transported along the seventh route will be written "wafer W1", and each wafer W transported along the eighth route "wafer W2".

Example of operation 4 will be described hereinafter as divided into operation of each of the indexer section 11, treating section 17 and exposing machine EXP. Description of the operations common to those in examples of operation 1-3 will be omitted as appropriate.

[Operation of Indexer Section 11 (Feeding of Wafers W)]

The indexer's transport mechanism 13 transports wafers W1 and W2 from the carrier C to the receivers PER and PEL.

[Operation of Treating Section 17 (Outgoing Course)]

The transport mechanism TDR transports the wafer W1 from the receiver PER to the receiver PD1. The transport mechanism TC1 transports the wafer W1 from the receiver PD1 to one of the solution treating units SC1. The solution treating unit SC1 performs coating treatment of the wafer W1 (step S1). Similarly, the transport mechanism TDL transports the wafer W2 from the receiver PEL to the receiver PD2. The transport mechanism TC2 transports the wafer W2 from the receiver PD2 to one of the solution treating units SC2. The solution treating unit SC2 performs coating treatment of the wafer W2 (step S1).

After the coating treatment is completed, the wafer W1 is transported to the rear heat-treating block BE, and the wafer W2 to the front heat-treating block BA. Consequently, the rear heat-treating block BE performs post-coating heat treatment of the wafer W1, and the front heat-treating block BA post-coating heat treatment of the wafer W2.

Specifically, the transport mechanism TC1 transports the wafer W1 from the solution treating unit SC1 to the receiver PD1. The transport mechanism TEL transports the wafer W1 from the receiver PD1 to the heat-treating unit HEL. The heat-treating unit HEL performs post-coating heat treatment of the wafer W1 (step S2). On the other hand, the transport mechanism TC2 transports the wafer W2 from the solution treating unit SC2 to the receiver PB2. The transport mechanism TAR transports the wafer W2 from the receiver PB2 to the heat-treating unit HAR. The heat-treating unit HAR performs post-coating heat treatment of the wafer W2 (step S2).

After the post-coating heat treatment is completed, the transport mechanism TEL transports the wafer W1 from the heat-treating unit HEL to the receiver PD1. The transport mechanism TC1 transports the wafer W1 from the receiver PD1 to the receiver PB1. The transport mechanism TAL transports the wafer W1 from the receiver PB1 to the receiver PAL. On the other hand, the transport mechanism TAR transports the wafer W2 from the heat treating unit HAR to the receiver PAR.

[Operation of Exposing Machine EXP]

The wafers W are transported from the receivers PAR and PAL to the exposing machine EXP to undergo exposing treatment in the exposing machine EXP (step S3). After the exposing treatment is completed, the wafers W are transported from the exposing machine EXP to the receivers PAR and PAL.

[Operation of Treating Section 17 (Incoming Course)]

The transport mechanism TBL transports the wafer W1 from the receiver PAL to the receiver PB3. The transport mechanism TC3 transports the wafer W1 from the receiver PB3 to one of the solution treating units SC3. The solution treating unit SC3 supplies the developer to the wafer W1 (step S4). Similarly, the transport mechanism TBR transports the wafer W2 from the receiver PAR to the receiver PB4. The transport mechanism TC4 transports the wafer W2 from the receiver PB4 to one of the solution treating units SC4. The solution treating unit SC4 supplies the developer to the wafer W2 (step S4).

After the developing treatment is completed, the wafer W1 is transported to the rear heat-treating block BE, and the wafer W2 to the front heat-treating block BA. Consequently, the rear heat-treating block BE performs post-development heat treatment of the wafer W1, and the front heat-treating block BA post-development heat treatment of the wafer W2.

Specifically, the transport mechanism TC3 transports the wafer W1 from the solution treating unit SC3 to the receiver PD3. The transport mechanism TER transports the wafer W1 from the receiver PD3 to one of the heat-treating units HER. The heat-treating unit HER performs post-development heat treatment of the wafer W1 (step S5). On the other hand, the transport mechanism TC4 transports the wafer W2 from the solution treating unit SC4 to the receiver PB4. The transport mechanism TAL transports the wafer W2 from the receiver PB4 to one of the heat-treating units HAL. The heat-treating unit HAL performs post-development heat treatment of the wafer W2 (step S5).

After the post-development heat treatment is completed, the transport mechanism TER transports the wafer W1 from the heat-treating unit HER to the receiver PER. On the other hand, the transport mechanism TAL transports the wafer W2 from the heat-treating unit HAL to the receiver PB4. The transport mechanism TC4 transports the wafer W2 from the receiver PB4 to the receiver PD4. The transport mechanism TEL transports the wafer W2 from the receiver PD4 to the receiver PEL.

[Operation of Indexer Section 11 (Collection of Wafers W]

The indexer's transport mechanism 13 transports the wafers W1 and W2 from the receivers PER and PEL to a carrier C.

<Advantageous Effects of Embodiment 1>

Since both the front face 17f and rear face 17b are connectable to the indexer section 11 as described above, the degree of freedom for arranging the treating section 17 and indexer section 11 can be improved.

Since both the front face 17f and rear face 17b are connectable to the exposing machine EXP, the degree of freedom for arranging the treating section 17 and exposing machine EXP can also be improved.

When the front face 17f of the treating section 17 is connected to the indexer section 11, the treating section 17 performs the series of treatments shown in FIG. 14 (see examples of operation 1 and 3). Also when the rear face 17b of the treating section 17 is connected to the indexer section 11, the treating section 17 performs the series of treatments shown in FIG. 14 (see examples of operation 2 and 4). That is, the treatment which the treating section 17 performs on the wafers W when the front face 17f is connected to the indexer section 11 is the same as when the rear face 17b is connected to the indexer section 11. Thus, the treating section 17 can perform the same treatment of the wafers W whichever of the front face 17f and the rear face 17b may be connected to the indexer section 11. Therefore, even when a change is made to the arrangement of the treating section 17 and indexer section 11, the treatment the treating section performs on the wafers W does not change. The degree of freedom for arranging the treating section 17 and indexer section 11 can be further improved.

As shown in FIGS. 12A-12E, the relative positional relationship of the front face 17f, treating units (H, SC), receivers P and transport mechanisms T is the same as the relative positional relationship of the rear face 17b, treating units (H, SC), receivers P and transport mechanisms T. In other words, the transport conditions relating to the wafers W entering the treating section 17 through the front face 17f and the transport conditions relating to the wafers W entering the treating section 17 through the rear face 17b can be made substantially equal. Here, the transport conditions of the wafers W are transport distances of the wafers W, transport directions of the wafers W and transport times of the wafers W, for example. Therefore, treating quality of the treating section 17 when the front face 17f is connected to the indexer section 11 and treating quality of the treating section 17 when the rear face 17b is connected to the indexer section 11 can conveniently be made equal.

The treating units (H, SC), receivers P and transport mechanisms T are arranged in point symmetry in plan view. Therefore, the relative positional relationship of the front face 17f, treating units (H, SC), receivers P and transport mechanisms T can conveniently be made to agree with the relative positional relationship of the rear face 17b, treating units (H, SC), receivers P and transport mechanisms T.

The treating units (H, SC), receivers P and transport mechanisms T in the front part of the treating section 17 are arranged symmetrically to the treating units (H, SC), receivers P and transport mechanisms T in the rear part of the treating section 17. Therefore, treating quality of the treating section 17 when the front face 17f is connected to the indexer section 11 and treating quality of the treating section 17 when the rear face 17b is connected to the indexer section 11 can further conveniently be made equal.

The treating units (H, SC), receivers P and transport mechanisms T in the right part of the treating section 17 are arranged symmetrically to the treating units (H, SC), receivers P and transport mechanisms T in the left part of the treating section 17. Therefore, the arrangement of the treating units (H, SC), receivers P and transport mechanisms T on the right side of the treating section 17 is the same as the arrangement of the treating units (H, SC), receivers P and transport mechanisms T on the left side of the treating section 17 (see FIGS. 12A-12E). Maintenance for the right side of the treating section 17 and maintenance for the left side of the treating section 17 can therefore be made common to both.

A block i-th in order from the front of the treating section 17 (i being an integer one or more) has the same function as a block i-th in order from the rear of the treating section 17. Therefore, treating quality of the treating section 17 when the front face 17f is connected to the indexer section 11 and treating quality of the treating section 17 when the rear face 17b is connected to the indexer section 11 can further conveniently be made equal.

Array ArF of blocks BH, BT and BC is the same as array ArB of blocks BH, BT and BC. In other words, the order of the solution treating block BC, heat-treating blocks BH and relay blocks BT arranged to extend forward XF is the same as the order of the solution treating block BC, heat-treating blocks BH and relay blocks BT arranged to extend backward XB. Therefore, the quality of heat treatment and solution treatment when the front face 17f is connected to the indexer section 11 and the quality of heat treatment and solution treatment when the rear face 17b is connected to the indexer section 11 can conveniently be made equal.

From the front face 17f to the rear face 17b of the treating section 17, the heat-treating block BH, relay block BT, solution treating block BC, relay block BT and heat-treating block BH are arranged in this order. Since each relay block BT is disposed between the heat-treating block BH and solution treating block BC, the efficiency of transporting the wafers W between the heat-treating block BH and solution treating block BC can be improved conveniently. Each relay block BT can reduce the thermal influence of the heat-treating block BH exerted on the solution treating block BC. Specifically, the receivers P or transport mechanisms T installed in the relay block BT can conveniently prevent heat and atmosphere emitted from the heat-treating units H from reaching the solution treating units SC. Here, the heat is heat radiating from surfaces of the chambers 23 of the heat-treating units H, for example. The atmosphere is a heat-treating gas which flows out of the chambers 23 into the exteriors of the heat-treating units H, for example, when the chambers 23 are opened and closed. As a result, the solution treating unit SC can perform the solution treatment with high quality.

The heat-treating blocks BH are arranged in both the front end region and the rear end region of the treating section 17. The indexer section 11 is therefore conveniently connectable to the treating section 17 whether the indexer section 11 is disposed forward XF of the treating section 17 or backward XB of the treating section 17.

In examples of operation 3 and 4, the solution treating block BC divides (distributes) the wafers W1 and W2 having undergone the coating treatment to the front heat-treating block BA and rear heat-treating block BE. Consequently, the post-coating heat treatment can be carried out in parallel in the front heat-treating block BA and rear heat-treating block BE.

The solution treating block BC divides (distributes) the wafers W1 and W2 having undergone the developing treatment to the front heat-treating block BA and rear heat-treating block BE. Consequently, the post-development heat treatment can be carried out in parallel in the front heat-treating block BA and rear heat-treating block BE. That is, the post-development heat treatment can be carried out efficiently.

The receivers PB1-PB4 are arranged in the up-down direction Z, while the transport mechanisms TBR and TBL are arranged laterally of the receivers PB1-PB4. The transport mechanisms TC1-TC4 are arranged in the up-down direction Z. Further, the receiver PB1 is in a position opposed to the transport mechanism TC1. Similarly, the receivers PB2, PB3 and PB4 are disposed in positions opposed to the transport mechanisms TC2, TC3 and TC4, respectively. As a result, the transport mechanisms TC1, TC2, TC3 and TC4 are arranged backward XB of at least certain of the receivers PB, respectively. According to such construction, the transport mechanisms TC1-TC4 and transport mechanisms TBR and TBL can transport the wafers W reciprocally through the receivers PB.

The receivers PD1-PD4 are arranged in the up-down direction Z, while the transport mechanisms TDR and TDL are arranged laterally of the receivers PD1-PD4. The receivers PD1-PD4 is arranged in positions opposed to the transport mechanisms TC1-TC4, respectively. As a result, the transport mechanism TC1, TC2, TC3 and TC4 are arranged forward XF of at least certain of the receiver PD, respectively. According to such construction, the transport mechanisms TC1-TC4 and the transport mechanisms TDR and TDL can transport the wafers W reciprocally through the receivers PD1-PD4.

The transport mechanisms TAR and TAL are arranged in the transverse direction Y. The receivers PB1-PB4 are arranged in positions opposed to both the transport mechanisms TAR and TAL, respectively. As a result, the transport mechanisms TAR and TAL are arranged forward XF of at least certain of the receivers PB, respectively. According to such construction, the transport mechanisms TAR and TAL and the transport mechanisms TBR and TBL can transport the wafers W reciprocally through the receivers PB.

The transport mechanisms TER and TEL are arranged in the transverse direction Y. The receivers PD1-PD4 are arranged in positions opposed to both the transport mechanisms TER and TEL, respectively. As a result, the transport mechanisms TER and TEL are arranged backward XB of at least certain of the receivers PD, respectively. According to such construction, the transport mechanisms TER and TEL and the transport mechanisms TDR and TDL can transport the wafers W reciprocally through the receivers PD.

The receiver PAR is disposed laterally of the transport mechanism TAR and in a position opposed to the transport mechanism TBR. The transport mechanism TBR is disposed backward XB of the receiver PAR. Therefore, the transport mechanism TAR and transport mechanism TBR not only can transport the wafers W through the receivers PB, but can transport the wafers W reciprocally through the receiver PAR. Similarly, the receiver PAL is disposed laterally of the transport mechanism TAL and in a position opposed to the transport mechanism TBL. The transport mechanism TBL is disposed backward XB of the receiver PAL. Therefore, the transport mechanism TAL and transport mechanism TBL not only can transport the wafers W through the receivers PB, but can transport the wafers W reciprocally through the receiver PAL. The wafers W can therefore be transported flexibly between the front heat-treating block BA and front relay block BB.

The receiver PER is disposed laterally of the transport mechanism TER and in a position opposed to the transport mechanism TDR. The transport mechanism TDR is disposed forward XF of the receiver PER. Therefore, the transport mechanism TER and transport mechanism TDR not only can transport the wafers W through the receivers PD, but can transport wafers W reciprocally through the receiver PER. Similarly, the receiver PEL is disposed laterally of the transport mechanism TEL and in a position opposed to the transport mechanism TDL. The transport mechanism TDL is disposed forward XF of the receiver PEL. Therefore, the transport mechanism TEL and transport mechanism TDL not only can transport the wafers W through the receivers PD, but can transport the wafers W reciprocally through the receiver PEL. The wafers W can therefore be transported flexibly between the rear heat-treating block BE and rear relay block BD.

The transport mechanisms TAR and TAL and transport mechanisms TC1-TC4 can transport the wafers W reciprocally, without using the transport mechanisms TB. That is, the transport mechanisms TAR and TAL and transport mechanisms TC1-TC4 can transport the wafers W reciprocally through the receivers PB. Therefore, the wafers W can be transported efficiently between the front heat-treating block BA and solution treating block BC.

The transport mechanisms TER and TEL and transport mechanisms TC1-TC4 can transport the wafers W reciprocally, without using the transport mechanisms TD. That is, the transport mechanisms TER and TEL and transport mechanisms TC1-TC4 can transport the wafers W reciprocally through the receivers PD. Therefore, the wafers W can be transported efficiently between the rear heat-treating block BE and solution treating block BC.

The solution treating block BC has more transport mechanisms than the other blocks BA, BB, BD and BE. Specifically, the number of transport mechanisms in the solution treating block BC is four, which is twice the number in the other blocks BA, BB, BD and BE. This can effectively improve the transport capacity for wafers W in the solution treating block BC.

The solution treating units SC include the solution treating units SC1 and SC2, and the solution treating units SC1 and SC2 are coating units for coating the wafers W with the coating film material. Therefore, the coating treatment can be given to the wafers W conveniently. The solution treating units SC include the solution treating units SC3 and SC4, and the solution treating units SC3 and SC4 are developing units for supplying the developer to the wafers W. Therefore, the developing treatment can be given to the wafers W conveniently.

Embodiment 2

Next, Embodiment 2 of this invention will be described with reference to the drawings. Components identical to those of Embodiment 1 are shown with the same signs, and will not particularly be described.

<Outline of Substrate Treating Apparatus 1>

Figure 23A:
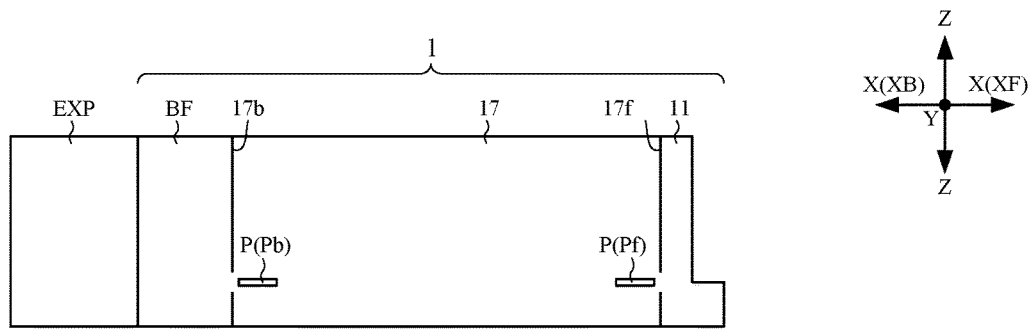
FIG. 23A is a side view showing an example of connection between a treating section and other equipment according to Embodiment 2.

FIG. 23A is a side view showing an example of connection between the treating section and other equipment. In FIG. 23A, the front face 17$f$ of the treating section 17 is connected to the indexer section 11. The rear face 17$b$ of the treating section 17 is connected to an interface block BF. The interface block BF is further connected to the exposing machine EXP. The interface block BF and exposing machine EXP can also transport wafers W reciprocally to each other. The indexer section 11, treating section 17, interface block BF and exposing machine EXP are arranged in a row in the fore-and-aft direction X. The indexer section 11, treating section 17, interface block BF and exposing machine EXP are arranged in the stated order backward XB. The exposing machine EXP performs exposing treatment of the wafers W by an immersion method, for example. The interface block BF is an example of the interface section in the invention.

In this Embodiment 2, the interface block BF is an element of the substrate treating apparatus 1. That is, the interface block BF is an internal part of equipment provided inside the substrate treating apparatus 1.

In the case of FIG. 23A, the substrate treating apparatus 1 and exposing machine EXP operate as follows, for example. The indexer section 11 transports wafers W to the treating section 17. Specifically, the indexer section 11 feeds wafers W to the treating section 17 through the front receivers Pf. The treating section 17 treats the wafers W. When the treating section 17 treats the wafers W, the wafers W are transported from the treating section 17 to the interface block BF through the rear receivers Pb. Further, the wafers W are transported from the interface block BF to the exposing machine EXP, and the exposing machine EXP performs the exposing treatment of the wafers W. After completion of the treatment by the treating section 17, the wafers W are transported from the treating section 17 to the indexer section 11 through the front receivers Pf.

Figure 23B:
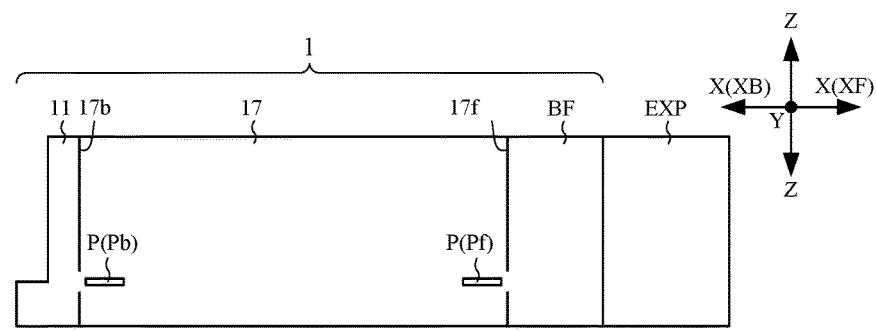
FIG. 23B is a side view showing another example of connection between the treating section and other equipment according to Embodiment 2.

FIG. 23B is a side view showing another example of connection between the treating section and other equipment according to Embodiment 2. In FIG. 23B, the rear face 17$b$ is connected to the indexer section 11. The front face 17$f$ is connected to the interface block BF. The interface block BF is further connected to the exposing machine EXP. The indexer section 11, treating section 17, interface block BF and exposing machine EXP are arranged in a row in the stated order forward XF. In this case, the substrate treating apparatus 1 and exposing machine EXP operate as follows, for example. The indexer section 11 transports wafers W to the treating section 17. Specifically, the indexer section 11 feeds wafers W to the treating section 17 through the rear receivers Pb. The treating section 17 treats the wafers W. When the treating section 17 treats the wafers W, the wafers W are transported from the treating section 17 to the interface block BF through the front receivers Pf. Further, the wafers W are transported from the interface block BF to the exposing machine EXP, and the exposing machine EXP performs the exposing treatment of the wafers W. After completion of the treatment by the treating section 17, the wafers W are transported from the treating section 17 to the indexer section 11 through the rear receivers Pb.

Thus, according to the substrate treating apparatus 1 in this Embodiment 2, the front face 17$f$ and rear face 17$b$ are both connectable to the indexer section 11. Therefore, the degree of freedom for arranging the treating section 17 and indexer section 11 can be improved.

The front face 17$f$ and rear face 17$b$ are both connectable to the interface block BF. Therefore, the interface block BF can be disposed forward XF of the treating section 17, and can also be disposed backward XB of the treating section 17. That is, the degree of freedom for arranging the treating section 17 and interface block BF can also be improved.

<Overall Construction of Substrate Treating Apparatus 1>

Figure 24:
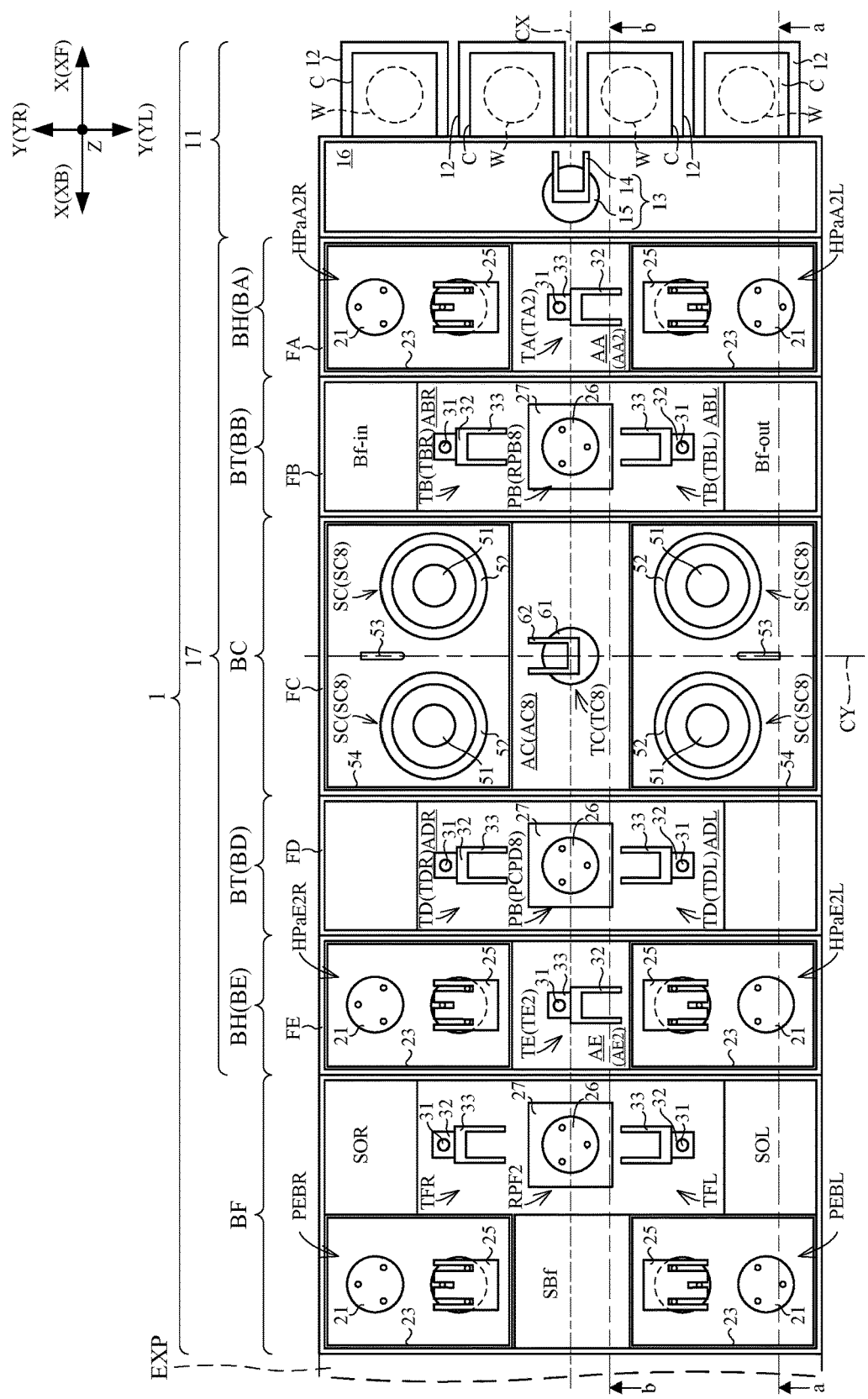
FIG. 24 is a plan view of the substrate treating apparatus according to Embodiment 2.
Figure 25:
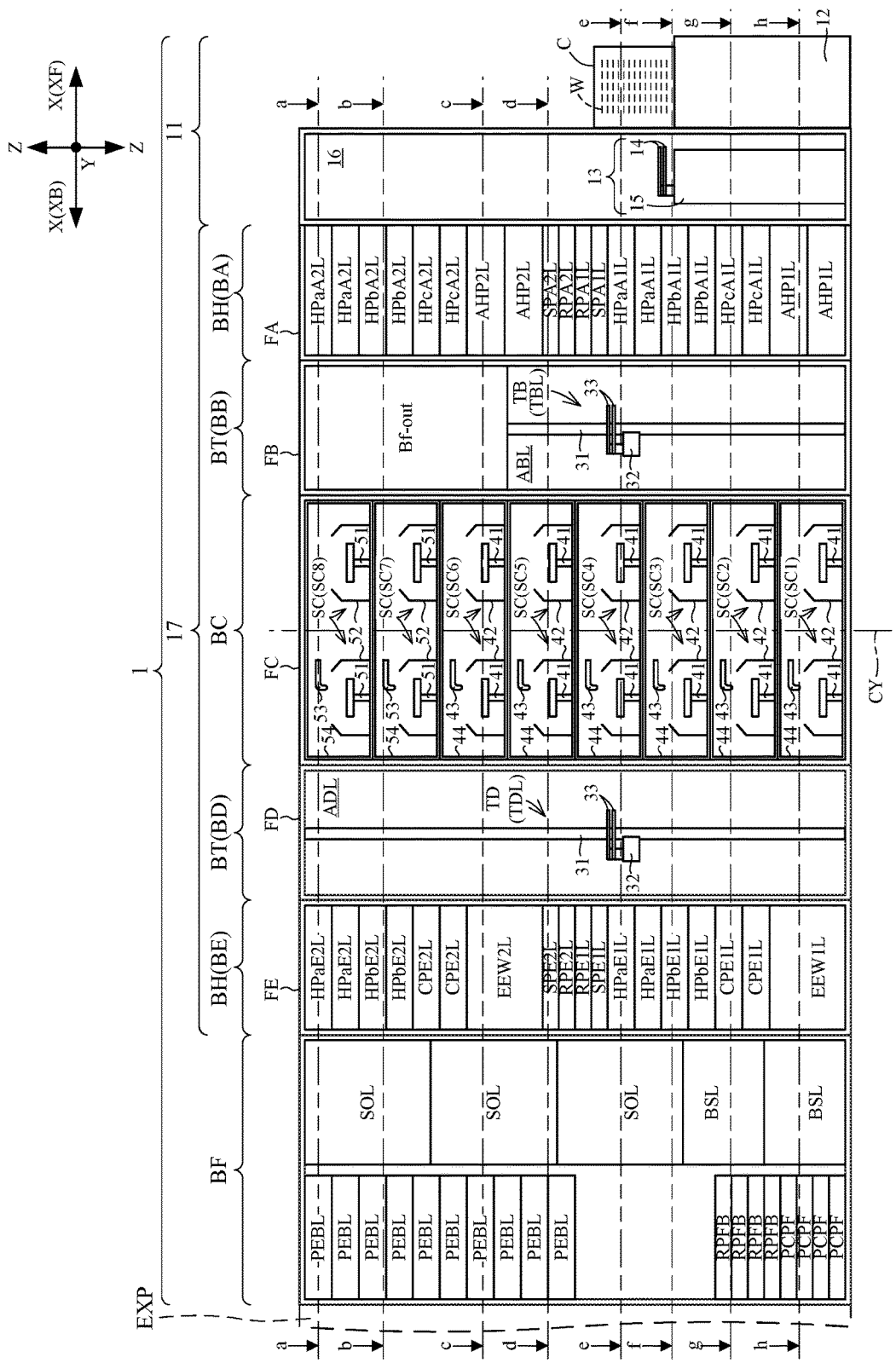
FIG. 25 is a side view taken on line a-a of FIG. 24.
Figure 26:
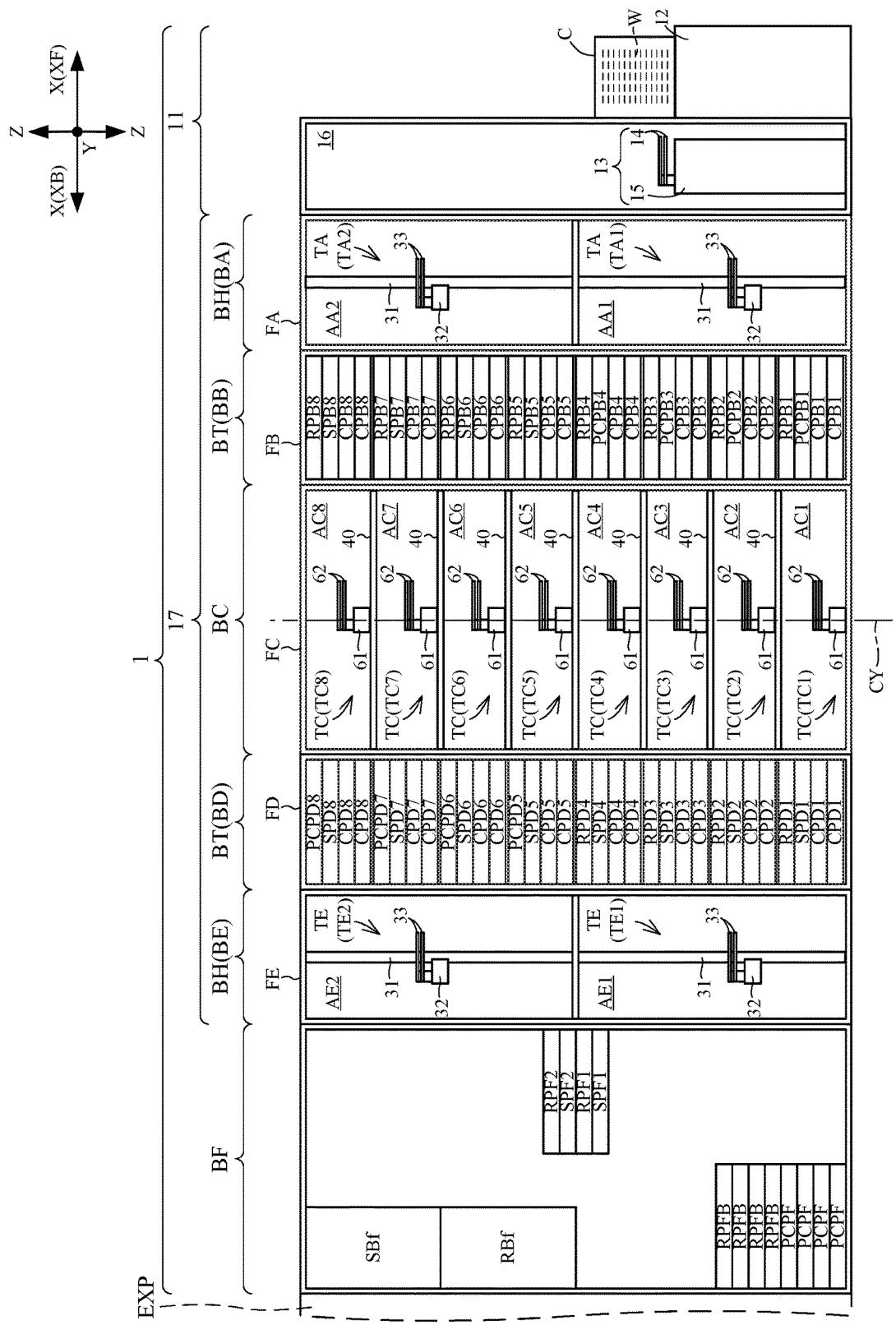
FIG. 26 is a side view taken on line b-b of FIG. 24.

FIG. 24 is a plan view of the substrate treating apparatus 1 according to Embodiment 2. FIG. 25 is a side view taken on line a-a of FIG. 24. FIG. 26 is a side view taken on line b-b of FIG. 24. For expediency, FIGS. 24 through 26 show an example in which the front face 17f of the treating section 17 is connected to the indexer section 11, and the rear face 17b of the treating section 17 is connected to the interface block BF. The substrate treating apparatus 1 in Embodiment 2 forms antireflection film, resist film and protective film on wafers W, and develops the wafers W.

The treating section 17 includes two heat-treating blocks BH, two relay blocks BT, and one solution treating block BC. The arrangement of the blocks BH, BT and BC is the same as in Embodiment 1. The heat-treating block BH located in the front end region of the treating section 17 will be called hereinafter the "front heat-treating block BA". The heat-treating block BH located in the rear end region of the treating section 17 will be called the "rear heat-treating block BE". The relay block BT located between the front heat-treating block BA and solution treating block BC will be called the "front relay block BB". The relay block BT located between the rear heat-treating block BE and solution treating block BC will be called the "rear relay block BD."

<Construction of Front Heat-Treating Block BA>

Figure 27:
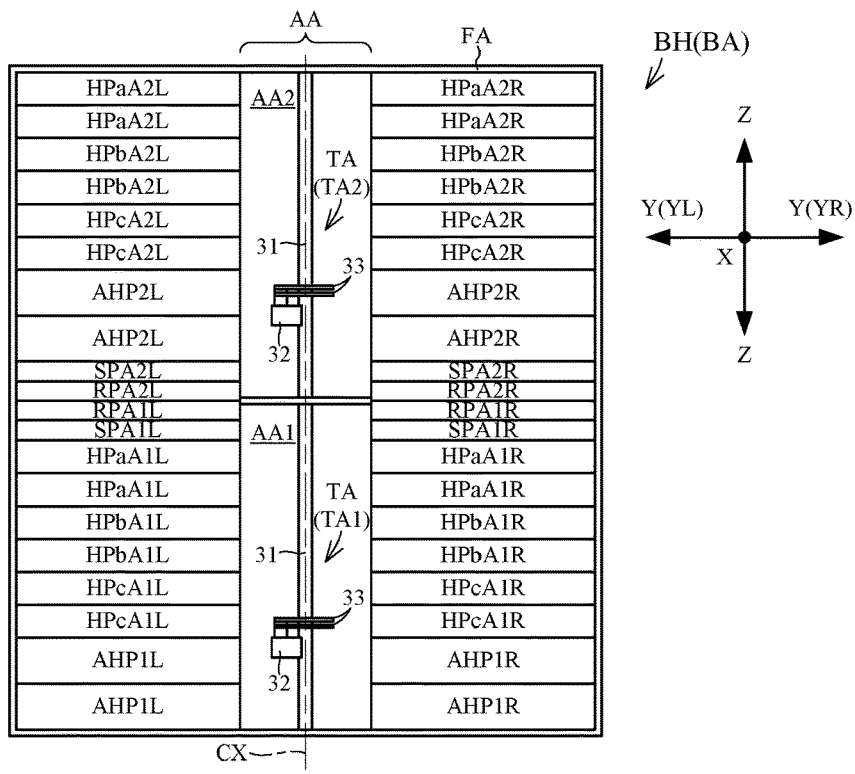
FIG. 27 is a front view of a front heat-treating block seen from an indexer section.

Reference is made to FIGS. 24 through 27. FIG. 27 is a front view of the front heat-treating block BA seen from the indexer section 11.

The front heat-treating block BA has a multistory structure including two stories arranged in the up-down direction Z. Specifically, the transporting space AA is separated into two divided transporting spaces AA1 and AA2. The divided transporting spaces AA1 and AA2 are arranged in the up-down direction Z. The divided transporting space AA1 and AA2 are arranged in this order from bottom upward.

The transport mechanisms TA include a transport mechanism TA1 and a transport mechanism TA2. The transport mechanism TA1 is installed in the divided transporting space AA1, while the transport mechanism TA2 is installed in the divided transporting space AA2. The transport mechanisms TA1 and TA2 are arranged in the up-down direction Z.

The front heat-treating block BA has heating units HPaA, HPbA and HPcA and hydrophobizing units AHP as heat-treating units. The front heat-treating block BA has receivers SPA and RPA. The receivers SPA and RPA correspond to the front receivers Pf, respectively. The elements HPaA, HPbA, HPcA, AHP, SPA and RPA are arranged laterally of the divided transporting spaces AA1 and AA2, respectively. In the following description, the sign of each element has attached thereto, as appropriate, a symbol indicating an installation location. The symbol indicating the installation location is a combination of number "1" or "2" which indicates a height position and "R" or "L" which indicates right side YR or left side YL. The elements opposed to the transport mechanism TA1 is given number "1" indicating their height position. The elements opposed to the transport mechanism TA2 is given number "2" indicating their height position. In other words, the elements arranged laterally of the divided transporting space AA1 are given number "1" indicating their height position, while the elements arranged laterally of the divided transporting space AA2 are given number "2" indicating their height position. For example, receiver SPA1R is a receiver SPA installed on the right side YR of the divided transporting space AA1, and heating unit HPaA2L is a heating unit HPaA installed on the left side YL of the divided transporting space AA2.

Each of the heating units HPaA, HPbA and HPcA heats wafers W. Each hydrophobizing unit AHP performs hydrophobic treatment for enhancing film adhesion to wafers W. Specifically, each hydrophobizing unit AHP performs temperature control of wafers W while supplying the wafers W with a treating gas including hexamethyldisilazane (HMDS).

Each heating unit HPaA has a local transport mechanism 25 besides the plate 21, chamber 23 and shutter 24 described in Embodiment 1 (see FIG. 24). The local transport mechanism 25 transports wafers W in the transverse direction Y, and places the wafers W on the plate 21. The other heating units HPbA and HPcA and the hydrophobizing units AHP also have local transport mechanisms 25.

The receivers SPA and RPA have the same construction as the receivers PA of Embodiment 1. The receivers SPA are used exclusively for receiving wafers W sent backward XB, for example. The receivers RPA are used exclusively for receiving wafers W sent forward XF, for example.

Each of the transport mechanisms TA1 and TA2 has a guide shaft 31, a drive mechanism 32 and hands 33.

The transport mechanism TA1 accesses each of the elements HPaA1R, HPbA1R, HPcA1R, AHP1R, SPA1R and RPA1R installed on the right side YR of the divided transporting space AA1, and each of the elements HPaA1L, HPbA1L, HPcA1L, AHP1L, SPA1L and RPA1L installed on the left side YL of the divided transporting space AA1.

The transport mechanism TA2 accesses each of the elements HPaA2R, HPbA2R, HPcA2R, AHP2R, SPA2R and RPA2R installed on the right side YR of the divided transporting space AA2, and each of the elements HPaA2L, HPbA2L, HPcA2L, AHP2L, SPA2L and RPA2L installed on the left side YL of the divided transporting space AA2.

<Construction of Front Relay Block BB>

Figure 28:
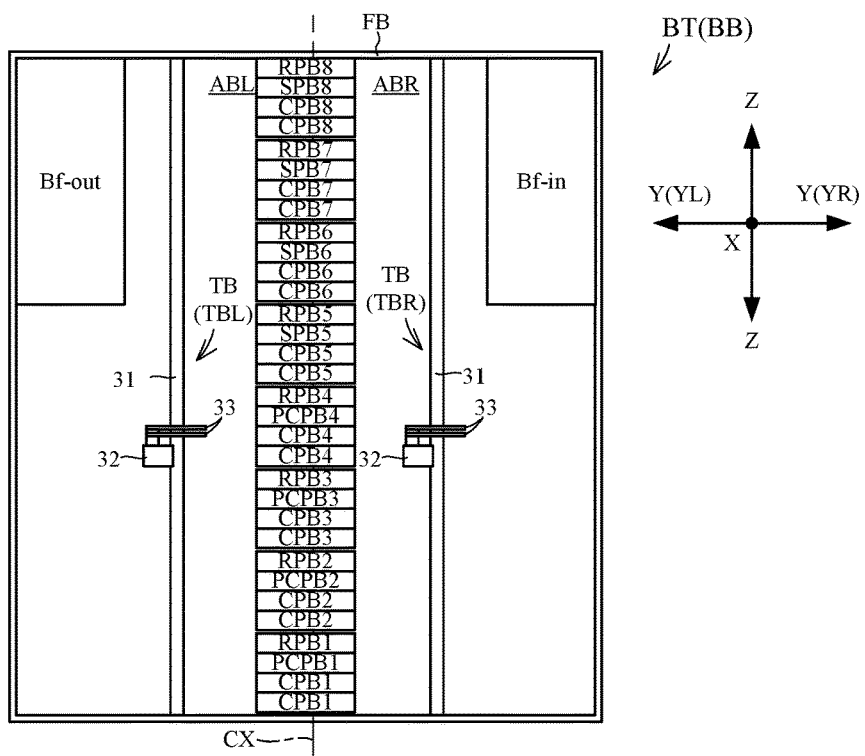
FIG. 28 is a front view of a front relay block seen from the indexer section

Reference is made to FIGS. 24 through 26 and 28. FIG. 28 is a front view of the front relay block BB seen from the indexer section 11.

The front relay block BB has receivers SPB and RPB, cooling receivers PCPB and cooling units CPB. The cooling units CPB are one type of heat-treating units for cooling wafers W. The cooling receivers PCPB receive and also cool wafers W. The cooling receivers PCPB are one type of receivers and also one type of heat-treating units. Each cooling receiver PCPB has a plate 26 and a heat-absorbing device (not shown) for removing heat from the plate 26. The cooling receivers PCPB are open horizontally as are the receivers SPB and RPB.

The receivers SPB and RPB, cooling receivers PCPB and cooling units CPB are stacked in the up-down direction Z at the middle in the transverse direction Y of the front relay block BB.

The elements SPB, RPB, PCPB and CPB of the front relay block BB are classified into a first group located rearward XB of the divided transporting space AA1, and a second group located rearward XB of the divided transporting space AA2. The elements SPB, RPB, PCPB and CPB belonging to the first group are opposed to the transport mechanism TA1. The elements SPB, RPB, PCPB and CPB belonging to the second group are opposed to the transport mechanism TA2. Each of the elements SPB, RPB, PCPB and CPB belonging to the first group is given one of numbers "1", "2", "3" and "4" indicating its height position. Each of the elements SPB, RPB, PCPB and CPB belonging to the second group is given one of numbers "5", "6", "7" and "8" indicating its height position.

The solution treating block BC, as described hereinafter, has a plurality of divided transporting spaces AC1, AC2, . . . , AC8 arranged in the up-down direction Z, and transport mechanisms TC1, TC2, TC8 installed in the divided transporting spaces AC1, AC2, . . . , AC8, respectively. The elements SPB, RPB, PCPB and CPB of the front relay block BB are arranged such that at least one of the elements SPB, RPB, PCPB and CPB is located forward XF of each of the divided transporting spaces AC1, AC2, . . . , AC8. In other words, the elements SPB, RPB, PCPB and CPB are arranged such that at least one of the elements SPB, RPB, PCPB and CPB is opposed to each of the transport mechanisms TC1, TC2, TC8. The elements SPB, RPB, PCPB and CPB affixed with number "1" indicating the height position are opposed to the transport mechanism TC1. Similarly, the elements SPB, RPB, PCPB and CPB affixed with numbers "2", . . . , "8" indicating the height positions are opposed to the transport mechanisms TC2, TC8.

As shown in FIG. 26, a range in the up-down direction Z where the divided transporting spaces AC1-AC4 are formed is equivalent to a range in the up-down direction Z where the divided transporting space AA1 is formed. A range in the up-down direction Z where the divided transporting spaces AC5-AC8 are formed is equivalent to a range in the up-down direction Z where the divided transporting space AA2 is formed.

The front relay block BB has an in-buffer Bf-in and an out-buffer Bf-out. The in-buffer Bf-in accumulates wafers W having undergone none of the heat treatment, solution treatment and so on in the substrate treating apparatus 1. The out-buffer Bf-out accumulates wafers W having undergone a series of treatments in the substrate treating apparatus 1. The number of wafers W accumulable in each of the in-buffer Bf-in and out-buffer Bf-out is 50, for example.

The in-buffer Bf-in is disposed on the right side YR of the transporting space ABR (transport mechanism TBR). The out-buffer Bf-out is disposed on the left side YL of the transporting space ABL (transport mechanism TBL).

Each of the transport mechanisms TBR and TBL can access the elements SPB, RPB, PCPB and CPB. The transport mechanism TBR further accesses the in-buffer Bf-in, while the transport mechanism TBL further accesses the out-buffer Bf-out.

<Construction of Solution Treating Block BC>

Figure 29:
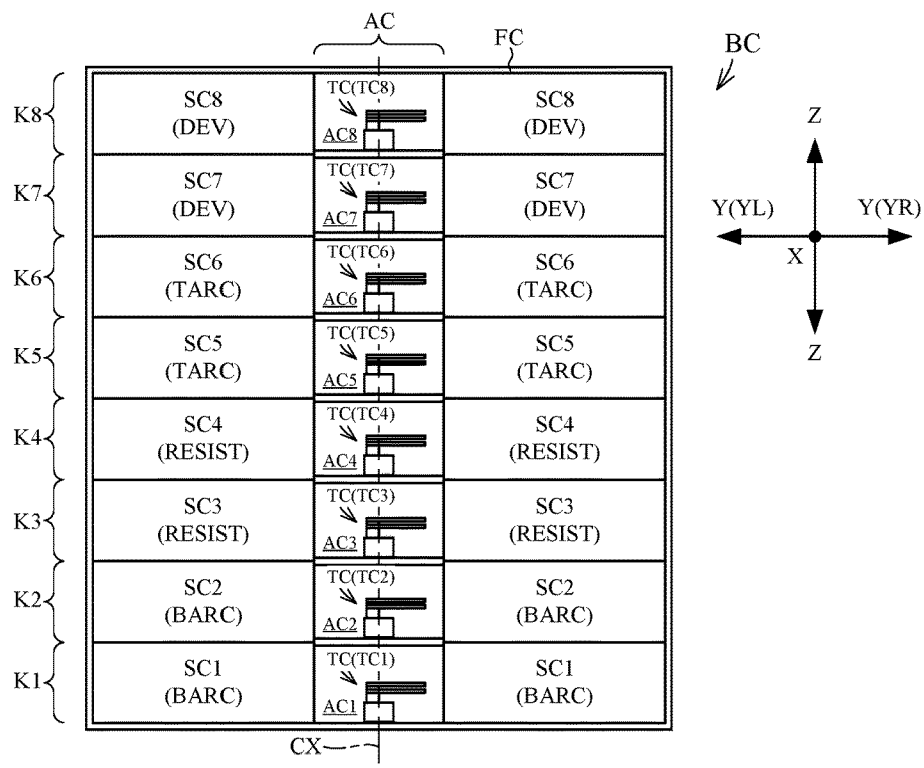
FIG. 29 is a front view of a solution treating block seen from the indexer portion.

Reference is made to FIGS. 24 through 26 and 29. FIG. 29 is a front view of the solution treating block BC seen from the indexer section 11.

The solution treating block BC has a multistory structure including eight stories K1, K2, . . . K8 arranged in the up-down direction Z. Specifically, a transporting space AC is separated into eight divided transporting spaces AC1, AC2, . . . , AC8. The divided transporting spaces AC1, AC2, . . . AC8 are arranged in the up-down direction Z. The divided transporting spaces AC1, AC2, . . . , AC8 are arranged in this order from bottom upward.

The transport mechanisms TC include transport mechanisms TC1, TC2, TC8. The transport mechanisms TC1, TC2, TC8 are installed in the divided transporting spaces AC1, AC2, . . . , AC8, respectively.

The solution treating units SC include solution treating units SC1, SC2, . . . , SC8. The solution treating units SC1, SC2, . . . , SC8 are installed laterally of the divided transporting spaces AC1, AC2, . . . , AC8, respectively.

The solution treating units SC1, SC2, . . . , SC6 are coating units. More particularly, the solution treating units SC1 and SC2 are antireflection film coating units (BARC), the solution treating units SC3 and SC4 are resist film coating units (RESIST), and the solution treating units SC5 and SC6 are protective film coating units (TARC). The antireflection film coating units SC1 and SC2 coat wafers W with an antireflection film material. The resist film coating units SC3 and SC4 coat wafers W with a resist film material. The protective film coating units SC5 and SC6 coat wafers W with a protective film material. The solution treating units SC7 and SC8 are developing units (DEV).

In Embodiment 2, as shown in FIGS. 24 and 25, two solution treating units SC are arranged on the right side YR of each transport mechanism TC, while two solution treating units SC are arranged on the left side YL of each transport mechanism TC. The two solution treating units SC installed on the right side YR of each transport mechanism TC share a nozzle 43/53 and a chamber 44/54. For example, the two solution treating units SC8 installed on the right side YR of the transport mechanism TC8 share a nozzle 53 and a chamber 54. Similarly, the two solution treating units SC installed on the left side YL of each transport mechanism TC also share a nozzle 43/53 and a chamber 44/54.

The transport mechanisms TC1, TC2, TC8 access the solution treating units SC1, SC2, . . . , SC8, respectively.

<Construction of Rear Relay Block BD>

Figure 30:
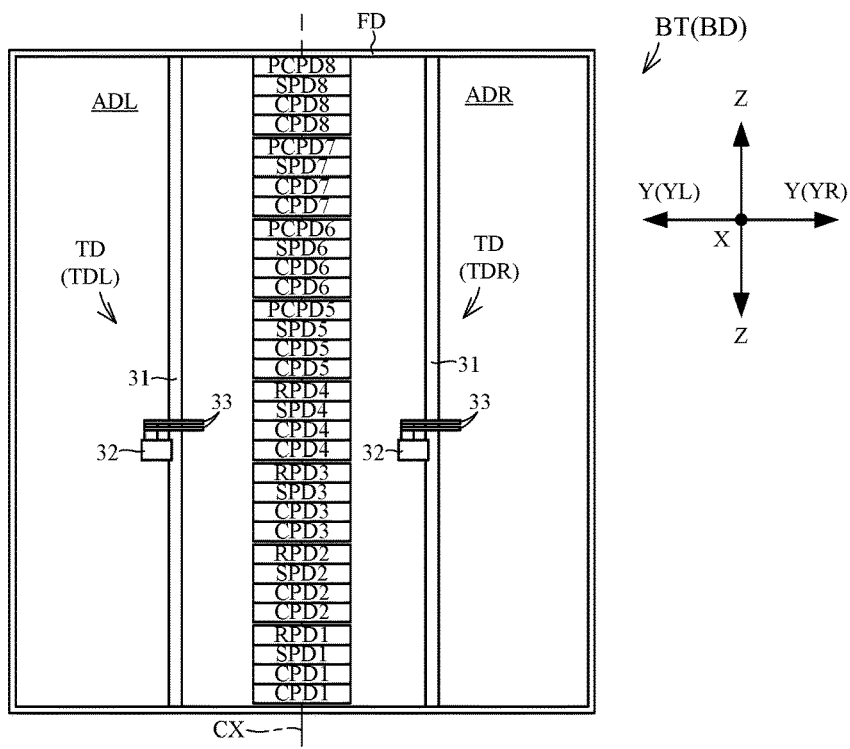
FIG. 30 is a front view of a rear relay block seen from the indexer portion.

Reference is made to FIGS. 24 through 26 and 30. FIG. 30 is a front view of the rear relay block BD seen from the indexer section 11.

The rear relay block BD has receivers SPD and RPD, cooling receivers PCPD and cooling units CPD. The receivers SPD and RPD, cooling receivers PCPD and cooling units CPD are stacked in the up-down direction Z at the middle in the transverse direction Y of the rear relay block BD.

The elements SPD, RPD, PCPD and CPD of the rear relay block BD are arranged such that at least one of the elements SPD, RPD, PCPD and CPD is located rearward XB of each of the divided transporting spaces AC1, AC2, . . . , AC8. In other words, the elements SPD, RPD, PCPD and CPD are arranged such that at least one of the elements SPD, RPD, PCPD and CPD is opposed to each of the transport mechanisms TC1, TC2, TC8. The elements SPD, RPD, PCPD and CPD opposed to the transport mechanism TC1 are affixed with number "1" indicating their height position. Similarly, the elements SPD, RPD, PCPD and CPD opposed to the transport mechanisms TC2, TC8 are affixed with numbers "2", . . . , "8" indicating their height positions.

Each of the transport mechanisms TDR and TDL can access the elements SPD, RPD, PCPD and CPD.

Buffers or the like (e.g. members corresponding to the in-buffer Bf-in and out-buffer Bf-out) are not installed on the right side YR of the transport mechanism TDR or the left side YL of the transport mechanism TDL. It is therefore possible to install pumps or the like, for example, in the right side and left side of the rear relay block BD for supplying the treating solutions to the solution treating block BC.

<Construction of Rear Heat-Treating Block BE>

Figure 31:
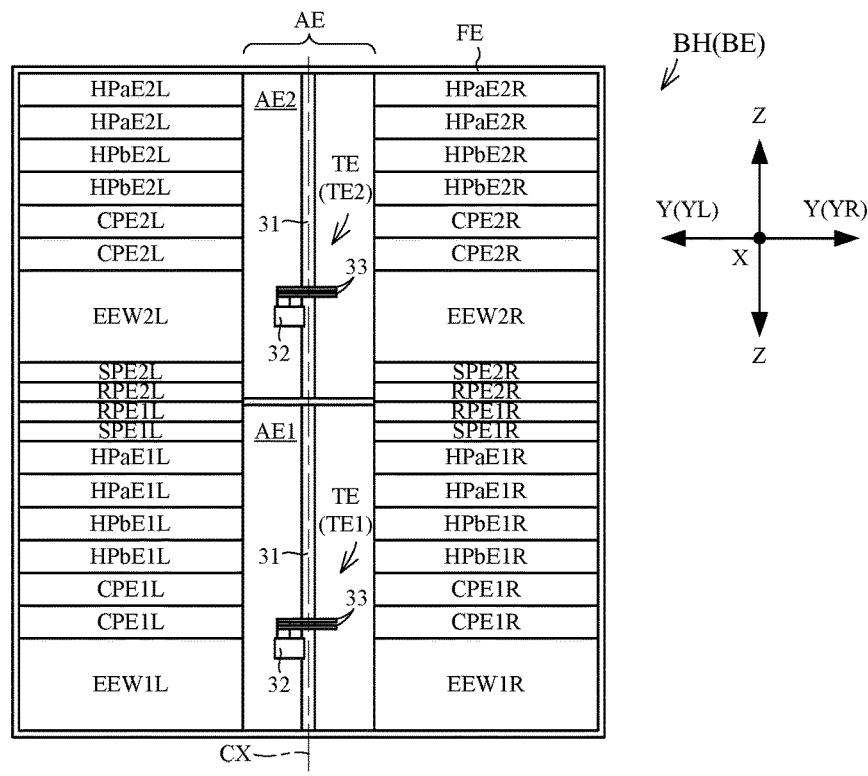
FIG. 31 is a front view of a rear heat-treating block seen from the indexer section.

Reference is made to FIGS. 24 through 26 and 31. FIG. 31 is a front view of the rear heat-treating block BE seen from the indexer section 11.

The rear heat-treating block BE has a multistory structure including two stories as does the front heat-treating block BA. Specifically, the transporting space AE is separated into divided transporting spaces AE1 and AE2.

The transport mechanisms TE include a transport mechanism TE1 and a transport mechanism TE2. The transport mechanism TE1 is installed in the divided transporting space AE1, while the transport mechanism TE2 is installed in the divided transporting space AE2.

The transporting space AE1 is aligned in the fore-and-aft direction X with a first group of elements SPD, RPD, PCPD and CPD of the rear relay block BD. That is, the transport mechanism TE1 is opposed to the elements SPD, RPD, PCPD and CPD belonging to the first group. The transporting space AE2 is aligned in the fore-and-aft direction X with a second group of elements SPD, RPD, PCPD and CPD of the rear relay block BD. That is, the transport mechanism TE2 is opposed to the elements SPD, RPD, PCPD and CPD belonging to the second group. Here, the first group includes the elements SPD, RPD, PCPD and CPD each given one of numbers "1", "2", "3" and "4" indicating their height positions. The second group includes the elements SPD, RPD, PCPD and CPD each given one of numbers "5", "6", "7" and "8" indicating their height positions.

The rear heat-treating block BE has heating units HPaE and HPbE and cooling units CPE as heat-treating units. The rear heat-treating block BE also has receivers SPE and RPE. The receivers SPE and RPE correspond to the rear receivers Pb, respectively. Further, the rear heat-treating block BE has edge exposing units EEW. The edge exposing units EEW expose edge portions of the resist film on the wafers W.

The elements HPaE, HPbE, CPE, SPE, RPE and EEW are arranged laterally of the divided transporting spaces AE1 and AE2, respectively. In the following description, the sign of each element has attached thereto, as appropriate, a symbol indicating an installation location. The symbol indicating the installation location is a combination of number "1" or "2" which indicates a height position and "R" or "L" which indicates right side YR or left side YL. The elements opposed to the transport mechanism TE1 is given number "1" indicating their height position. The elements opposed to the transport mechanism TE2 is given number "2" indicating their height position.

<Construction of Interface Block BF>

Figure 32:
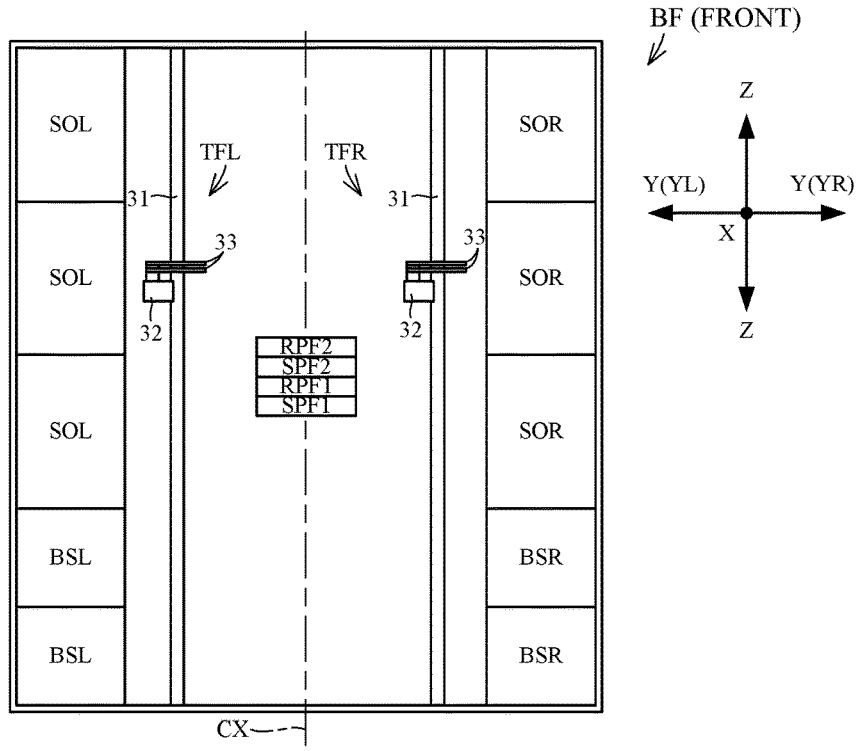
FIG. 32 is a front view of a front portion of the interface block seen from the indexer section.

Reference is made to FIGS. 24 through 26 and 32. FIG. 32 is a front view of a front portion of the interface block BF seen from the indexer section 11. Here, the front portion of the interface block BF is a portion of the interface block BF adjacent the treating section 17.

The front portion of the interface block BF has, installed therein, receivers SPF1, RPF1, SPF2 and RPF2, transport mechanisms TFR and TFL, pre-exposure cleaning units BSR and BSL, and post-exposure cleaning units SOR and SOL.

The pre-exposure cleaning units BSR and BSL clean and dry wafers W before exposing treatment. The pre-exposure cleaning units BSR and BSL clean the back surfaces and edges of the wafers W, for example. The post-exposure cleaning units SOR and SOL clean and dry wafers W after exposing treatment. Each of the pre-exposure cleaning units BSR and BSL and post-exposure cleaning units SOR and SOL has, for example, a substrate spin mechanism for rotating the wafers W, a cleaning liquid supply mechanism for feeding a cleaning liquid to the wafers W, and a cleaning instrument such as a brush for cleaning the wafers W (none of these shown).

The receivers SPF1, RPF1, SPF2 and RPF2 are arranged at the middle in the transverse direction Y of the interface block BF. The receivers SPF1, RPF1, SPF2 and RPF2 are arranged in the up-down direction Z. As shown in FIG. 26, the receivers SPF1 and RPF1 are arranged in a position opposed to the divided transporting space AE1 of the rear heat-treating block BE. The receivers SPF2 and RPF2 are arranged in a position opposed to the divided transporting space AE2 of the rear heat-treating block BE.

The transport mechanism TFR is disposed on the right side YR of the receivers SPF1, RPF1, SPF2 and RPF2. The pre-exposure cleaning units BSR and post-exposure cleaning units SOR are arranged on the right side YR of the transport mechanism TFR. The pre-exposure cleaning units BSR and post-exposure cleaning units SOR are arranged in the up-down direction Z.

The transport mechanism TFL is disposed on the left side YL of the receivers SPF1, RPF1, SPF2 and RPF2. The pre-exposure cleaning units BSL and post-exposure cleaning units SOL are arranged on the left side YL of the transport mechanism TFL. The pre-exposure cleaning units BSL and post-exposure cleaning units SOL are arranged in the up-down direction Z.

Figure 33:
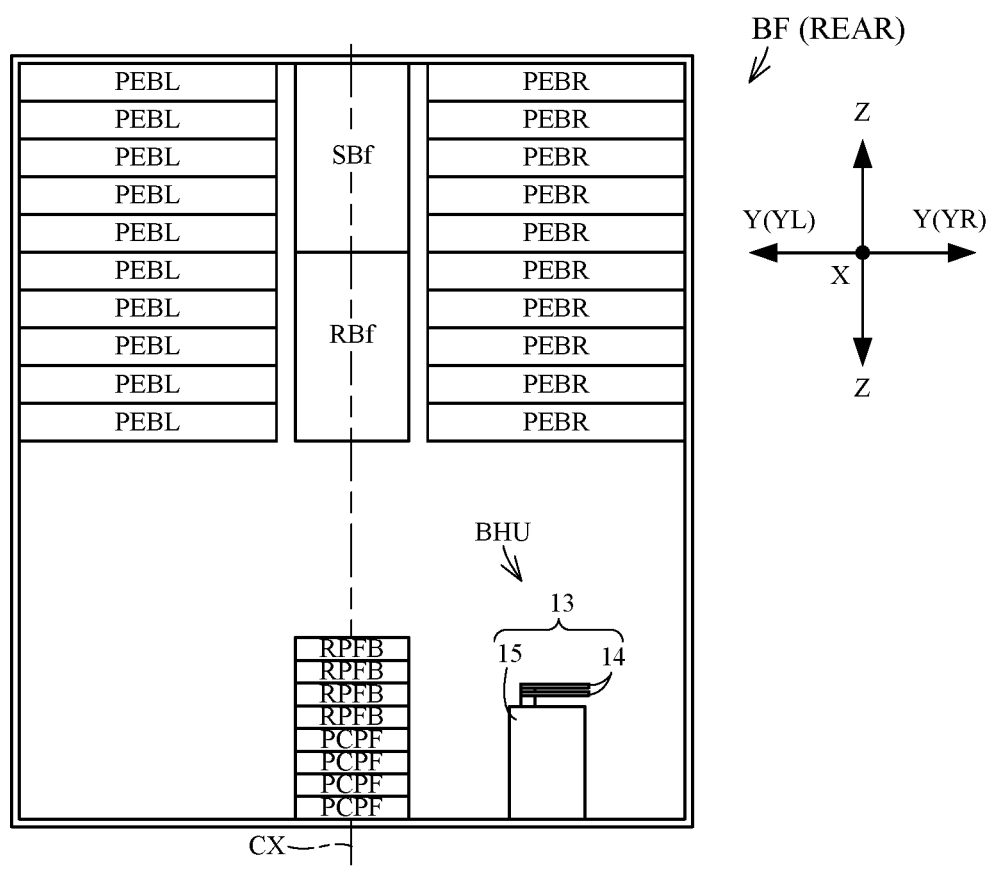
FIG. 33 is a front view of a rear portion of the interface block seen from the indexer section.

Reference is made to FIGS. 24 through 26 and 33. FIG. 33 is a front view of a rear portion of the interface block BF seen from the indexer section 11. Here, the rear portion of the interface block BF is a portion of the interface block BF adjacent the exposing machine EXP. The rear portion of the interface block BF has, installed therein, cooling receivers PCPF, receivers RPFB, a transport mechanism BHU, post-exposure heating units PEBR and PEBL, a feed buffer SBf and a return buffer RBf.

The post-exposure heating units PEBR and PEBL are one type of heat-treating units, and perform post-exposure bake for heating wafers W after exposing treatment. The feed buffer SBf accumulates wafers W before transportation to the exposing machine EXP. The return buffer RBf accumulates wafers W returned from the exposing machine EXP.

The cooling receivers PCPF and receivers RPFB are arranged at the middle in the transverse direction Y of the interface block BF. The cooling receivers PCPF and receivers RPFB are arranged in the up-down direction Z. The transport mechanism BHU is disposed on the right side YR of the cooling receivers PCPF and receivers RPFB.

The feed buffer SBf and return buffer RBf are arranged at the middle in the transverse direction Y of the interface block BF and above the cooling receivers PCPF and receivers RPFB. The feed buffer SBf and return buffer RBf are arranged in the up-down direction Z.

The post-exposure heating units PEBR are arranged on the right side YR of the feed buffer SBf and return buffer RBf. The plurality of post-exposure heating units PEBR are arranged in the up-down direction Z. The post-exposure heating units PEBL are arranged on the left side YL of the feed buffer SBf and return buffer RBf. The plurality of post-exposure heating units PEBL are arranged in the up-down direction Z.

The transport mechanism TFR accesses the receivers SPF1 and RPF1, pre-exposure cleaning units BSR, post-exposure cleaning units SOR, cooling receivers PCPF, receivers RPFB, post-exposure heating units PEBR, feed buffer SBf and return buffer RBf.

The transport mechanism TFL accesses the receivers SPF2 and RPF2, pre-exposure cleaning units BSL, post-exposure cleaning units SOL, cooling receivers PCPF, receivers RPFB, post-exposure heating units PEBL, feed buffer SBf and return buffer RBf.

The transport mechanism BHU accesses the cooling receivers PCPF and receivers RPFB. Further, the transport mechanism BHU transports wafers W to the exposing machine EXP which performs immersion exposure, and receives wafers W from the exposing machine EXP.

<Arrangement of Treating Units, Receivers and Transport Mechanisms>

Reference is made to FIGS. 34A-34D and 35A-35D. FIGS. 34A-34D are plan views taken on lines a-a, b-b, c-c and d-d of FIG. 25. FIGS. 35A-35D are plan views taken on lines e-e, f-f, g-g and h-h of FIG. 25.

The heating units HPaA, HPbA and HPcA and hydrophobizing units AHP of the block BA, the cooling units CPB of the block BB, the cooling units CPD of the block BD, the heating units HPaE and HPbE and cooling units CPE of the block BE, when not particularly distinguished, will be called "heat-treating units H", and will be regarded as identical. The solution treating units SC1-SC8, when not particularly distinguished, will be called "solution treating units SC", and will be regarded as identical. The heat-treating units H and solution treating units SC, when not particularly distinguished, will be called the "treating units", and will be regarded as identical. The receivers SPA and RPA of the block BA, the receivers SPB and RPB and cooling receivers PCPB of the block BB, the receivers SPD and RPD and cooling receivers PCPD of the block BD and the receivers SPE and RPE of the block BE, when not particularly distinguished, will be called the "receivers P", and will be regarded as identical. The transport mechanisms TA1, TA2, TBR, TBL, TC1-TC8, TDR, TDL, TE1 and TE2, when not particularly distinguished, will be called "transport mechanisms T", and will be regarded as identical.

As shown in FIGS. 34A-34D and 35A-35D, the relative positional relationship of the front face 17f, treating units, receivers P and transport mechanisms T of the treating section 17 is the same as that of the rear face 17b, treating units, receivers P and transport mechanisms T of the treating section 17. In other words, the position of each of the treating units, receivers P and transport mechanisms T relative to the front face 17f of the treating section 17 is the same as the position of each of the treating units, receivers P and transport mechanisms T relative to the rear face 17b of the treating section 17.

Specifically, the relative positional relationship of the front face 17f, heat-treating units H and solution treating units SC of the treating section 17 is the same as that of the rear face 17b, heat-treating units H and solution treating units SC of the treating section 17. In other words, the position of each of the heat-treating units H and solution treating units SC relative to the front face 17f of the treating section is the same as the position of each of the heat-treating units H and solution treating units SC relative to the rear face 17b of the treating section 17.

The relative positional relationship of the front face 17f and receivers P of the treating section 17 is the same as that of the rear face 17b and receivers P of the treating section 17. In other words, the position of each of the receivers P relative to the front face 17f of the treating section 17 is the same as the position of each of the receivers P relative to the rear face 17b of the treating section 17.

The relative positional relationship of the front face 17f and transport mechanisms T of the treating section 17 is the same as that of the rear face 17b and transport mechanisms T of the treating section 17. In other words, the position of each of the transport mechanisms T relative to the front face 17f of the treating section 17 is the same as the position of each of the transport mechanisms T relative to the rear face 17b of the treating section 17.

The treating units, receivers P and transport mechanisms T are arranged in point symmetry in plan view (see FIGS. 34A-34D and 35A-35D).

Specifically, the treating units are arranged in point symmetry in plan view. The center of point symmetry (i.e. the point of symmetry) is the center PC of the treating section 17 in plan view, for example. The heat-treating units H are arranged in point symmetry in plan view. The solution treating units SC are arranged in point symmetry in plan view. The receivers P are arranged in point symmetry in plan view. The transport mechanisms T are arranged in point symmetry in plan view.

The treating units, receivers P and transport mechanisms T in the right part of the treating section 17 are arranged symmetrically to the treating units, receivers P and transport mechanisms T in the left part of the treating section 17 (see FIGS. 34A-34D and 35A-35D). To put it simply, the treating units, receivers P and transport mechanisms T are arranged in right-left symmetry. More particularly, the treating units, receivers P and transport mechanisms T are arranged in right-left symmetry at least either in plan view and or in front view.

Reference is made to FIGS. 34A-34D and 35A-35D. The treating units are arranged in right-left symmetry in plan view. The heat-treating units H are arranged in right-left symmetry in plan view. The solution treating units SC are arranged in right-left symmetry in plan view. The receivers P are arranged in right-left symmetry in plan view. The transport mechanisms T are arranged in right-left symmetry in plan view. Thus, the treating units, receivers P and transport mechanisms T are arranged in right-left symmetry in plan view. The axis of line symmetry is the center plane CX in plan view, for example.

Reference is made to FIGS. 27 through 31. The treating units are arranged in right-left symmetry in front view. The heat-treating units H are arranged in right-left symmetry in front view. The solution treating units SC are arranged in right-left symmetry in front view (see FIG. 29). The receivers P are arranged in right-left symmetry in front view. The transport mechanisms T are arranged in right-left symmetry in front view. Thus, the treating units, receivers P and transport mechanisms T are arranged in right-left symmetry in front view. The axis of line symmetry is the center plane CX in front view, for example.

The treating units, receivers P and transport mechanisms T in a front part of the treating section 17 are arranged symmetrically to the treating units, receivers P and transport mechanisms T in a rear part of the treating section 17. To put it simply, the treating units, receivers P and transport mechanisms T are arranged in fore-aft symmetry. More particularly, the treating units, receivers P and transport mechanisms T are arranged in fore-aft symmetry at least either in plan view and or in side view.

Reference is made to FIGS. 34A-34D and 35A-35D. The treating units are arranged in fore-aft symmetry in plan view. The heat-treating units H are arranged in fore-aft symmetry in plan view. The solution treating units SC are arranged in fore-aft symmetry in plan view. The receivers P are arranged in fore-aft symmetry in plan view. The transport mechanisms T are arranged in fore-aft symmetry in plan view. Thus, the treating units, receivers P and transport mechanisms T are arranged in fore-aft symmetry in plan view. The axis of line symmetry is the center plane CY in plan view, for example.

Reference is made to FIGS. 25 and 26. The treating units are arranged in fore-aft symmetry in side view. The heat-treating units H are arranged in fore-aft symmetry in side view. The solution treating units SC are arranged in fore-aft symmetry in side view. The receivers P are arranged in fore-aft symmetry in side view. The transport mechanisms T are arranged in fore-aft symmetry in side view. Thus, the treating units, receivers P and transport mechanisms T are arranged in fore-aft symmetry in side view. The axis of line symmetry is the center plane CY in side view, for example.

<Relationship Between Indexer Section 11 and Block BA>

Reference is made to FIGS. 24 through 26. The indexer's transport mechanism 13 and the transport mechanisms TA transport wafers W reciprocally. Specifically, the receivers SPA and RPA are open to the indexer section 11 (transporting space 16), whereby the indexer's transport mechanism 13 can access the receivers SPA and RPA. The indexer's transport mechanism 13 and the transport mechanism TA1 transport wafers W reciprocally through the receivers SPA1R, SPA1L, RPA1R and RPA1L. The indexer's transport mechanism 13 and the transport mechanism TA2 transport wafers W reciprocally through the receivers SPA2R, SPA2L, RPA2R and RPA2L.

<Relationship Between Front Heat-Treating Block BA and Front Relay Block BB>

The transport mechanisms TA and the transport mechanisms TB can transport wafers W reciprocally.

Specifically, the transport mechanism TBR can access the receivers SPA1R, RPA1R, SPA2R and RPA2R arranged in the right side YR of the transporting space AA. Consequently, the transport mechanism TA1 and the transport mechanism TBR can transport wafers W reciprocally through the receivers SPA1R and RPA1R. The transport mechanism TA2 and the transport mechanism TBR can transport wafers W reciprocally through the receivers SPA2R and RPA2R.

Similarly, the transport mechanism TBL can access the receivers SPA1L, RPA1L, SPA2L and RPA2L arranged in the left side YL of the transporting space AA. Consequently, the transport mechanism TA1 and the transport mechanism TBL can transport wafers W reciprocally through the receivers SPA1L and RPA1L. The transport mechanism TA2 and the transport mechanism TBL can transport wafers W reciprocally through the receivers SPA2L and RPA2L.

The transport mechanism TA1 can access the first group of elements SPB, RPB, PCPB and CPB of the front relay block BB. The transport mechanism TA1 and the transport mechanisms TBR/TBL can therefore transport wafers W reciprocally through the first group of elements SPB, RPB, PCPB and CPB of the front relay block BB.

Similarly, the transport mechanism TA2 can access the second group of elements SPB, RPB, PCPB and CPB of the front relay block BB. The transport mechanism TA2 and the transport mechanisms TBR/TBL can therefore transport wafers W reciprocally through the second group of elements SPB, RPB, PCPB and CPB of the front relay block BB.

The transport mechanism TBR can further access the heat-treating units HPaA1R, HPbA1R, HPcA1R, AHP1R, HPaA2R, HPbA2R, HPcA2R and AHP2R arranged on the right side YR of the transporting space AA. The transport mechanism TBL can further access the heat-treating units HPaA1L, HPbA1L, HPcA1L, AHP1L, HPaA2L, HPbA2L, HPcA2L and AHP2L arranged on the left side YL of the transporting space AA.

<Relationship Between Indexer Section 11, Block BA, and Block BB>

The indexer's transport mechanism 13 and the transport mechanisms TB can transport wafers W reciprocally without using the transport mechanisms TA.

Specifically, the indexer's transport mechanism 13 and the transport mechanism TBR can transport wafers W reciprocally through any one of the receivers SPA1R and RPA1R and receivers SPA2R and RPA2R. The indexer's transport mechanism 13 and the transport mechanism TBL can transport wafers W reciprocally through any one of the receivers SPA1L and RPA1L and receivers SPA2L and RPA2L.

<Relationship Between Block BB and Block BC>

The transport mechanisms TB and the transport mechanisms TC can transport wafers W reciprocally.

Specifically, the transport mechanism TC1 can access the receiver RPB1 and cooling receiver PCPB1 opposed to the transport mechanism TC1. The transport mechanisms TBR/TBL and the transport mechanism TC1 can transport wafers W reciprocally through the receiver RPB1 or cooling receiver PCPB1. Similarly, each of the transport mechanisms TC2, TC3, TC8 can transfer wafers W to/from the transport mechanisms TBR/TBL reciprocally through the receiver SPB or RPB or cooling receiver PCPB opposed the transport mechanism TC2, TC3, . . . , or TC8.

<Relationship Between Block BA, Block BB and Block BC>

The transport mechanisms TA and the transport mechanisms TC can transport wafers W reciprocally without using the transport mechanisms TB. For example, the transport mechanism TA1 and the transport mechanisms TC1/TC2/TC3/TC4 can transport wafers W reciprocally through the first group of elements SPB, RPB, PCPB and CPB of the front relay block BB. The transport mechanism TA2 and the transport mechanisms TC5/TC6/TC7/TC8 can transport wafers W reciprocally through the second group of elements SPB, RPB, PCPB and CPB of the front relay block BB.

<Relationship Between Block BC and Block BD>

The relationship between the solution treating block BC and the rear relay block BD is the same as the relationship between the front relay block BB and the solution treating block BC. That is, each of the transport mechanisms TC1, TC2, TC8 can transfer wafers W reciprocally to/from the transport mechanisms TDR/TDL.

<Relationship Between Block BD and Block BE>

The relationship between the rear relay block BD and the rear heat-treating block BE is the same as the relationship between the front relay block BB and the front heat-treating block BA.

Specifically, the transport mechanism TDR and the transport mechanism TE1 can transport wafers W reciprocally through the receivers SPE1R and RPE1R. The transport mechanism TDR and the transport mechanism TE2 can transport wafers W reciprocally through the receivers SPE2R and RPE2R. Similarly, transport mechanism TDL and the transport mechanism TE1 can transport wafers W reciprocally through the receivers SPE1L and RPE1L. The transport mechanism TDL and the transport mechanism TE2 can transport wafers W reciprocally through the receivers SPE2L and RPE2L. The transport mechanisms TDR/TDL and the transport mechanism TE1 can transport wafers W reciprocally through the first group of elements SPD, RPD, PCPD and CPD of the rear relay block BD. The transport mechanisms TDR/TDL and the transport mechanism TE2 can transport wafers W reciprocally through the second group of elements SPD, RPD, PCPD and CPD of the rear relay block BD.

The transport mechanism TDR can transport wafers W to the heating units HPaE1R, HPbE1R, HPaE2R and HPbE2R, the cooling units CPE1R and CPE2R and the edge exposing units EEW1R and EEW2R arranged on the right side YR of the transporting space AE. The transport mechanism TDL can transport wafers W to the heating units HPaE1L, HPbE1L, HPaE2L and HPbE2L, the cooling units CPE1L and CPE2L and the edge exposing units EEW1L and EEW2L arranged on the left side YL of the transporting space AE.

<Relationship Between Block BC, Block BD and Block BE>

The relationship between the solution treating block BC, the rear relay block BD and the rear heat-treating block BE is the same as the relationship between the solution treating block BC, the front relay block BB and the front heat-treating block BA. That is, the transport mechanisms TC and the transport mechanisms TE can transport wafers W reciprocally without using the transport mechanisms TD.

<Relationship Between Block BE and Interface Block BF>

The transport mechanisms TE and the transport mechanisms TF can transport wafers W reciprocally.

Specifically, the transport mechanism TE1 can access the receivers SPF1 and RPF1. The transport mechanism TE2 can access the receivers SPF2 and RPF2. The transport mechanism TFR can access the receivers SPE1R, RPE1R, SPE2R and RPE2R. The transport mechanism TFL can access the receivers SPE1L, RPE1L, SPE2L and RPE2L. Consequently, the transport mechanism TE1 and the transport mechanism TFR can transport wafers W reciprocally through the receivers SPE1R, RPE1R, SPF1 and RPF1. The transport mechanism TE2 and the transport mechanism TFR can transport wafers W reciprocally through the receivers SPE2R, RPE2R, SPF2 and RPF2. The transport mechanism TE1 and the transport mechanism TFL can transport wafers W reciprocally through the receivers SPE1L, RPE1L, SPF1 and RPF1. The transport mechanism TE2 and the transport mechanism TFL can transport wafers W reciprocally through the receivers SPE2L, RPE2L, SPF2 and RPF2.

The transport mechanism TFR can transport wafers W to the heating units HPaE1R, HPbE1R, HPaE2R and HPbE2R, the cooling units CPE1R and CPE2R and the edge exposing units EEW1R and EEW2R arranged on the right side YR of the transporting space AE. The transport mechanism TFL can transport wafers W to the heating units HPaE1L, HPbE1L, HPaE2L and HPbE2L, the cooling units CPE1L and CPE2L and the edge exposing units EEW1L and EEW2L arranged on the left side YL of the transporting space AE.

<Relationship Between Interface Block BF and Exposing Machine EXP>

The transport mechanism BHU transports wafers W to the exposing machine EXP, and receives wafers W from the exposing machine EXP.

<Example of Treatment the Treating Section 17 Performs on Wafers W>

Figure 36:
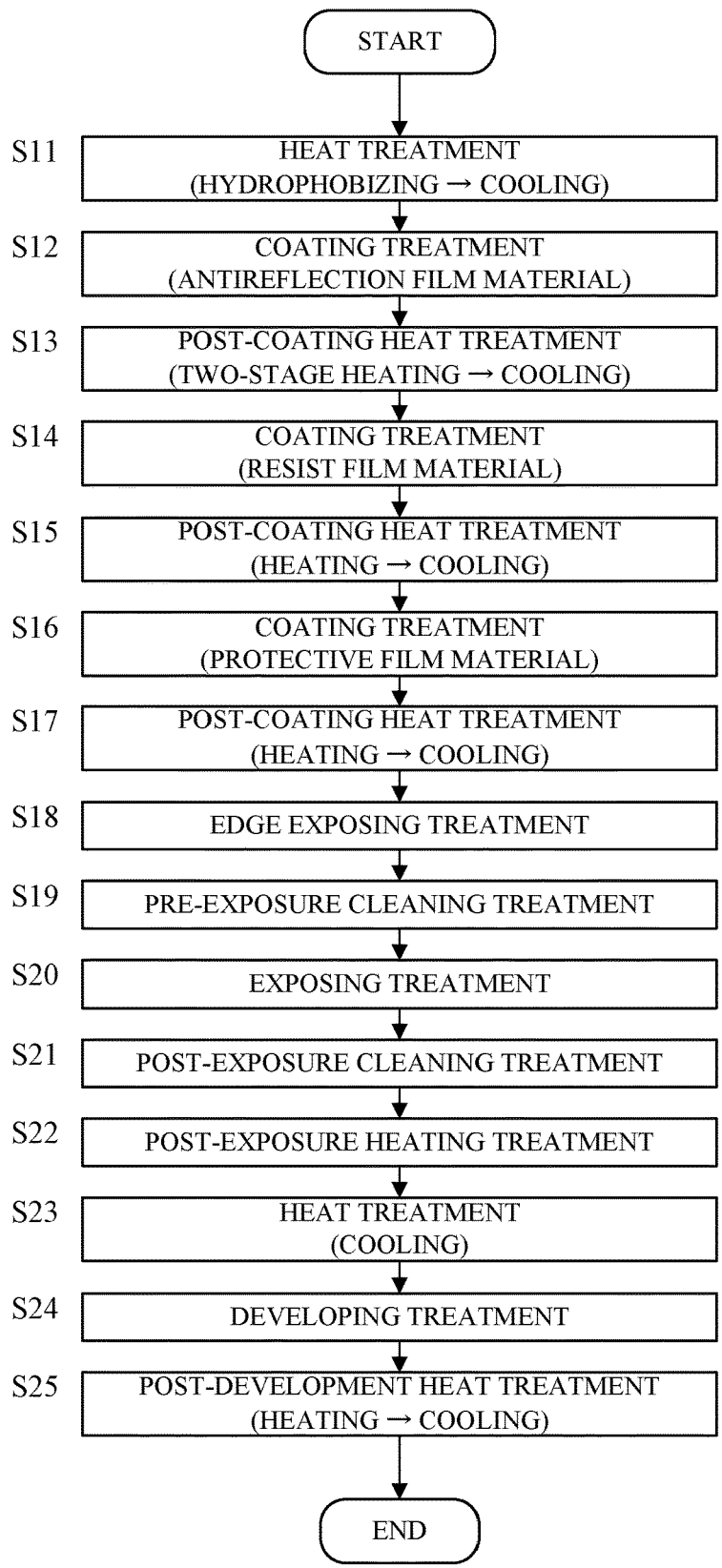
FIG. 36 is a flow chart illustrating an example of procedure for treating substrates.

FIG. 36 is a flow chart illustrating an example of procedure for treating wafers W.

The treating section 17 gives wafers W coating treatment, post-coating heat treatment, developing treatment, and post-development heat treatment in this order, for example. The treating section 17 performs treatments in steps S11-19 and S21-25, i.e. a series of treatments including solution treatment and heat treatment. The exposing machine EXP performs treatment in step 20, i.e. exposing treatment, on the wafers W.

The treating section 17 can perform the above-noted series of treatments on the wafers W when the front face 17f of the treating section 17 is connected to the indexer section 11, and when the rear face 17b of the treating section 17 is connected to the indexer section 11. That is, the treatment the treating section 17 performs on the wafers W when the front face 17f of the treating section 17 is connected to the indexer section 11 is the same as when the rear face 17b of the treating section 17 is connected to the indexer section 11.

Description will be made hereinafter of example of operation 1 when the front face 17f is connected to the indexer section 11, and example of operation 2 when the rear face 17b is connected to the indexer section 11.

<Example of Operation 1 of Substrate Treating Apparatus 1>

Figure 37:
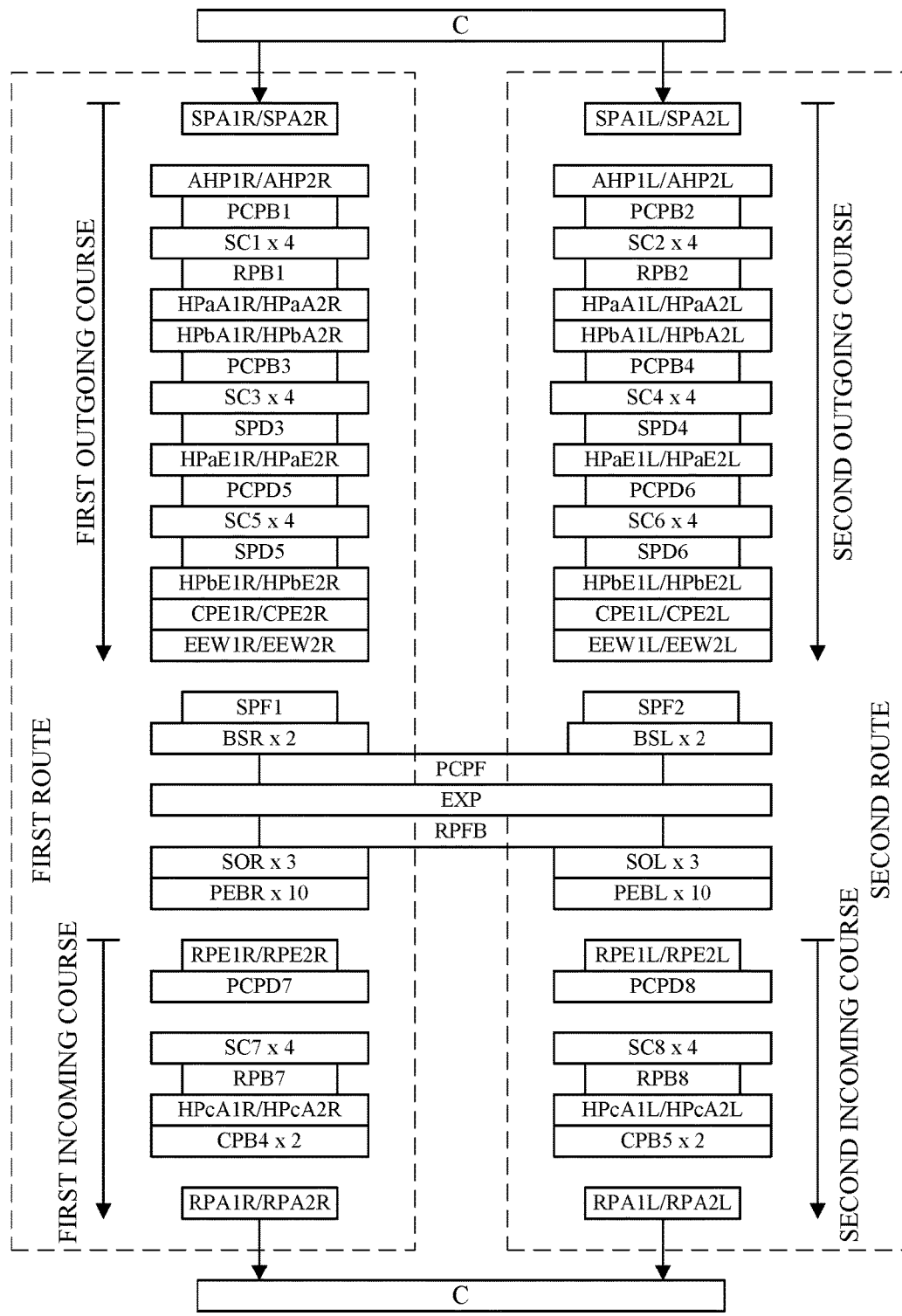
FIG. 37 is a view showing substrate transport routes in example of operation 1.

Example of operation 1 is an example of operation when the front face 17f is connected to the indexer section 11. FIG. 37 is a view showing transport routes of wafers W in example of operation 1. The wafers W move from top down through the receivers and treating units shown in FIG. 37.

In example of operation 1, as shown in FIG. 37, part of the wafers W are transported along a first route, and the other wafers W are transported along a second route different from the first route. The first route includes a first outgoing course and a first incoming course. The second route includes a second outgoing course and a second incoming course.

Example of operation 1 will be described hereinafter as divided into operation of each of the indexer section 11, treating section 17 and exposing machine EXP.

[Operation of Indexer Section 11 (Feeding of Wafers W)]

The indexer's transport mechanism 13 transports wafers W to the receivers SPA1R, SPA2R, SPA1L and SPA2L.

[Operation of Treating Section 17 (Outgoing Course)]

Since operation relating to the first outgoing course and operation relating to the second outgoing course are similar, the operation relating to the first outgoing course will be described for expediency, omitting description of the operation relating to the second outgoing course.

The transport mechanism TBR transports wafers W from the receivers SPA1R/SPA2R to the hydrophobizing units AHP1R/AHP2R.

When the feeding of wafers W from the indexer section 11 to the treating section 17 is stopped, no wafers W will be placed on the receivers SPA. In such a case, the transport mechanism TBR transports wafers from the in-buffer Bf-in to the hydrophobizing units AHP1R/AHP2R. Wafers W are accumulated beforehand in the in-buffer Bf-in.

The hydrophobizing units AHP1R/AHP2R perform hydrophobic treatment of wafers W. The transport mechanism TBR transports the wafers W from the hydrophobizing units AHP1R/AHP2R to the cooling receiver PCPB1. The cooling receiver PCPB1 cools the wafers W. The series of treatments by the hydrophobizing units AHP1R/AHP2R and cooling receiver PCPB1 corresponds to the heat treatment in step S11 shown in FIG. 36.

The transport mechanism TC1 transports the wafers W from the cooling receiver PCPB1 to the solution treating units SC1. The solution treating units SC1 coat the wafers W with the antireflection film material (step S12). The transport mechanism TC1 transports the wafers W from the solution treating units SC1 to the receiver RPB1.

The transport mechanism TBR transports the wafers W from receiver RPB1 to the heating units HPaA1R and HPaA2R. The heating units HPaA1R and HPaA2R heat the wafers W. The transport mechanism TA1 transports the wafer W from the heating unit HPaA1R to the heating unit HPbA1R. The transport mechanism TA2 transports the wafer W from the heating unit HPaA2R to the heating unit HPbA2R. The heating units HPbA1R and HPbA2R heat the wafers W. For example, the temperature to which the heating units HPbA1R and HPbA2R heat the wafers W is higher than that of the heating units HPaA1R and HPaA2R. According to such two-step heating, the temperature of the wafers W can be increased promptly. The transport mechanism TBR transports the wafers W from the heating units HPbA1R and HPbA2R to the cooling receiver PCPB3. The cooling receiver PCPB3 cools the wafers W. The series of treatments by the heating units HPaA1R, HPbA1R, HPaA2R and HPbA2R and the cooling receiver PCPB3 corresponds to the post-coating heat treatment in step S13 shown in FIG. 36.

The transport mechanism TC3 transports the wafers W from the cooling receiver PCPB3 to the solution treating units SC3. The solution treating units SC3 coat the wafers W with the resist film material (step S14).

The transport mechanism TC3 transports the wafers W from the solution treating units SC3 to the receiver SPD3. The transport mechanism TDR transports the wafers W from the receiver SPD3 to the heating units HPaE1R and HPaE2R. The heating units HPaE1R and HPaE2R heat the wafers W. The transport mechanism TDR transports the wafers W from the heating units HPaE1R and HPaE2R to the cooling receiver PCPD5. The cooling receiver PCPD5 cools the wafers W. The series of treatments by the heating units HPaE1R and HPaE2R and the cooling receiver PCPD5 corresponds to the post-coating heat treatment in step S15 shown in FIG. 36.

The transport mechanism TC5 transports the wafers W from the cooling receiver PCPD5 to the solution treating units SC5. The solution treating units SC5 coat the wafers W with the protective film material (Step S16).

The transport mechanism TC5 transports the wafers W from the solution treating unit SC5 to the receiver SPD5. The transport mechanism TDR transports the wafers from the receiver SPD5 to the heating units HPbE1R and HPbE2R. The heating units HPbE1R and HPbE2R heat the wafers W. The transport mechanism TE1 transports the wafer W from the heating unit HPbE1R to the cooling unit CPE1R. The transport mechanism TE2 transports the wafer W from the heating unit HPbE2R to the cooling unit CPE2R. The cooling units CPE1R and CPE2R cool the wafers W. The series of treatments by the heating units HPbE1R and HPbE2R and the cooling units CPE1R and CPE2R corresponds to the post-coating heat treatment in step S17 shown in FIG. 36.

The transport mechanism TE1 transports the wafer W from the cooling unit CPE1R to the edge exposing unit EEW1R. The transport mechanism TE2 transports the wafer W from the cooling unit CPE2R to the edge exposing unit EEW2R. The edge exposing units EEW1R and EEW2R expose edge regions of the wafers W (step S18).

The transport mechanism TFR transports the wafers W from the edge exposing units EEW1R and EEW2R to the interface block BF (receiver SPF1).

<Operation of Interface Block BF and Exposing Machine EXP>

The transport mechanism TFR transports the wafers W from the receiver SPF1 to the pre-exposure cleaning units BSR. The pre-exposure cleaning units BSR clean the wafers W (step S19).

The transport mechanism TFR transports the wafers W from the pre-exposure cleaning units BSR to the cooling receiver PCPF. The cooling receiver PCPF adjusts the wafers W to a predetermined temperature.

The transport mechanism BHU transports the wafers W from the cooling receiver PCPF to the exposing machine EXP. The exposing machine EXP performs immersion exposing treatment of the wafers W (step S20).

The transport mechanism BHU transports wafers W from the exposing machine EXP to the receiver RPFB. The transport mechanism TFR transports the wafers W from the receiver RPFB to the post-exposure cleaning units SOR. The post-exposure cleaning units SOR clean the wafers W (step S21).

The transport mechanism TFR transports the wafers W from the post-exposure cleaning units SOR to the post-exposure heating units PEBR. The post-exposure heating units PEBR heat the wafers W (step S22).

The transport mechanism TFR transports the wafers W from the post-exposure heating units PEBR to the receivers RPE1R and RPE2R.

<Operation of Treating Section 17 (Incoming Course)>

Since operation relating to the first incoming course and operation relating to the second incoming course are similar, the operation relating to the first incoming course will be described for expediency, omitting description of the operation relating to the second incoming course.

The transport mechanism TDR transports the wafers W from the receivers RPE1R/RPE2R to the cooling receiver PCPD7. The cooling receiver PCPD7 cools the wafers W (step S23).

The transport mechanism TC7 transports the wafers W from the cooling receiver PCPD7 to the solution treating units SC7. The solution treating units SC7 develop the wafers W (step S24).

The transport mechanism TC7 transports the wafers W from the solution treating units SC7 to the receiver RPB7. The transport mechanism TBR transports the wafers W from the receiver RPB7 to the heating units HPcA1R and HPcA2R. The heating units HPcA1R and HPcA2R heat the wafers W. The transport mechanism TA1 transports the wafer W from the heating unit HPcA1R to the cooling unit CPB4. The transport mechanism TA2 transports the wafer W from the heating unit HPcA2R to the cooling unit CPB5. The cooling units CPB4 and CPB5 cool the wafers W. The series of treatments by the heating units HPcA1R and HPcA2R and the cooling units CPB4 and CPB5 corresponds to the post-development heat treatment in step S25 shown in FIG. 36.

The transport mechanism TBR transports the wafers W from the cooling units CPB4 and CPB5 to the receivers RPA1R and RPA2R.

<Operation of Indexer Section 11 for Collecting Wafers W from Treating Section 17>

The indexer's transport mechanism 13 transports wafers W from the receivers RPA1R, RPA2R, RPA1L and RPA2L to a carrier C.

When the operation of the indexer section 11 for collecting wafers W from the treating section 17 is stopped, the wafers W will remain on the receivers RPA1R, RPA2R, RPA1L and RPA2L to prevent new wafers W from being placed on the receivers RPA1R, RPA2R, RPA1L and RPA2L. In such a case, the wafers W may be transported from the cooling units CPB4/CPB5 to the out-buffer Bf-out. Consequently, the wafers W having undergone the series of treatments in the substrate treating apparatus 1 are accumulated in the out-buffer Bf-out. Here, the series of treatments in the substrate treating apparatus 1 is the series of treatments in steps S11 through S25 described above. The transport mechanisms TBR and TBL may be used to transport the wafers W to the out-buffer Bf-out.

<Example of Operation 2 of Substrate Treating Apparatus 1>

Figure 38:
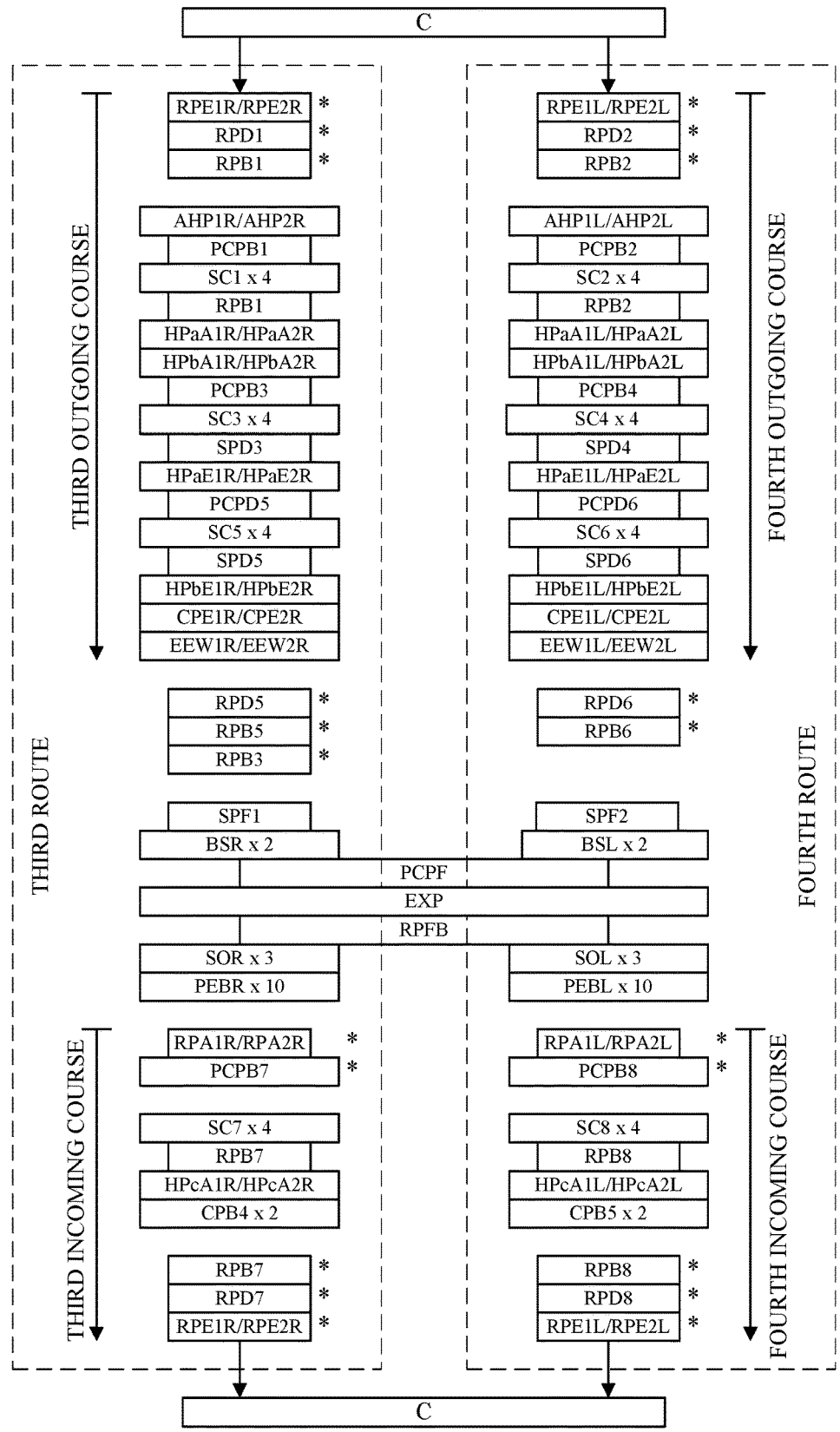
FIG. 38 is a view showing substrate transport routes in example of operation 2.

Example of operation 2 is an example of operation when the rear face 17b is connected to the indexer section 11. FIG. 38 is a view showing transport routes of wafers W in example of operation 2. Sign "*" in FIG. 38 indicates routes (i.e. the elements through which the wafers W pass) not included in example of operation 1.

In example of operation 2, as shown in FIG. 38, part of the wafers W are transported along a third route, and the other wafers W are transported along a fourth route different from the third route. The third route includes a third outgoing course and a third incoming course. The fourth route includes a fourth outgoing course and a fourth incoming course.

Example of operation 2 will be described hereinafter as divided into operation of each of the indexer section 11, treating section 17 and exposing machine EXP. A description of the operations common to those in example of operation 1 will be omitted as appropriate.

[Operation of Indexer Section 11 (Feeding of Wafers W)]

The indexer's transport mechanism 13 transports wafers W from the carrier C to the receivers RPE1R, RPE2R, RPE1L and RPE2L.

[Operation of Treating Section 17 (Outgoing Course)]

Since operation relating to the third outgoing course and operation relating to the fourth outgoing course are similar, the operation relating to the third outgoing course will be described for expediency, and a description of operation relating to the fourth outgoing course will be omitted.

The transport mechanism TDR transports wafers W from the receivers RPE1R/RPE2R to the receivers RPD1. The transport mechanism TC1 transports the wafers W from the receivers RPD1 to the receivers RPB1. The transport mechanism TBR transports the wafers W from the receivers RPB1 to the hydrophobizing units AHP1R/AHP2R.

The hydrophobizing units AHP1R/AHP2R perform hydrophobic treatment of wafers W. The transport mechanism TBR transports the wafers W from the hydrophobizing units AHP1R/AHP2R to the cooling receiver PCPB1. The cooling receiver PCPB1 cools the wafers W. The series of treatments by the hydrophobizing units AHP1R/AHP2R and cooling receiver PCPB1 corresponds to the heat treatment in step S11 shown in FIG. 36.

The operation from after step S11 to the edge exposing treatment in step S18 is the same as in example of operation 1. Therefore, a description of steps S11-S18 will be omitted.

After the edge coating treatment is completed, the transport mechanism TDR transports the wafers W from the edge exposing units EEW1R and EEW2R to the receiver PRD5. The transport mechanism TC5 transports the wafers W from the receiver PRD5 to the receiver RPB5. The transport mechanism TBR transports the wafers W from the receiver RPB5 to the receiver RPB3. The transport mechanism TA1 transports the wafers W from the receiver RPB3 to the receiver SPF1.

<Operations of Interface Block BF and Exposing Machine EXP>

The interface block BF and exposing machine EXP perform the treatments in steps S19, S20, S21 and S22 as in example of operation 1. After the post-exposure heat treatment in step S22, the transport mechanism TFR transports wafers W from the post-exposure heat-treating units PEBR to the receivers RPA1R and RPA2R.

<Operation of Treating Section 17 (Incoming Course)>

Since operation relating to the third incoming course and operation relating to the fourth incoming course are similar, the operation relating to the third incoming course will be described for expediency, omitting description of the operation relating to the second incoming course.

The transport mechanism TBR transports the wafers W from the receivers RPA1R/RPA2R to the cooling receiver PCPB7. The cooling receiver PCPB7 cools the wafers W (step S23).

The transport mechanism TC7 transports the wafers W from the cooling receiver PCPB7 to the solution treating units SC7. The solution treating units SC7 develop the wafers W (step S24).

The operation from after the developing treatment in step S24 to the post-development heat treatment in step S25 is the same as in example of operation 1. Therefore, a description of steps S24-S25 will be omitted.

After the post-development heat treatment, the transport mechanism TBR transports the wafers W from the cooling units CPB4 to the receivers RPB7. The transport mechanism TC7 transports the wafers W from the receivers RPB7 to the receivers RPD7. The transport mechanism TDR transports the wafers W from the receivers RPD7 to the receivers RPE1R/RPE2R.

<Operation of Indexer Section 11 for Collecting Wafers W from Treating Section 17>

The indexer's transport mechanism 13 transports the wafers W from the receivers RPE1R, RPE2R, RPE1L and RPE2L to a carrier C.

Effects of Embodiment 2

As described above, the substrate treating apparatus 1 in Embodiment 2 produces effects similar to those of Embodiment 1.

Further, according to Embodiment 2, both the front face 17f and rear face 17b are connectable to the interface block BF. Therefore, the degree of freedom for arranging the treating section 17 and interface block BF can be improved.

The front relay block BB can reduce the thermal influence of the heating units HPa, HPb and HPc and the hydrophobizing units AHP exerted on the solution treating units SC. The front relay block BB can therefore effectively protect the solution treating units SC. The rear relay block BD can reduce the thermal influence of the heating units HPaE and HPbE exerted on the solution treating units SC. The rear relay block BD can therefore also further effectively protect the solution treating units SC.

The substrate treating apparatus 1 in Embodiment 2 can perform various treatments of wafers W. For example, resist film, antireflection film and protective film can be formed on the wafers W.

In Embodiment 2, the transport mechanisms TA1 and TA2 are arranged in the up-down direction Z. The first group of elements SPB, RPB, PCPB and CPB of the front relay block BB is opposed to the transport mechanism TA1. In other words, the transport mechanism TA1 is disposed forward XF of the first group of elements SPB, RPB, PCPB and CPB of the front relay block BB. Therefore, the transport mechanism TA1 and transport mechanism TBR can transport the wafers W reciprocally. The second group of elements SPB, RPB, PCPB and CPB of the front relay block BB is opposed to the transport mechanism TA2. In other words, the transport mechanism TA2 is disposed forward XF of the second group of elements SPB, RPB, PCPB and CPB of the front relay block BB. Therefore, the transport mechanism TA2 and transport mechanism TBL can conveniently transport the wafers W reciprocally.

The front relay block BB has the in-buffer Bf-in. Therefore, even when the feeding of wafers W from the indexer section 11 to the treating section 17 is stopped, the treating section 17 can treat the wafers W accumulated in the in-buffer Bf-in.

The front relay block BB has the out-buffer Bf-out. Therefore, even when the delivery of wafers W from the treating section 17 to the indexer section 11 (in other words, the collection of wafers W by the indexer section 11) is stopped, the treating section 17 can accumulate the wafers W in the out-buffer Bf-out. These features can inhibit a reduction in production capacity of the substrate treating apparatus 1.

This invention is not limited to the foregoing embodiments, but may be modified as follows:

(1) In Embodiment 2 described above, all the wafers W having undergone the treatment (step S12) for coating the antireflection film material in the solution treating block BC are transported to the front heat-treating block BA. The invention is not limited to this. For example, a change may be made to be similar to examples of operation 3 and 4 in Embodiment 1. Specifically, part of the wafers W having undergone the treatment (step S12) for coating the antireflection film material in the solution treating block BC may be transported to one of the heat-treating blocks BA and BE, and the other wafers W having undergone the treatment (step S12) for coating the antireflection film material in the solution treating block BC transported to the other of the heat-treating blocks BA and BE. Each of the heat-treating blocks BA and BE may carry out the post-coating heat treatment of the wafers W having the antireflection film material coated thereon.

A similar change may be made also to the transportation of wafers W after the treatment (step S14) for coating the resist film material. A similar change may be made also to the transportation of wafers W after the treatment (step S16) for coating the protective film material. A similar change may be made also to the transportation of wafers W after the developing treatment (step S24).

Or a change may be made to install the hydrophobizing units AHP not only in the front heat-treating block BA but in the rear heat-treating block BE, to carry out the hydrophobizing treatment in parallel in the front heat-treating block BA and rear heat-treating block BE.

(2) In Embodiments 1 and 2 described hereinbefore, the construction of solution treating block BC may be changed as appropriate. For example, the number of stories K in the solution treating block BC may be changed. For example, the number of transport mechanisms TC in the solution treating block BC may be changed. For example, the number of solution treating units SC in the solution treating block BC may be changed. For example, the contents of treatment of the solution treating units SC in the solution treating block BC may be changed.

FIGS. 39A, 39B and 39C are side views schematically showing constructions of solution treating blocks according to modified embodiments, respectively.

In the modified embodiment shown in FIG. 39A, the solution treating block BC has eight stories K1, K2, . . . , K8. Solution treating units SC1, SC2, . . . , SC8 are provided for the respective stories K1, K2, . . . , K8. The solution treating units SC1 and SC2 on the stories K1 and K2 are antireflection film coating units (BARC). The solution treating units SC3 and SC4 on the stories K3 and K4 are resist film coating units (RESIST). The solution treating units SC5-SC8 on the stories K5-K8 are developing units (DEV).

In the modified embodiment shown in FIG. 39B, solution treating units SC1 on a story K1 are coating units (RESIST/BARC) which apply the antireflection film material and resist film material. For example, a plurality of solution treating units SC1 are provided on the story K1, in which part of the solution treating units SC1 are antireflection film coating units (BARC), and the other solution treating units SC1 are resist film coating units (RESIST). Similarly, solution treating units SC2-SC4 on stories K2-K4 are coating units (RESIST/BARC) which apply the antireflection film material and resist film material, respectively. Solution treating units SC5-SC8 on stories K5-K8 are developing units.

In the modified embodiment shown in FIG. 39C, solution treating units SC1-SC8 on stories K1-K8 are coating units (RESIST/BARC) which apply the antireflection film material and resist film material, respectively. For example, a plurality of solution treating units SC1 are provided for the story K1, in which part of the solution treating units SC1 are antireflection film coating units (BARC), and the other solution treating units SC1 are resist film coating units (RESIST).

(3) Embodiments 1 and 2 described hereinbefore exemplify arrangements of the receivers P, treating units H and SC, and transport mechanisms T. The invention is not limited to these. The arrangements of the receivers P, treating units H and SC, and transport mechanisms T may be changed as appropriate.

(4) In Embodiments 1 and 2 described hereinbefore, the treating section 17 includes the heat-treating blocks BH, solution treating units SC and relay blocks BT. The invention is not limited to this. For example, one or two of the heat-treating blocks BH, solution treating block BC and relay blocks BT may be omitted. Or the treating section 17 may have blocks other than these blocks BH, BC and BT.

Figure 40:
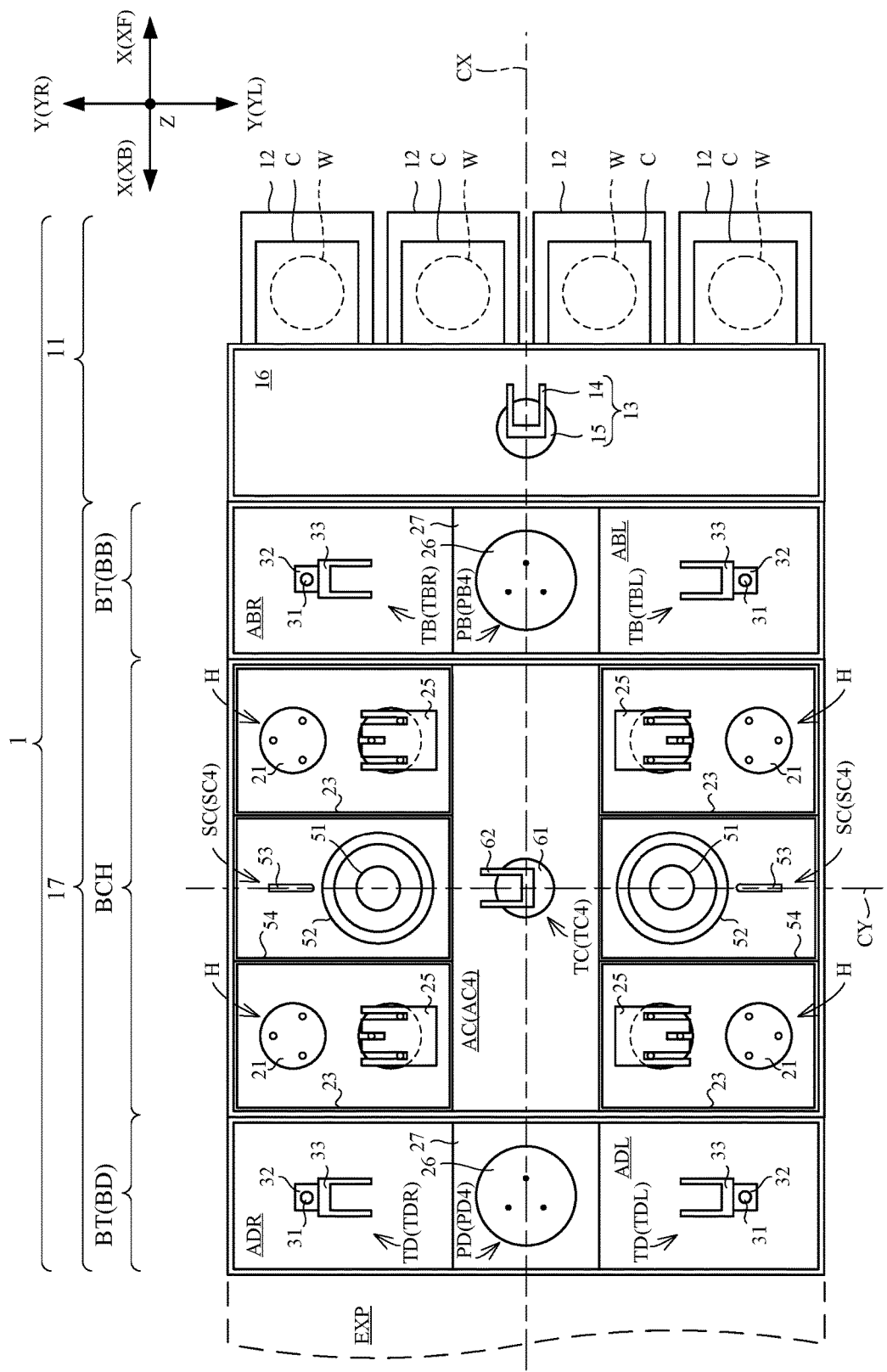
FIG. 40 is a plan view of a substrate treating apparatus according to a modified embodiment.

Reference is made to FIG. 40. FIG. 40 is a plan view of a substrate treating apparatus according to a modified embodiment. For expediency, FIG. 40 shows an example in which the front face 17f of the treating section 17 is connected to the indexer section 11, and the rear face 17b of the treating section 17 is connected to the exposing machine EXP. Components identical to those of the embodiments are shown with the same signs, and will not particularly be described.

As shown in FIG. 40, the treating section 17 has two relay blocks BT and one solution/heat-treating block BCH. The solution/heat-treating block BCH carries out solution treatment and heat treatment of wafers W. The relay blocks BT and solution/heat-treating block BCH are arranged in a row in the fore-and-aft direction X. Arrays ArF and ArB of the relay blocks BT and solution/heat-treating block BCH are as follows, respectively:

Array ArF: BT→BCH→BT
Array ArB: BT→BCH→BT

One of the relay blocks BT is located in the front end region of the treating section 17. The front face of the one relay block BT corresponds to the front face 17f of the treating section 17, and is connected to the indexer section 11. The other relay block BT is located in the rear end region of the treating section 17. The rear face of the other relay block BT corresponded to the rear face 17b of the treating section 17, and is connected to the exposing machine EXP.

The solution/heat-treating block BCH has solution treating units SC, heat-treating units H and transport mechanisms TC. The transport mechanisms TC transport wafers W to the solution treating units SC and heat-treating units H.

The solution treating units SC and heat-treating units H are installed rightward YR of a divided transporting space ACj. These solution treating units SC and heat-treating units H are arranged in rows along the fore-and-aft direction X. For example, the heat-treating units H, solution treating units SC and heat-treating units H are arranged in this order in the fore-and-aft direction X. The solution treating units SC and heat-treating units H are opposed to the transport mechanisms TC, respectively. Similarly, the solution treating units SC and heat-treating units H are installed leftward YL of the divided transporting space ACj. These solution treating units SC and heat-treating units H are also arranged in rows along the fore-and-aft direction X. For example, the heat-treating units H, solution treating units SC and heat-treating units H are arranged in this order in the fore-and-aft direction X. The solution treating units SC and heat-treating units H are opposed to the transport mechanisms TC, respectively.

This modified embodiment also produces the same effects as Embodiments 1 and 2 described hereinbefore. In this modified embodiment, since one block BCH can carry out both the solution treatment and heat treatment of the wafers W, the treating section 17 can be reduced in size. The burdens of transporting the wafers W (e.g. transport distance and transporting time) can also be lightened.

(5) In Embodiments 1 and 2 described hereinbefore, the treating solutions used in the solution treating units SC may be changed as appropriate. For example, treating liquids may be a cleaning liquid and chemical solutions. In Embodiments 1 and 2 described hereinbefore, the series of treatments performed for the wafers W may be changed as appropriate.

(6) In Embodiments 1 and 2 described hereinbefore, the indexer section 11 is an element of the substrate treating apparatus 1. The invention is not limited to this. The indexer section 11 may be an external part of equipment of the substrate treating apparatus 1. The exposing machine EXP is an external part of equipment provided outside the substrate treating apparatus 1. The invention is not limited to this. The exposing machine EXP may be an element of the substrate treating apparatus 1.

In Embodiment 2 described hereinbefore, the interface block BF is an element of the substrate treating apparatus 1. The invention is not limited to this. That is, the interface block BF may be an external part of equipment of the substrate treating apparatus 1.

(7) Embodiments 1 and 2 described hereinbefore exemplify the case of only the front face 17f of the treating section 17 connected to the indexer section 11 (see FIGS. 2A and 23A), and the case of only the rear face 17b of the treating section 17 connected to the indexer section 11 (see FIGS. 2B and 23B). The invention is not limited to this. For example the front face 17f of the treating section 17 may be connected to a first indexer section, with the rear face 17b of the treating section 17 connected to a second indexer section. Thus, the treating section 17 may be connected to two indexer sections 11.

(8) In Embodiment 1 described hereinbefore, the front face 17f of the treating section 17 is connectable to the indexer section 11 and exposing machine EXP. The invention is not limited to this. For example, the front face 17f of the treating section 17 may be connectable to the indexer section 11, exposing machine EXP and interface section. Similarly, the rear face 17b of the treating section 17 has been described as connectable to the indexer section 11 and exposing machine EXP. The invention is not limited to this. For example, the rear face 17b of the treating section 17 may be connectable to the indexer section 11, exposing machine EXP and interface section. This modified embodiment can further improve the degree of freedom for arranging the treating section 17.

In Embodiment 2 described hereinbefore, the front face 17f of the treating section 17 is connectable to the indexer section 11 and interface block BF. The invention is not limited to this. For example, the front face 17f of the treating section 17 may be connectable to the indexer section 11, interface block BF and exposing machine EXP. Similarly, the rear face 17b of the treating section 17 has been described as connectable to the indexer section 11 and interface block BF. The invention is not limited to this. For example, the rear face 17b of the treating section 17 may be connectable to the indexer section 11, interface block BF and exposing machine EXP. This modified embodiment can further improve the degree of freedom for arranging the treating section 17.

(9) In Embodiments 1 and 2 described hereinbefore, the treating units, receivers P and transport mechanisms T are arranged in right-left symmetry in plan view and in front view. This invention is not limited to this. The treating units, receivers P and transport mechanisms T may be arranged in right-left symmetry in only one of plan view and front view.

(10) In Embodiments 1 and 2 described hereinbefore, the treating units, receivers P and transport mechanisms T are arranged in fore-aft symmetry in plan view and in side view. This invention is not limited to this. The treating units, receivers P and transport mechanisms T may be arranged in fore-aft symmetry in only one of plan view and side view.

(11) Further variations may be mad by appropriately combining the constructions of the foregoing embodiments and each modified embodiment described above.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising a treating section for treating substrates, wherein:
   the treating section has a front face and a rear face both connectable interchangeably to an indexer section configured to receive carriers storing the substrates and feed the substrates stored in the carriers to the treating section;
   the front face and the rear face of the treating section are also both connectable interchangeably to at least one of an interface section and an exposing machine, the interface section being configured to transport the substrates between the treating section and the exposing machine, and the exposing machine being configured to expose the substrates;
   when the front face of the treating section is connected to the indexer section, the rear face of the treating section is connected to one of the interface section and the exposing machine; and
   when the rear face of the treating section is connected to the indexer section, the front face of the treating section is connected to one of the interface section and the exposing machine;
   wherein the treating section has openings configured to receive the substrates; the openings including:
   front openings opening forward in the front face of the treating section; and
   rear openings opening backward in the rear face of the treating section; and wherein:
   positions in front view of the front openings relative to the front face are the same as positions in rear view of the rear openings relative to the rear face.

2. The substrate treating apparatus according to claim 1, wherein the treating section is arranged to perform the same treatment for the substrates when the front face is connected to the indexer section and when the rear face is connected to the indexer section.

3. The substrate treating apparatus according to claim 1, wherein:
the treating section includes:
treating units configured to treat the substrates; and
transport mechanisms configured to transport the substrates to the treating units and the openings; and
a relative positional relationship of the front face, the treating units, the openings and the transport mechanisms of the treating section is the same as a relative positional relationship of the rear face, the treating units, the openings and the transport mechanisms of the treating section.

4. The substrate treating apparatus according to claim 3, wherein the treating units, the openings and the transport mechanisms are arranged in point symmetry in plan view.

5. The substrate treating apparatus according to claim 3, wherein the treating units, the openings and the transport mechanisms in a front part of the treating section are arranged symmetrically to the treating units, the openings and the transport mechanisms in a rear part of the treating section.

6. The substrate treating apparatus according to claim 3, wherein the treating units, the openings and the transport mechanisms in a right part of the treating section are arranged symmetrically to the treating units, the openings and the transport mechanisms in a left part of the treating section.

7. The substrate treating apparatus according to claim 1, wherein:
the treating section includes a plurality of blocks installed in a row in a fore-and-aft direction linking the front face and the rear face of the treating section; and
a block disposed in an i-th (i being an integer 1 or more) place from front of the treating section has the same function as a block disposed in an i-th place from rear of the treating section.

8. The substrate treating apparatus according to claim 1, wherein:
the treating section includes:
at least one heat-treating block configured to heat-treat the substrates;
at least one solution treating block configured to solution treat the substrates; and
at least one relay block configured to relay the substrates between the heat-treating block and the solution treating block;
the at least one heat-treating block, the at least one solution treating block, and the at least one relay block are installed in a row in a fore-and-aft direction linking the front face and the rear face of the treating section; and
an array of the heat-treating block, the solution treating block and the relay block from the front face toward the rear face of the treating section is the same as an array of the heat-treating block, the solution treating block and the relay block from the rear face toward the front face of the treating section.

9. The substrate treating apparatus according to claim 8, wherein a heat-treating block, a relay block, the solution treating block, a relay block and a heat-treating block are arranged in the stated order from the front face toward the rear face of the treating section.

10. The substrate treating apparatus according to claim 1, wherein:
when the front face of the treating section is connected to the indexer section, the treating section receives the substrates from the indexer section through the front openings;
when the front face of the treating section is connected to one of the interface section and the exposing machine, the treating section receives the substrates from the one of the interface section and the exposing machine through the front openings;
when the rear face of the treating section is connected to the indexer section, the treating section receives the substrates from the indexer section through the rear openings; and
when the rear face of the treating section is connected to one of the interface section and the exposing machine, the treating section receives the substrates from the one of the interface section and the exposing machine through the rear openings.

11. The substrate treating apparatus according to claim 10, wherein:
the front openings have a height position which is the same as a height position of the rear openings; and
the front openings and the rear openings are arranged in point symmetry with respect to a center of the treating section in plan view.

12. The substrate treating apparatus according to claim 11, wherein:
the treating section includes:
front receivers disposed inside the front face of the treating section configured to receive the substrates; and
rear receivers disposed inside the rear face of the treating section configured to receive the substrates;
the front receivers being visible through the front openings in front view; and
the rear receivers being visible through the rear openings in rear view.

13. The substrate treating apparatus according to claim 3, wherein:
the treating units include:
solution treating units configured to solution treat the substrates; and
heat-treating units configured to heat-treat the substrates; and
a relative positional relationship of the front face, the solution treating units and the heat-treating units is the same as a relative positional relationship of the rear face, the solution treating units and the heat-treating units.

14. The substrate treating apparatus according to claim 13, wherein a series of treatments of the substrates performed by the solution treating units and the heat-treating units when the front face of the treating section is connected to the indexer section is the same as a series of treatments of the substrates performed by the solution treating units and the heat-treating units when the rear face of the treating section is connected to the indexer section.

15. The substrate treating apparatus according to claim 14, wherein distances the substrates are transported by the transport mechanisms when the front face of the treating section is connected to the indexer section are the same as distances the substrates are transported by the transport mechanisms when the rear face of the treating section is connected to the indexer section.

16. The substrate treating apparatus according to claim 7, wherein each of the blocks has one of functions to perform:
heat treatment of the substrates;
solution treatment of the substrates;
the heat treatment and the solution treatment of the substrates; and
relaying of the substrates.

17. The substrate treating apparatus according to claim 16, wherein:
each of the blocks is shaped rectangular in plan view and in side view;
the block having the function to perform the heat treatment includes:
transport mechanisms configured to transport the substrates; and
heat-treating units configured to heat-treat the substrates;
the block having the function to perform the solution treatment includes:
transport mechanisms configured to transport the substrates; and
solution treating units configured to solution treat the substrates;
the block having the function to perform the heat treatment and the solution treatment includes:
transport mechanisms configured to transport the substrates;
heat-treating units configured to heat-treat the substrates; and
solution treating units configured to solution treat the substrates; and
the block having the function to perform the relaying of the substrates includes:
transport mechanisms configured to transport the substrates; and
receivers configured to receive the substrates.

18. The substrate treating apparatus according to claim 8, wherein:
the heat-treating block is shaped rectangular in plan view and in side view;
the solution treating block is shaped rectangular in plan view and in side view;
the relay block is shaped rectangular in plan view and in side view;
the heat-treating block includes:
transport mechanisms arranged in the heat-treating block and configured to transport the substrates; and
heat-treating units arranged in the heat-treating block and configured to heat-treat the substrates;
the solution treating block includes:
transport mechanisms arranged in the solution treating block and configured to transport the substrates; and
solution treating units arranged in the solution treating block and configured to solution treat the substrates; and
the relay block includes:
transport mechanisms arranged in the relay block and configured to transport the substrates; and
receivers arranged in the relay block and configured to receive the substrates.

\* \* \* \* \*